(12) United States Patent
Lee

(10) Patent No.: US 8,471,263 B2
(45) Date of Patent: Jun. 25, 2013

(54) INFORMATION STORAGE SYSTEM WHICH INCLUDES A BONDED SEMICONDUCTOR STRUCTURE

(76) Inventor: Sang-Yun Lee, Beaverton, OR (US)

(*) Notice: Subject to any disclaimer, the term of this patent is extended or adjusted under 35 U.S.C. 154(b) by 740 days.

(21) Appl. No.: 12/581,722

(22) Filed: Oct. 19, 2009

(65) Prior Publication Data

US 2010/0038743 A1 Feb. 18, 2010

Related U.S. Application Data

(60) Continuation-in-part of application No. 12/165,445, filed on Jun. 30, 2008, now Pat. No. 7,671,371, and a continuation-in-part of application No. 12/165,475, filed on Jun. 30, 2008, now Pat. No. 7,846,814, which is a division of application No. 11/092,499, filed on Mar. 29, 2005, now Pat. No. 7,470,598, which is a continuation-in-part of application No. 10/873,969, filed on Jun. 21, 2004, now Pat. No. 7,052,941, said application No. 12/581,722 is a continuation-in-part of application No. 11/092,500, filed on Mar. 29, 2005, now Pat. No. 8,018,058, and a continuation-in-part of application No. 11/092,501, filed on Mar. 29, 2005, and a continuation-in-part of application No. 11/092,521, filed on Mar. 29, 2005, now Pat. No. 7,633,162, and a continuation-in-part of application No. 11/180,286, filed on Jul. 12, 2005, now abandoned, and a continuation-in-part of application No. 11/378,059, filed on Mar. 17, 2006, now abandoned, and a continuation-in-part of application No. 11/606,523, filed on Nov. 30, 2006, now Pat. No. 7,888,764, and a continuation-in-part of application No. 11/873,719, filed on Oct. 17, 2007, and a continuation-in-part of application No. 11/873,769, filed on Oct. 17, 2007, and a continuation-in-part of application No. 11/873,851, filed on Oct. 17, 2007, now Pat. No. 7,718,508, and a continuation-in-part of application No. 11/092,521, filed on Mar. 29, 2005, now Pat. No. 7,633,162.

(30) Foreign Application Priority Data

Jun. 24, 2003 (KR) .................. 10-2003-0040920
Jul. 12, 2003 (KR) .................. 10-2003-0047515

(51) Int. Cl.
*H01L 29/06* (2006.01)

(52) U.S. Cl.
USPC ....... 257/74; 257/296; 257/618; 257/E27.026

(58) Field of Classification Search
USPC .............. 257/3, 74, 296, 499, 618, E27.026, 257/E27.07
See application file for complete search history.

(56) References Cited

U.S. PATENT DOCUMENTS

| 4,704,785 A | 11/1987 | Curran |
| 4,829,018 A | 5/1989 | Wahlstrom |
| 4,939,568 A | 7/1990 | Kato et al. |
| 5,087,585 A | 2/1992 | Hayashi |

(Continued)

*Primary Examiner* — Tuan N. Quach
(74) *Attorney, Agent, or Firm* — Greg L. Martinez

(57) ABSTRACT

An information storage system includes a bonded semiconductor structure having a memory circuit region carried by an interconnect region. The memory circuit region includes a memory control device region having a vertically oriented memory control device. The memory circuit region includes a memory device region in communication with the memory control device region. The memory device region includes a memory device whose operation is controlled by the vertically oriented memory control device.

18 Claims, 29 Drawing Sheets

U.S. PATENT DOCUMENTS

| | | | |
|---|---|---|---|
| 5,093,704 A | 3/1992 | Saito et al. |
| 5,106,775 A | 4/1992 | Kaga et al. |
| 5,152,857 A | 10/1992 | Ito et al. |
| 5,266,511 A | 11/1993 | Takao |
| 5,308,782 A | 5/1994 | Mazure et al. |
| 5,355,022 A | 10/1994 | Sugahara et al. |
| 5,554,870 A | 9/1996 | Fitch et al. |
| 5,627,106 A | 5/1997 | Hsu |
| 5,695,557 A | 12/1997 | Yamagata et al. |
| 5,835,396 A | 11/1998 | Zhang |
| 5,892,225 A | 4/1999 | Okihara |
| 5,915,167 A | 6/1999 | Leedy |
| 5,959,922 A | 9/1999 | Jung |
| 5,977,579 A | 11/1999 | Noble |
| 5,980,633 A | 11/1999 | Yamagata et al. |
| 5,998,808 A | 12/1999 | Matsushita |
| 6,061,266 A | 5/2000 | Tan |
| 6,088,257 A | 7/2000 | Jeon et al. |
| 6,137,711 A | 10/2000 | Tan |
| 6,153,495 A | 11/2000 | Kub et al. |
| 6,178,107 B1 | 1/2001 | Kang |
| 6,200,821 B1 | 3/2001 | Baek |
| 6,201,727 B1 * | 3/2001 | Jeon ............... 365/145 |
| 6,214,648 B1 | 4/2001 | Shin |
| 6,222,251 B1 | 4/2001 | Holloway |
| 6,229,161 B1 | 5/2001 | Nemati et al. |
| 6,331,468 B1 | 12/2001 | Aronowitz et al. |
| 6,395,630 B2 | 5/2002 | Ahn et al. |
| 6,404,647 B1 | 6/2002 | Minne |
| 6,407,446 B2 | 6/2002 | Kang et al. |
| 6,531,697 B1 | 3/2003 | Nakamura et al. |
| 6,531,723 B1 * | 3/2003 | Engel et al. ............. 257/200 |
| 6,534,382 B1 | 3/2003 | Sakaguchi et al. |
| 6,545,906 B1 | 4/2003 | Savtchenko et al. |
| 6,600,173 B2 | 7/2003 | Tiwari |
| 6,605,527 B2 * | 8/2003 | Dennison et al. ............. 438/618 |
| 6,630,713 B2 | 10/2003 | Geusic |
| 6,633,498 B1 | 10/2003 | Engel et al. |
| 6,677,204 B2 | 1/2004 | Cleeves et al. |
| 6,714,446 B1 | 3/2004 | Engel |
| 6,717,251 B2 | 4/2004 | Matsuo et al. |
| 6,720,597 B2 | 4/2004 | Janesky et al. |
| 6,822,233 B2 | 11/2004 | Nakamura et al. |
| 6,838,754 B2 | 1/2005 | Kim |
| 6,885,582 B2 | 4/2005 | Sharma |
| 6,943,067 B2 | 9/2005 | Greenlaw |
| 6,943,407 B2 | 9/2005 | Ouyang et al. |
| 6,980,466 B2 | 12/2005 | Perner et al. |
| 6,995,430 B2 | 2/2006 | Langdo et al. |
| 7,002,152 B2 | 2/2006 | Grunewald |
| 7,009,278 B2 | 3/2006 | Hsu |
| 7,009,872 B2 | 3/2006 | Alva |
| 7,039,759 B2 | 5/2006 | Cheung et al. |
| 7,052,941 B2 | 5/2006 | Lee |
| 7,061,005 B2 | 6/2006 | Chang |
| 7,078,739 B1 | 7/2006 | Nemati et al. |
| 7,161,875 B2 | 1/2007 | Sharma |
| 7,262,502 B2 | 8/2007 | Chang |
| 7,283,387 B2 | 10/2007 | Cho et al. |
| 7,317,256 B2 | 1/2008 | Williams et al. |
| 7,326,655 B2 | 2/2008 | Joe |
| 7,371,429 B2 | 5/2008 | Lee et al. |
| 7,440,308 B2 | 10/2008 | Jeong et al. |
| 7,459,715 B2 | 12/2008 | Toda et al. |
| 7,459,716 B2 | 12/2008 | Toda et al. |
| 7,474,556 B2 | 1/2009 | Choi et al. |
| 2002/0024140 A1 | 2/2002 | Nakajima et al. |
| 2002/0025604 A1 | 2/2002 | Tiwari |
| 2002/0141233 A1 | 10/2002 | Hosotani et al. |
| 2003/0067043 A1 | 4/2003 | Zhang |
| 2003/0113963 A1 | 6/2003 | Wurzer |
| 2003/0139011 A1 | 7/2003 | Cleeves et al. |
| 2004/0113207 A1 | 6/2004 | Hsu et al. |
| 2004/0155301 A1 | 8/2004 | Zhang |
| 2004/0160849 A1 | 8/2004 | Rinerson et al. |
| 2005/0158950 A1 * | 7/2005 | Scheuerlein et al. ......... 438/257 |
| 2007/0037412 A1 | 2/2007 | Dip et al. |
| 2008/0304308 A1 | 12/2008 | Stipe |

* cited by examiner

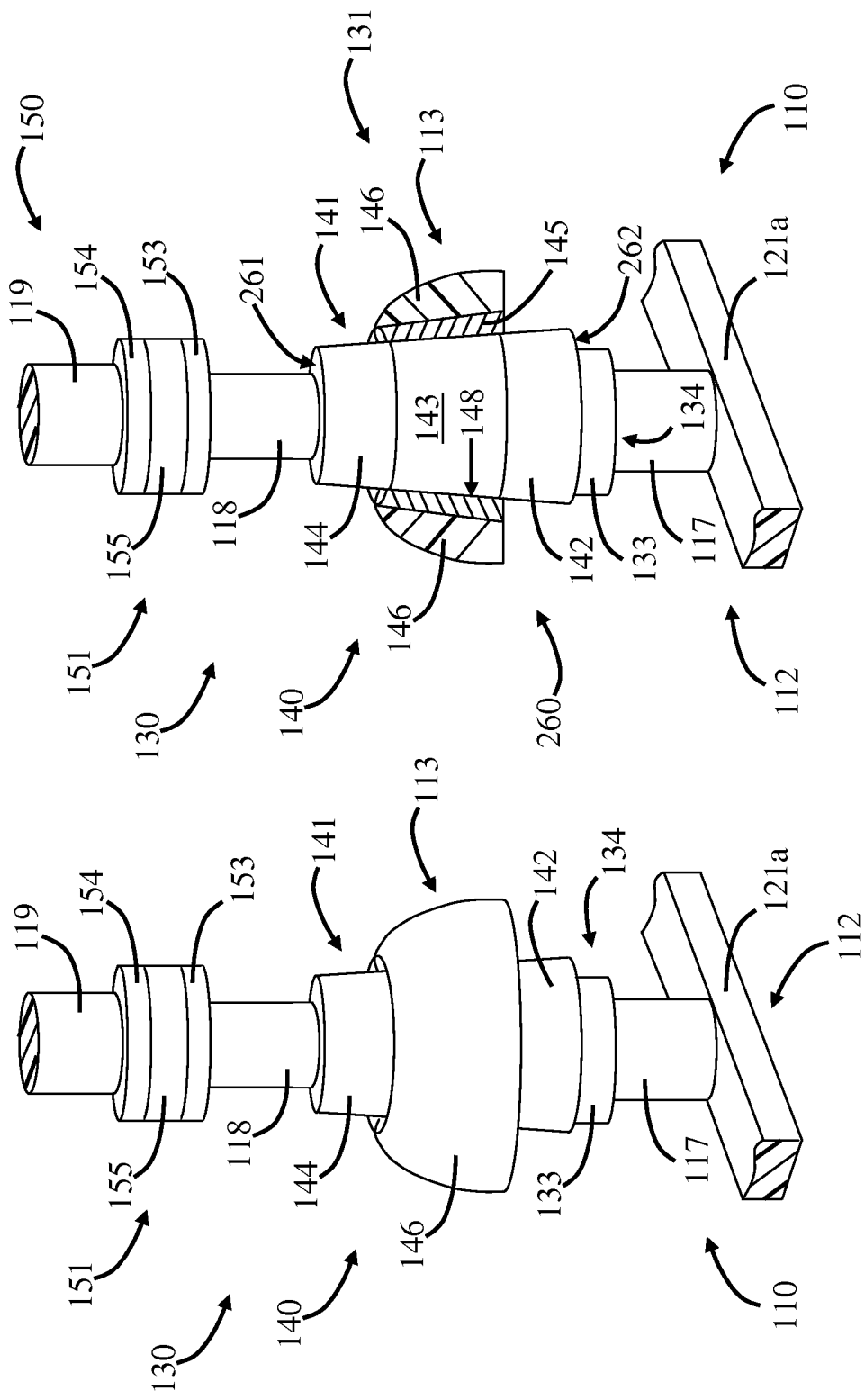

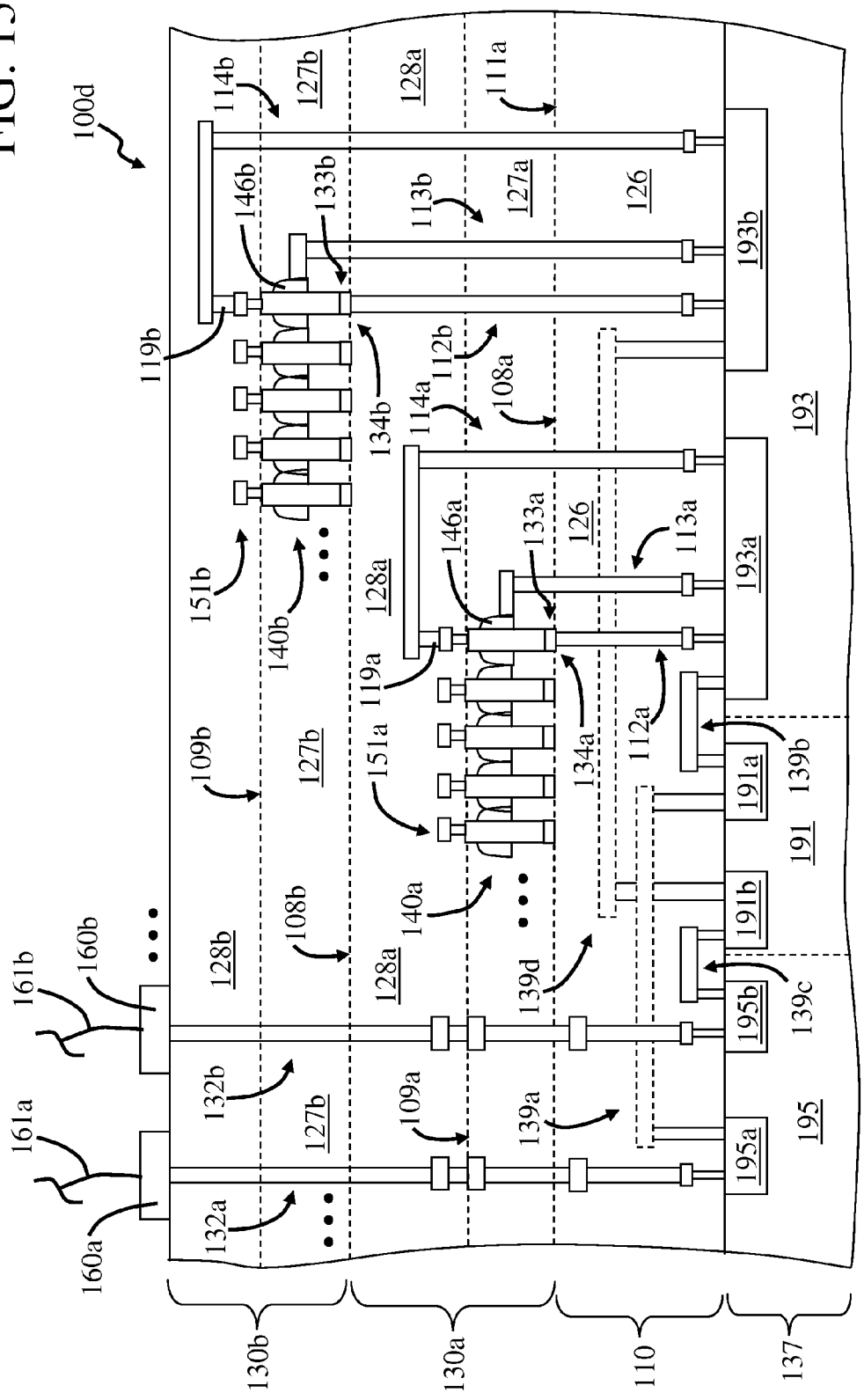

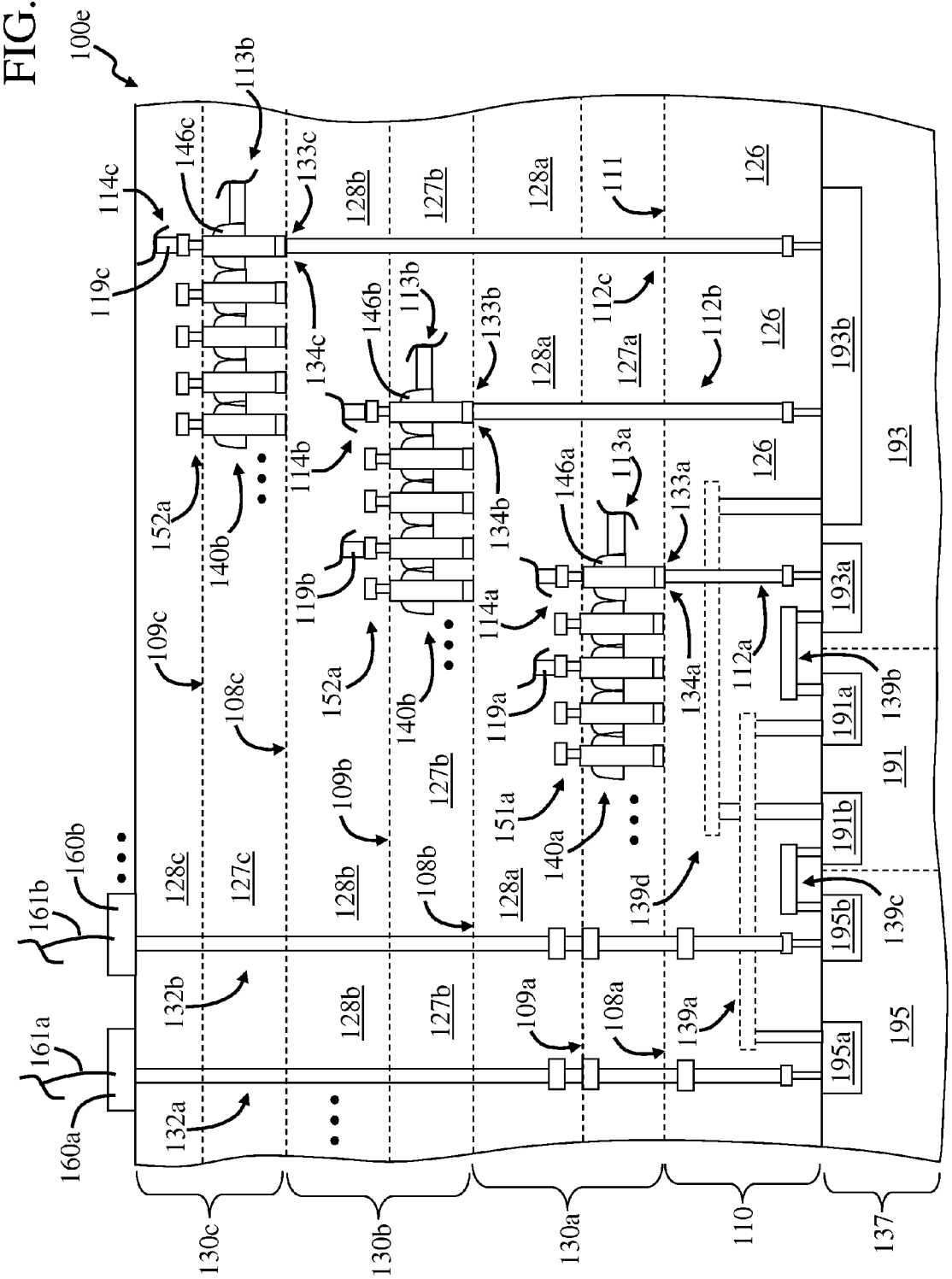

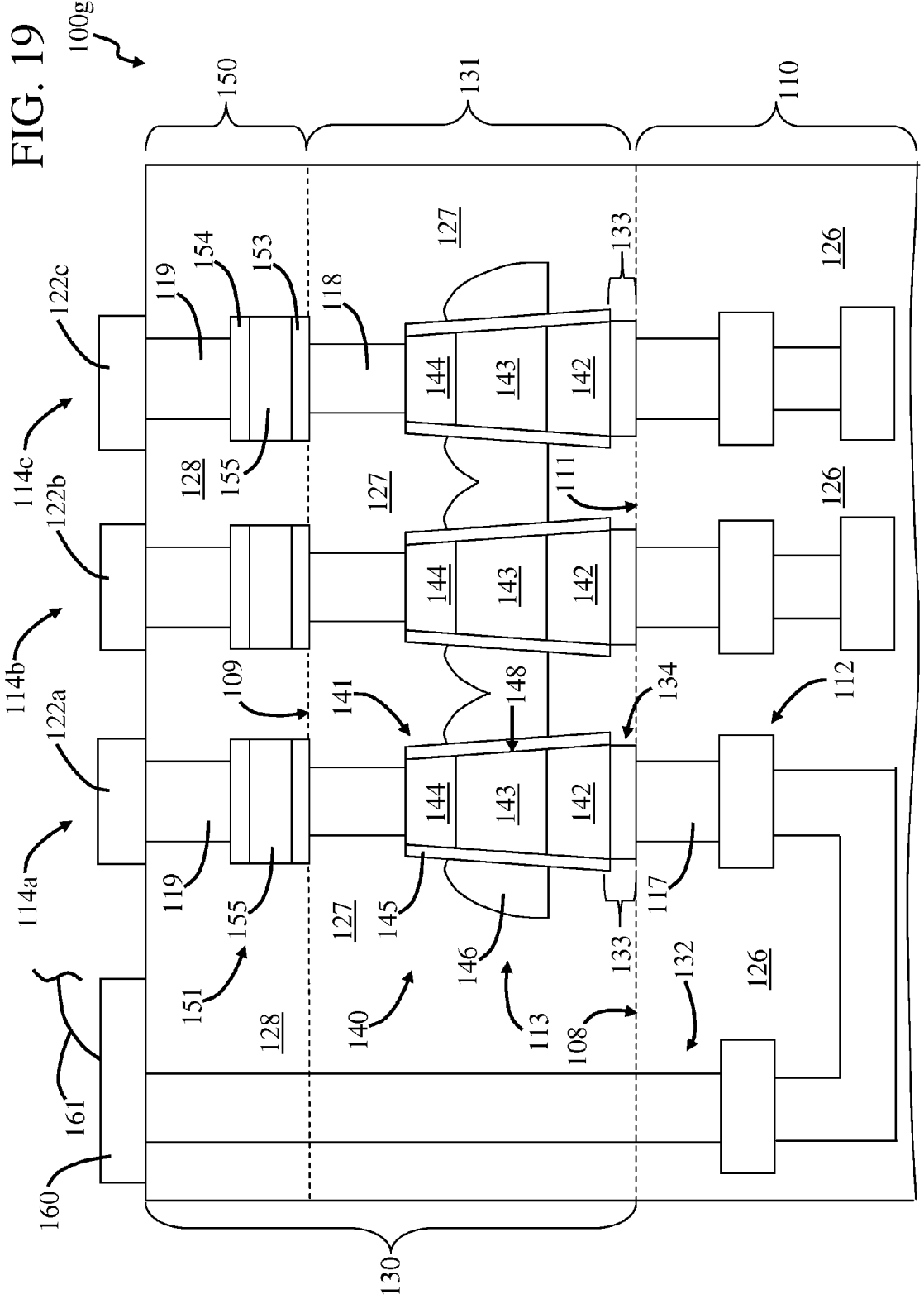

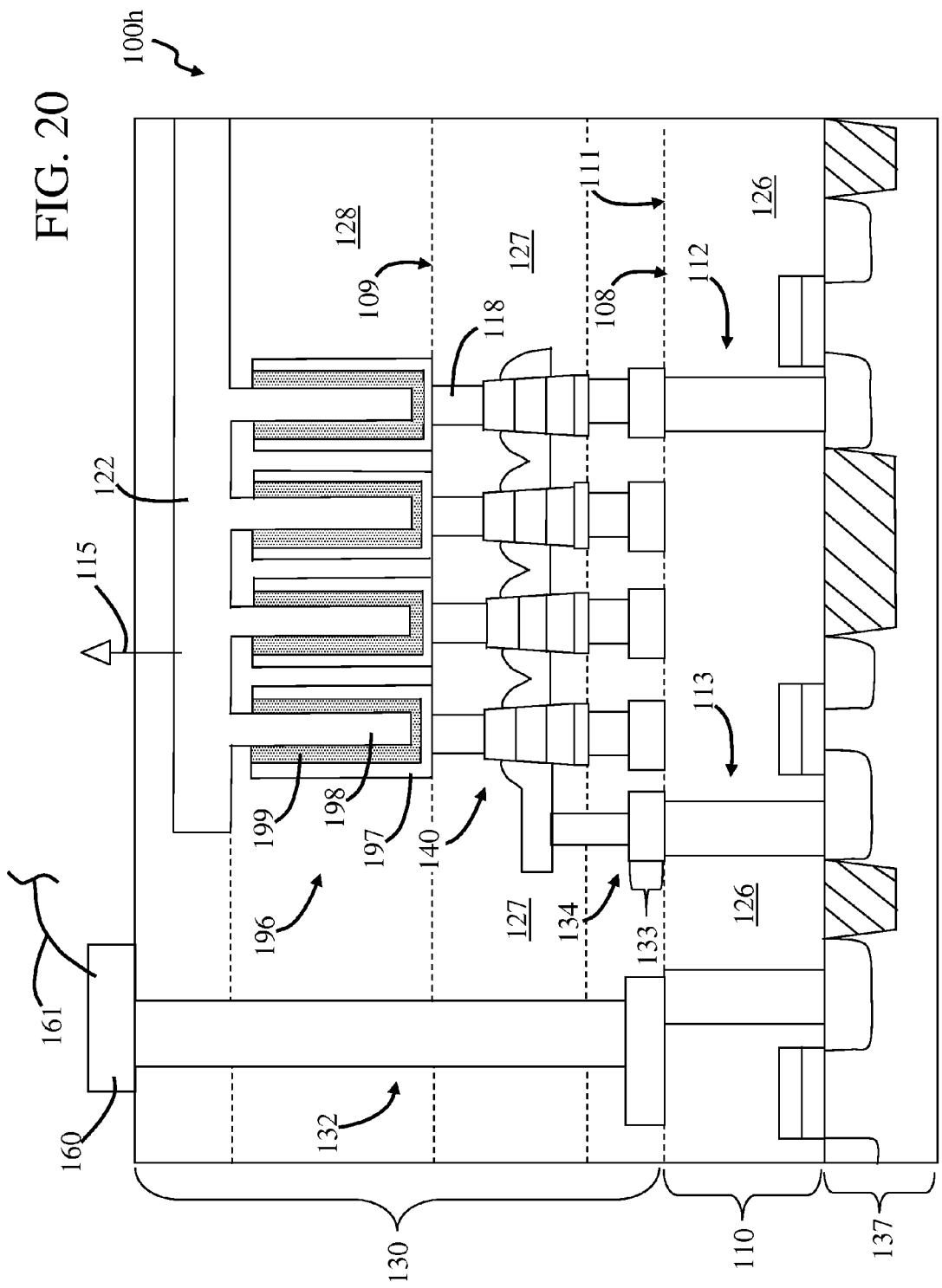

INFORMATION STORAGE SYSTEM WHICH INCLUDES A BONDED SEMICONDUCTOR STRUCTURE

CROSS-REFERENCE TO RELATED APPLICATIONS

This application is a continuation-in-part of, and claims the benefit of, U.S. patent application Ser. Nos.

12/165,445 filed Jun. 30, 2008, now U.S. Pat. No. 7,671,371; and

12/165,475 filed Jun. 30, 2008, now U.S. Pat. No. 7,846,814;

which in turn are divisionals of, and claim the benefit of, U.S. patent application Ser. No. 11/092,499 (now U.S. Pat. No. 7,470,598), filed on Mar. 29, 2005, which is a continuation-in-part of, and claims the benefit of, claims the benefit of U.S. patent application Ser. No. 10/873,969 (now U.S. Pat. No. 7,052,941), filed on Jun. 21, 2004.

This application is a continuation-in-part of, and claims the benefit of, U.S. patent application Ser. Nos.

11/092,500, filed on Mar. 29, 2005, now U.S. Pat. No. 8,018,058,

11/092,501, filed on Mar. 29, 2005;

11/092,521, filed on Mar. 29, 2005, now U.S. Pat. No. 7,633,162;

11/180,286, filed on Jul. 12, 2005 now abandoned;

11/378,059, filed on Mar. 17, 2006 abandoned; and

11/606,523, filed on Nov. 30, 2006 now U.S. Pat. No. 7,888,764;

which in turn are continuation-in-parts of, and claim the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of all of which are incorporated herein by reference in their entirety.

This application is also a continuation-in-part of, and claims the benefit of, U.S. patent application Ser. Nos.

11/873,719, filed on Oct. 17, 2007; and

11/873,851, filed on Oct. 17, 2007 now U.S. Pat. No. 7,718,508;

which in turn are divisionals of, and claim the benefit of, U.S. patent application Ser. No. 11/092,521, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

This application is also a continuation-in-part of, and claims the benefit of, U.S. patent application Ser. No. 11/873,769, filed on Oct. 17, 2007, which in turn is a divisional of, and claims the benefit of, U.S. patent application Ser. No. 11/092,500, now U.S. Pat. No. 8,018,058, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

BACKGROUND OF THE INVENTION

1. Field of the Invention

The present invention relates to bonded semiconductors structures.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include conductive lines, resistors, capacitors, and inductors. However, these laterally oriented devices consume significant amounts of chip area. Sometimes laterally oriented devices are referred to as planar or horizontal devices. Examples of laterally oriented devices can be found in U.S. Pat. Nos. 6,600,173 to Tiwari, 6,222,251 to Holloway and 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is perpendicular to the current flow through a horizontally oriented semiconductor device. Examples of vertically oriented semiconductor device can be found in U.S. Pat. Nos. 5,106,775 to Kaga, 6,229,161 to Nemati, 7,078,739 to Nemati. It should be noted that U.S. Pat. Nos. 5,554,870 to Fitch, 6,229,161 to Nemati and 7,078,739 to Nemati disclose the formation of both horizontal and vertical semiconductor devices on a single major surface of a substrate.

It is desirable to provide computer chips that can operate faster so that they can process more information in a given amount of time. The speed of operation of a computer chip is typically determined by the number of instructions performed in a given amount of time. There are several ways in which a computer chip can process more information in a given amount of time. For example, they can be made faster by decreasing the time it takes to perform certain tasks, such as storing information to and retrieving information from the memory chip. The time needed to store information to and retrieve information from the memory chip can be decreased by embedding the memory devices included therein with the computer chip. This can be done by positioning the memory devices on the same surface as the other devices carried by the substrate.

However, there are several problems with doing this. One problem is that the masks used to fabricate the memory devices are generally not compatible with the masks used to fabricate the other devices of the computer chip. Hence, it is more complex and expensive to fabricate a computer chip with memory embedded in this way. Another problem is that memory devices tend to be large and occupy a significant amount of area, so that there is less area for the other devices. Further, the yield of the computer chips fabricated in a run decreases as their area increases, which increases the overall cost.

Instead of embedding the memory devices on the same surface as the other devices, the memory chip can be bonded to the computer chip to form a stack of chips, as in a 3-D package or a 3-D integrated circuit (IC). Conventional 3-D packages and 3-D ICs both include a substrate with a memory circuit bonded to it by a bonding region positioned therebetween. The memory chip typically includes lateral memory devices which are prefabricated before the bonding takes place. In both the 3-D package and 3-D ICs, the memory and computer chips include large bonding pads coupled to their respective circuits. However, in the 3-D package, the bonding pads are connected together using wire bonds so that the memory and computer chips can communicate with each other. In the 3-D IC, the bonding pads are connected together using high pitch conductive interconnects which extend therebetween. These high pitch conductive interconnects are typically formed using through silicon via (TSV) technology. Information regarding 3-D ICs and TSV technology is disclosed in U.S. Pat. Nos. 5,087,585, 5,308,782, 5,355,022, 5,915,167, 5,998,808, 6,395,630, 6,717,251, 6,943,067, 7,009,278 and 7,317,256.

There are several problems, however, with using 3-D packages and 3-D ICs. One problem is that the use of wire bonds increases the access time between the computer and memory chips because the high impedance of the wire bonds and large contact pads. The contact pads are large in 3-D packages to make it easier to attach the wire bonds thereto. Similarly, the contact pads in 3-D ICs have correspondingly large capacitances which also increase the access time between the processor and memory circuits. The contact pads are large in 3-D ICs to make the alignment between the computer and memory chips easier. The computer and memory chips need to be properly aligned with each other and the interconnects because, as mentioned above, the memory devices carried by the memory chip and the electronic devices carried by the computer chip are prefabricated before the bonding takes place.

Another problem with using 3-D packages and 3-D ICs is cost. The use of wire bonds is expensive because it is difficult to attach them between the computer and memory chips and requires expensive equipment. Further, it requires expensive equipment to align the various devices in the 3-D IC. The bonding and alignment is made even more difficult and expensive because of the trend to scale devices to smaller dimensions. It is also very difficult to fabricate high pitch conductive interconnects.

BRIEF SUMMARY OF THE INVENTION

The present invention is directed to bonded semiconductor structures. The novel features of the invention are set forth with particularity in the appended claims. The invention will be best understood from the following description when read in conjunction with the accompanying drawings.

BRIEF DESCRIPTION OF THE DRAWINGS

FIG. 1b is a perspective view of a substrate and grown semiconductor layer of the semiconductor structure of FIG. 1a.

FIGS. 5b and 5c are perspective views of an interconnect region and memory circuit region included with the bonded semiconductor structure of FIG. 5a.

FIG. 14a is a side view of a bonded semiconductor structure, which includes the memory circuit region of FIG. 5a.

FIGS. 14b and 14c are block diagrams of the bonded semiconductor structure of FIG. 14a.

FIG. 15a is a side view of a bonded semiconductor structure, which includes the memory circuit region of FIG. 5a.

FIG. 15b is a block diagram of the bonded semiconductor structure of FIG. 15a.

FIG. 16a is a side view of a bonded semiconductor structure, which includes the memory circuit regions of FIG. 5a and FIG. 6 stacked on each other.

FIG. 16b is a block diagram of the bonded semiconductor structure of FIG. 16a.

FIG. 17c is a top view of a bonded semiconductor structure memory chip included with the information storage system of FIG. 17a.

FIG. 18c is a top view of a bonded semiconductor structure memory chip included with the information storage system of FIG. 18a.

FIG. 19 is a side view of another embodiment of a bonded semiconductor structure included with the bonded semiconductor structure memory chip of FIG. 18c.

FIG. 20 is a side view of another embodiment of a bonded semiconductor structure which can be included with the bonded semiconductor structure memory chip of FIG. 18c.

DETAILED DESCRIPTION OF THE INVENTION

Figure 1A:
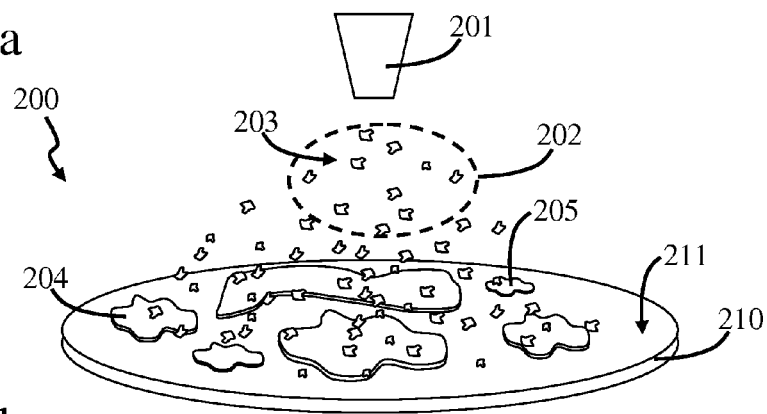
FIG. 1a is a perspective view of a partially fabricated semiconductor structure, which is fabricated using growth.

FIG. 1a is a perspective view of a partially fabricated grown semiconductor structure 200. Grown semiconductor structure 200 includes a substrate 210. Substrate 210 can be of many different types, such as a semiconductor substrate. A gaseous semiconductor material 203 is provided from a growth material source 201 in a region 202 proximate to a substrate surface 211 of substrate 210. It should be noted that, in general, more than one material sources are used to provide growth material and process gases. However, one material source is shown in FIG. 1a for simplicity and ease of discussion.

Figure 1B:
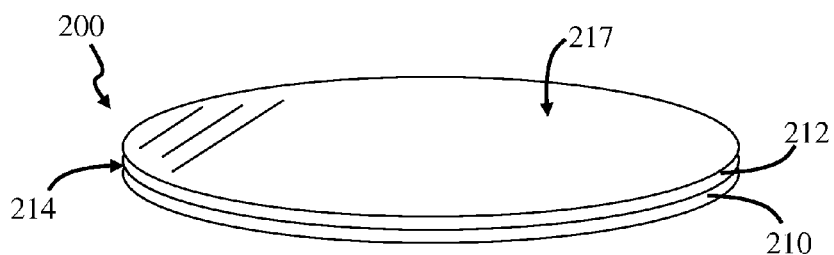
Figure 1C:
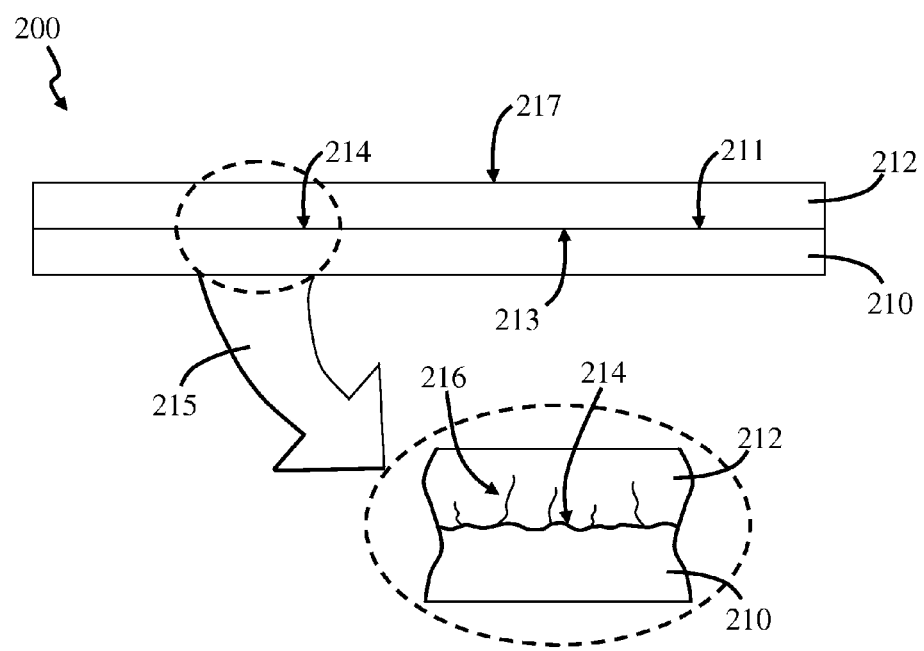
FIG. 1c is a side view of the semiconductor structure of FIG. 1b.

Portions of gaseous semiconductor material 203 engage surface 211 to form agglomerated semiconductor material 204 and 205. Portions of gaseous semiconductor material 203 engage surface 211 to form a grown semiconductor layer 212 on surface 211 of substrate 210, as shown in FIG. 1b, and a growth interface 214, as shown in FIG. 1c. FIG. 1b is a perspective view of substrate 210 and grown semiconductor layer 212, and FIG. 1c is a side view of grown semiconductor structure 200, as shown in FIG. 1b. Grown semiconductor layer 212 can be formed on substrate 210 in many different ways, such as by chemical vapor deposition, molecular beam epitaxy and sputtering, among others. It should be noted that, if desired, another semiconductor layer can be grown on a surface 217 of semiconductor layer 212 so that a stack of semiconductor regions is formed. Surface 217 is opposed to substrate 210. More information regarding forming a stack of semiconductor regions is provided below with FIGS. 3a, 3b and 3c and FIGS. 4a, 4b and 4c.

As shown in FIG. 1c, a surface 213 of grown semiconductor layer 212 faces surface 211 of substrate 210. In particular, surface 213 is formed in response to the agglomeration of growth material on surface 211 so that a growth interface 214 is formed in response. In particular, growth interface 214 is formed in response to gaseous semiconductor material 203 agglomerating on surface 211. In this example, growth interface 214 is formed in response to agglomerated semiconductor material 204 and 205 forming on surface 211, as shown in FIG. 1a. In this way, a grown semiconductor structure is fabricated using growth.

As indicated by an indication arrow 215, a growth defect 216 is formed in response to forming growth interface 214. Growth defect 216 can be of many different types, such as a dislocation. It should be noted that, in general, a number of growth defects 216 are formed in response to forming growth interface 214. The quality of growth interface 216 increases and decreases in response to decreasing and increasing, respectively, the number of growth defects 216.

Figure 2A:
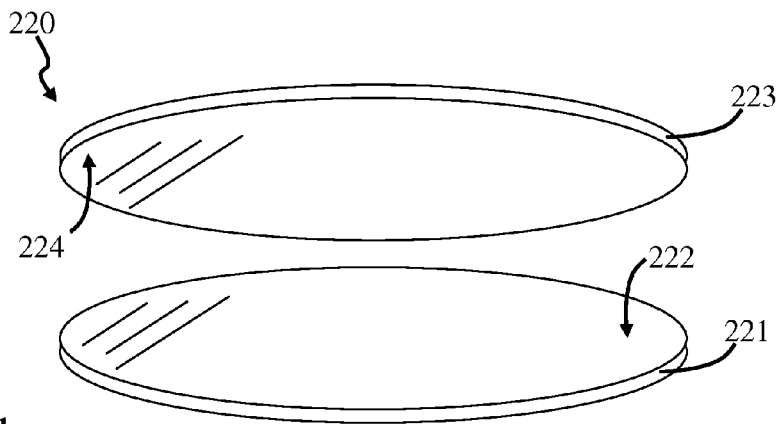
FIG. 2a is a perspective view of a partially fabricated semiconductor structure, which is fabricated using bonding.

FIG. 2a is a perspective view of a partially fabricated bonded semiconductor structure 220. Bonded semiconductor structure 220 includes substrates 221 and 223. Substrates 221 and 223 can be of many different types, such as semiconductor substrates. Substrates 221 and 223 can include many different layer structures. For example, in some embodiments, substrates 221 and 223 each include conductive bonding layers adjacent to surfaces 222 and 224 of substrates 221 and 223, respectively.

Figure 2B:
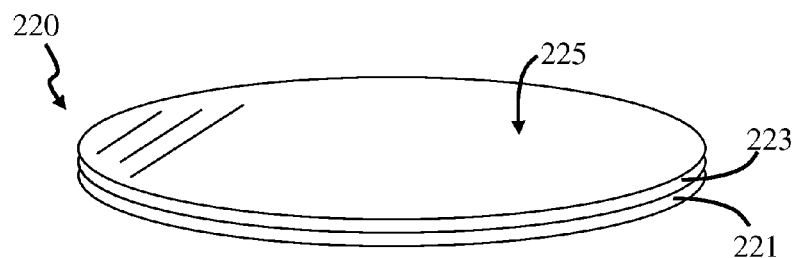
FIG. 2b is a perspective view of substrates of the semiconductor structure of FIG. 2a bonded to each other.
Figure 2C:
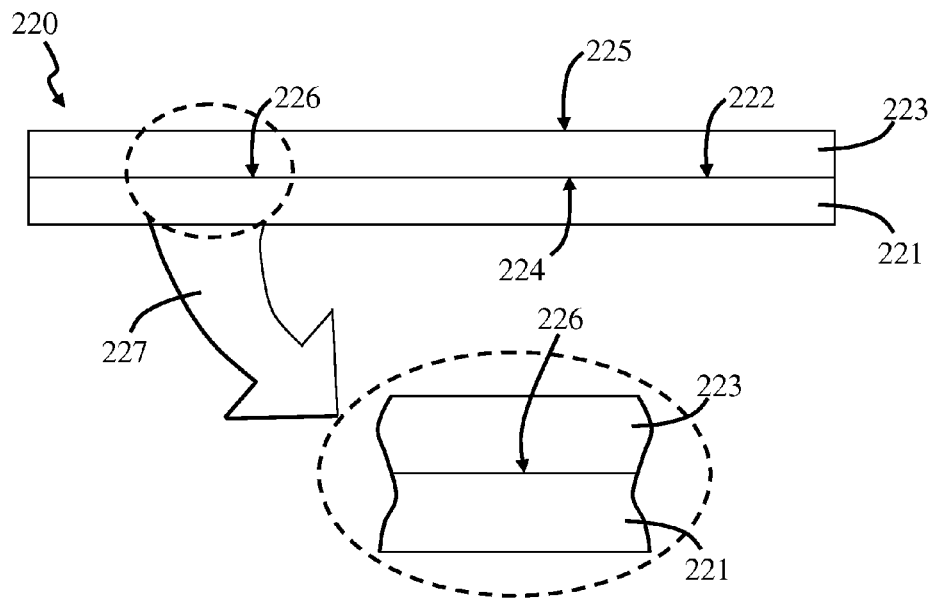
FIG. 2c is a side view of the substrates of the bonded semiconductor structure of FIG. 2b bonded to each other, as shown in FIG. 2b.

As shown in FIG. 2b, substrates 221 and 223 are moved towards each other so that a bonding interface 226 is formed in response, as shown in FIGS. 2b and 2c. In particular, surfaces 222 and 224 of substrates 221 and 223, respectively, are moved towards each other so that a bonding interface 226 is formed in response to surfaces 222 and 224 being engaged. FIG. 2b is a perspective view of substrates 221 and 223 bonded to each other, and FIG. 2c is a side view of substrates 221 and 223 bonded to each other, as shown in FIG. 2b.

In FIG. 2c, surface 222 of substrate 221 faces surface 224 of substrate 223. In particular, surface 221 engages surface 224 so that bonding interface 226 is formed in response. It should be noted that bonding interface 226 is not formed in response to gaseous semiconductor material engaging surface 222. In particular, bonding interface 226 is not formed in response to the agglomerated semiconductor material on surface 222. In this way, a bonded semiconductor structure is fabricated using bonding. As indicated by an indication arrow 227, a growth defect is not formed in response to forming bonding interface 226. It should be noted that a signal experiences less attenuation in response to flowing through a bonding interface, and experiences more attenuation in response to flowing through a growth interface. For example, a current decreases less in response to flowing through a bonding interface, and decreases more attenuation in response to flowing through a growth interface. Further, the noise of a signal increases more in response to flowing through a growth interface, and increases less in response to flowing through a bonding interface.

It should also be noted that portions of the semiconductor structures discussed below are fabricated using growth, and other portions are fabricated using bonding. It should also be noted that, if desired, substrate 223 can include a stack of semiconductor regions. The stack of semiconductor regions of substrate 223 can be formed in many different ways, several of which will be discussed in more detail with FIGS. 3a, 3b and 3c and FIGS. 4a, 4b and 4c.

More information regarding bonding and growth interfaces can be found in related U.S. patent application Ser. No. 11/606,523, which is referenced above. Information regarding bonding and growth interfaces can also be found in U.S. Pat. Nos. 5,152,857, 5,695,557, 5,980,633 and 6,534,382.

A bonding interface is an interface that is formed in response to bonding material layers together. In one example of forming a bonding interface, first and second material layers are formed as separate layers, and moved towards each other so they engage each other and the bonding interface is formed in response. In this way, a bonding interface is established. It should be noted that heat is generally applied to the first and/or second material layers to facilitate the formation of the bonding interface. In a metal-to-metal bonding interface, the first and second material layers that are bonded together are conductive materials, such as metals. In a metal-to-dielectric bonding interface, one of the first and second material layers is a conductive material, and the other one is a dielectric material. In a metal-to-semiconductor bonding interface, one of the first and second material layers is a conductive material, and the other one is a semiconductor material.

A growth interface is an interface that is formed in response to growing a material layer on another material layer. In one example of forming a growth interface, a third material layer is formed, and a fourth material layer is grown on the third material layer so that the growth interface is formed in response. In this way, a growth interface is established. Hence, when forming a growth interface, third and fourth material layers are not formed as separate layers, and moved to engage each other.

In a metal-to-metal growth interface, the third and fourth material layers are conductive materials, such as metals. In a metal-to-dielectric growth interface, one of the third and fourth material layers is a conductive material, and the other one is a dielectric material. In a metal-to-semiconductor growth interface, one of the third and fourth material layers is a conductive material, and the other one is a semiconductor material. In a dielectric-to-dielectric growth interface the third and fourth materials are dielectric materials.

It should be noted that, in general, it is difficult to establish a metal-to-semiconductor growth interface, wherein the semiconductor material is grown on the metal layer. Further, it is difficult to grow a crystalline semiconductor material layer on a metal layer using semiconductor growth techniques, such as chemical vapor deposition. In most instances, the metal layer is formed on the semiconductor material. It is difficult to grow semiconductor material on a metal layer because metal layers do not operate as a very good seed layer for the semiconductor material. Hence, a significant amount of the semiconductor material will not agglomerate on the metal layer.

It is difficult to grow crystalline semiconductor material on the metal layer because metal layers tend to not be crystalline, and semiconductor material tends to have the crystal structure of the material it is formed on. Hence, if a semiconductor material is formed on a metal layer that includes non-crystalline conductive material, then the semiconductor material will also have a non-crystalline crystal structure and poor material quality. Thus, it is useful to bond crystalline semiconductor material to a metal layer to form a metal-to-semiconductor bonding interface.

In general, bonding and growth interfaces have different types and amounts of defects. For example, dislocations often extend from a growth interface in the direction of material growth. The difference between bonding and growth interfaces can be determined in many different ways, such as by using Transmission Electron Microscopy (TEM) to determine the type and amount of defects proximate to the interface. Information regarding TEM can be found in U.S. Pat. Nos. 5,892,225, 6,531,697, 6,822,233 and 7,002,152.

Figure 3A:
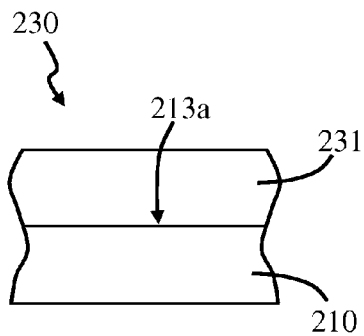
FIGS. 3a, 3b and 3c are side view of steps of fabricating a stack of semiconductor regions using growth.
Figure 3B:
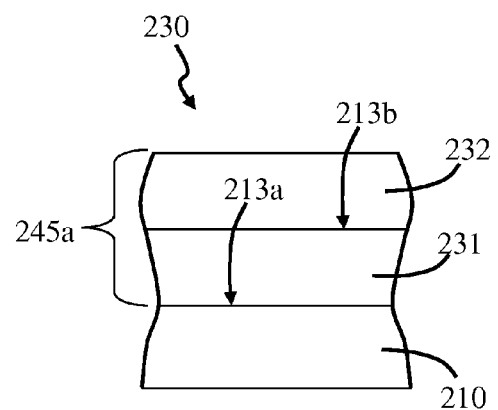
Figure 3C:
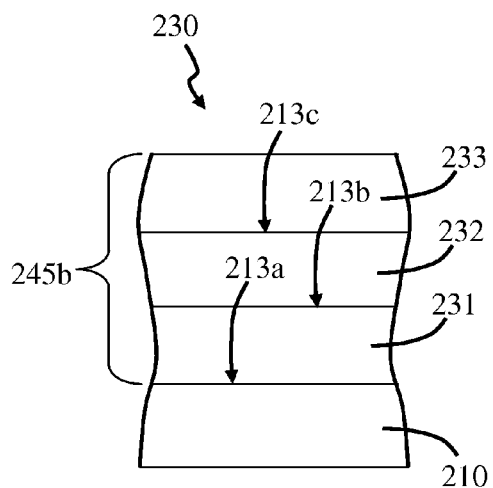

FIGS. 3a, 3b and 3c are side view of steps of fabricating a stack of semiconductor regions using growth. It should be noted that, in this example, the stack of semiconductor regions generally includes two or more semiconductor layers. In this example, a semiconductor layer 231 is grown on substrate 210 so that a growth interface 213a is formed therebetween, as shown in FIG. 3a. A semiconductor layer 232 is grown on semiconductor layer 231 so that a growth interface 213b is formed therebetween, as shown in FIG. 3b. In FIG. 3b, a stack 245a includes semiconductor layers 231 and 232, and growth interfaces 213a and 213b. A semiconductor layer 233 is grown on semiconductor layer 232 so that a growth interface 213c is formed therebetween, as shown in FIG. 3c. In FIG. 3c, a stack 245b includes semiconductor layers 231, 232 and 233, and growth interfaces 213a, 213b and 213c. In this way, a stack of semiconductor regions is fabricated using growth. It should be noted that semiconductor layers 231, 232 and 233 can have many different doping types, several of which are discussed in more detail below.

Figure 4A:
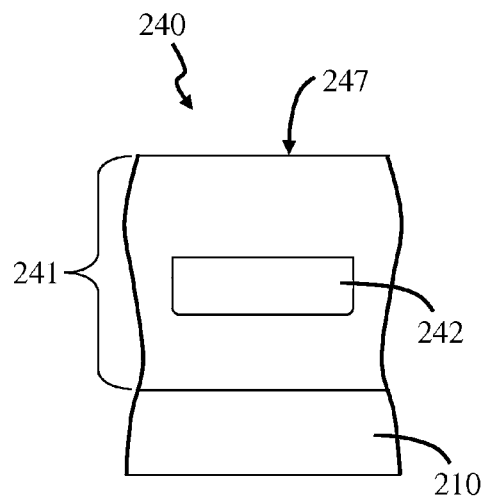
FIGS. 4a, 4b and 4c are side view of steps of fabricating a stack of semiconductor regions using ion implantation.
Figure 4B:
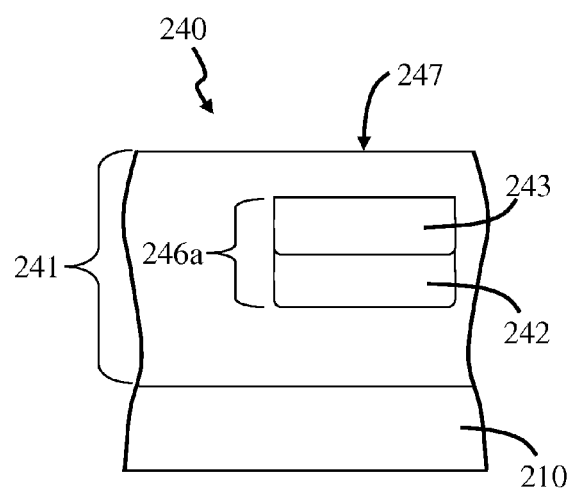
Figure 4C:
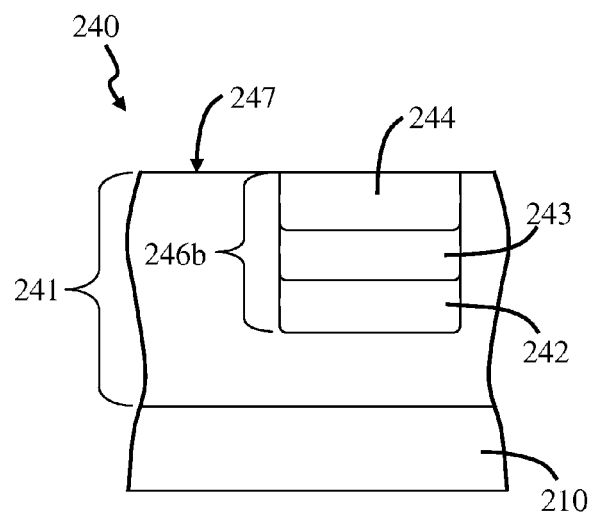

FIGS. 4a, 4b and 4c are side view of steps of fabricating a stack of semiconductor regions using ion implantation. It should be noted that, in this example, the stack of semiconductor regions generally includes two or more semiconductor regions formed by ion implantation, wherein the semiconductor regions are formed in a semiconductor layer 241.

In this example, a semiconductor layer 241 is grown on substrate 210, wherein semiconductor layer 241 has a surface 247 positioned away from substrate 210. Implanted regions 242 and 243 are formed in semiconductor layer 241, as shown in FIGS. 4a and 4b. Implanted region 242 is formed in response to introducing a first dopant into semiconductor layer 241 through surface 247. Further, implanted region 243 is formed in response to introducing a second dopant into semiconductor layer 241 through surface 247. In this example, implanted region 242 is positioned between substrate 210 and implanted region 243. Further, implanted region 243 is positioned between surface 247 and implanted region 242. In FIG. 4b, a stack 246a includes semiconductor regions 242 and 243.

An implanted region 244 is formed in semiconductor layer 241, as shown in FIG. 4c. Implanted region 244 is formed in response to introducing a third dopant into semiconductor layer 241 through surface 247. In this example, implanted region 244 is positioned between substrate 210 and implanted regions 242 and 243. Further, implanted region 244 is positioned between surface 247 and implanted regions 242 and 243. In FIG. 4c, a stack 246b includes semiconductor regions 242, 243 and 244. In this way, a stack of semiconductor regions is fabricated using ion implantation. It should be noted that semiconductor regions 242, 243 and 244 can have many different doping types, several of which are discussed in more detail below. It should also be noted that a stack of semiconductor regions can be fabricated using one or more of the growth and implantation steps discussed above. For example, a semiconductor layer with a first conductivity type can be grown and implanted with an implant species to form a semiconductor region with a second conductivity type, wherein the semiconductor layer includes the semiconductor region with the second conductivity type.

Figure 5A:
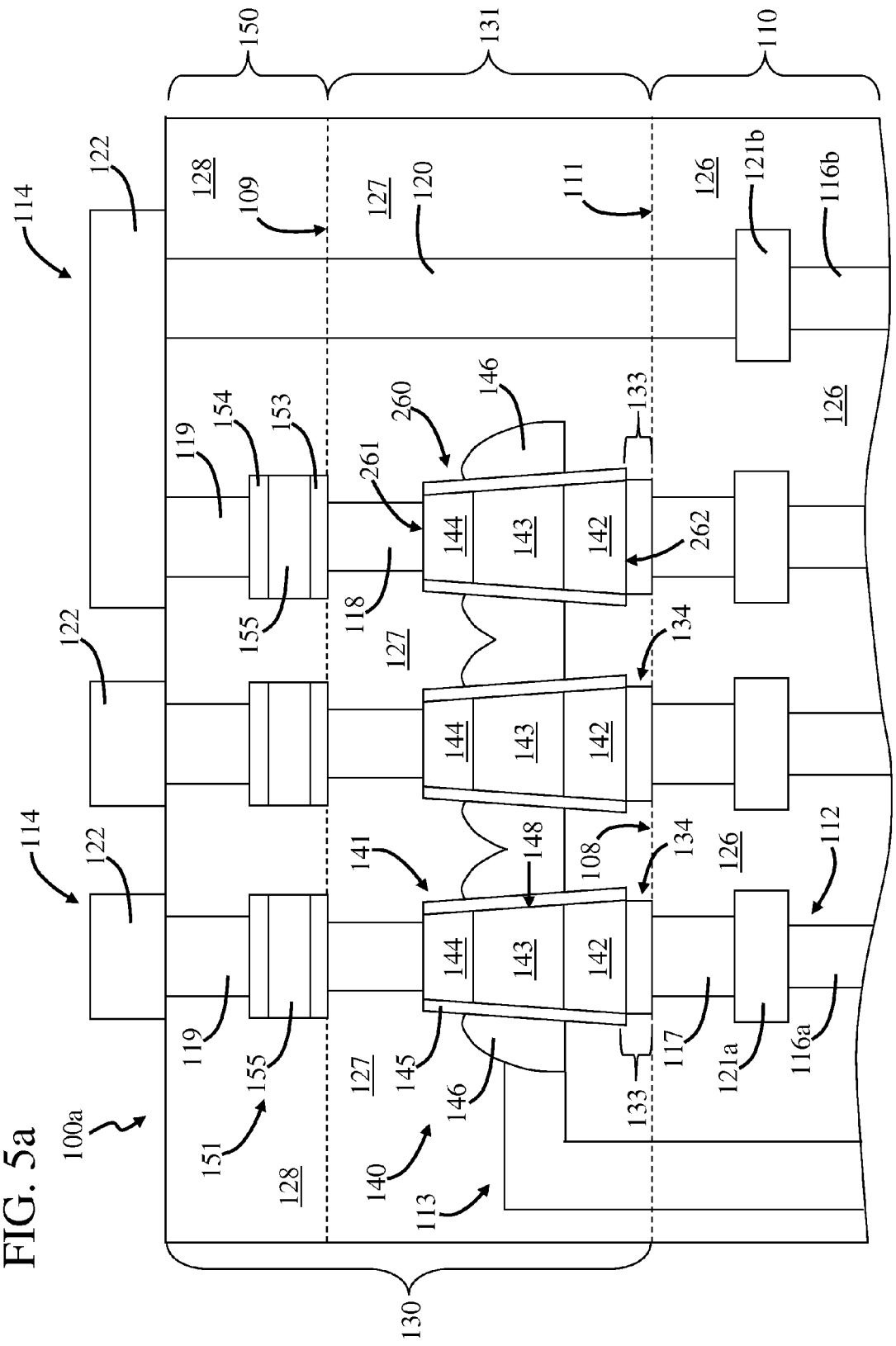
FIG. 5a is a partial side view of a bonded semiconductor structure which includes a ferroelectric memory device.

FIG. 5a is a partial side view of a bonded semiconductor structure 100a. In this embodiment, bonded semiconductor structure 100a includes a memory circuit region 130 coupled to an interconnect region 110 by bonding. In particular, bonded semiconductor structure 100a includes a memory circuit region 130 coupled to an interconnect region 110 through a bonding interface. FIGS. 5b and 5c are perspective views of interconnect region 110 and memory circuit region 130.

In this embodiment, interconnect region 110 includes a bit line 112 extending through a dielectric material region 126. Bit line 112 includes vias 116a and 117 connected together through an interconnect 121a. It should be noted that, in general, a via extends in a direction perpendicular to a surface 111 of interconnect region 110, and an interconnect extends in a direction parallel to surface 111. Hence, in this embodiment, the via and interconnect extend perpendicular to each other. Further, it should be noted that a conductive line, such as bit line 112, includes a via and/or interconnect. In some embodiments, the conductive line includes a via and one or more interconnects. In some embodiments, the conductive line includes an interconnect and one or more vias. In some embodiments, the conductive line includes one or more vias and one or more interconnects.

Figure 14A:
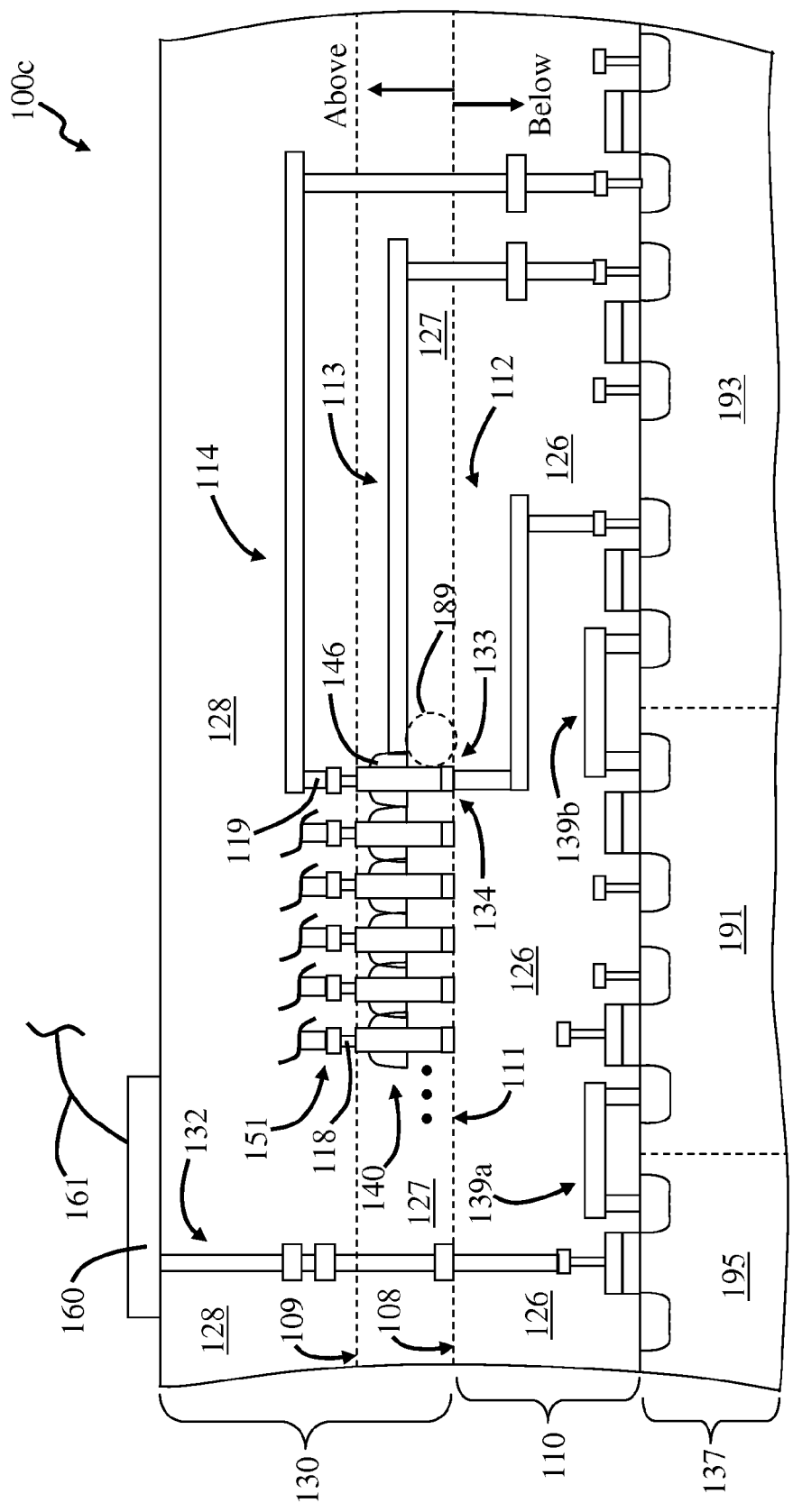

It should also be noted that interconnect region 110 is typically connected to a circuit, such as those shown in FIGS. 14a, 15a and 16a. However, the circuit connected to interconnect region 110 is not shown in FIG. 5a for simplicity and ease of discussion. The circuit can be of many different types, but it generally includes electronic devices carried by a substrate. The electronic devices can be of many different types, such as the active and passive electronic devices mentioned in the Background. It should be noted that the electronic devices can include vertically and horizontally oriented semiconductor devices. Vertically and horizontally oriented semiconductor devices are discussed in more detail in the Background, as well as in the above-identified related patents and patent applications.

More information regarding electronic devices, as well as interconnect regions and substrates, can be found in U.S. Pat. Nos. 4,704,785, 4,829,018, 4,939,568, 5,087,585, 5,093,704, 5,106,775, 5,266,511, 5,308,782, 5,355,022, 5,554,870, 5,627,106, 5,835,396, 5,977,579, 5,998,808, 6,153,495, 6,222,251, 6,331,468, 6,600,173, 6,630,713, 6,677,204, 6,943,067, 6,943,407, 6,995,430, 7,078,739, as well as U.S. Patent Application Nos. 20020024140, 20020025604, 20020141233, 20030067043, 20030113963, 20030139011, 20040113207, 20040155301 and 20040160849.

In this embodiment, memory circuit region 130 includes a memory control device region 131 which includes one or more electronic devices. In FIG. 5a, the electronic devices of region 131 are vertically oriented memory control devices 140. It should be noted that three vertically oriented memory control devices are shown in FIG. 5a in region 131 for simplicity and ease of discussion. Vertically oriented memory control device 140 is a vertically oriented semiconductor device, and is not a horizontally oriented semiconductor device. Vertically and horizontally oriented semiconductor devices are discussed in more detail above, as well as in the cited references and above-identified related patents and patent applications. A vertically oriented semiconductor device includes a stack of semiconductor layers with a sidewall extending therebetween, wherein the stack includes a semiconductor junction.

In this embodiment, memory circuit region 130 includes a conductive bonding contact region 133 which bonds an electronic device of memory control device region 131 to interconnect region 110. In particular, conductive bonding contact region 133 bonds vertically oriented memory control devices 140 to interconnect region 110. Conductive bonding contact region 133 is positioned between interconnect region 110 and vertically oriented memory control devices 140. Conductive bonding contact region 133 extends between interconnect region 110 and vertically oriented memory control devices 140. Hence, bonded semiconductor structure 100a is a bonded semiconductor structure because it includes a bonding region which bonds an electronic device. Other semiconductor structures are not bonded semiconductor structures because they do not include a bonding region which bonds an electronic device.

Conductive bonding contact region 133 is a conductive contact region because it allows a signal, such as a memory signal, to flow therethrough, as will be discussed in more detail below. Conductive bonding contact region 133 is a bonding contact region because, as mentioned above, it bonds the electronic device of memory control device region 131 to interconnect region 110. Conductive bonding contact region 133 is a bonding contact region because it establishes a bonding interface 134, as will be discussed in more detail below.

Conductive bonding contact region 133 can have many different layer structures. In general, conductive bonding contact region 133 includes one or more conductive bonding layers which establish bonding interface 134. Conductive bonding contact regions and bonding and growth interfaces will be discussed in more detail below with FIGS. 7a, 7b, 7c, 7d, 7e and 7f. Bonding interface 134 can be established at many different locations, several of which will be discussed in more detail below with FIGS. 7a, 7b, 7c, 7d, 7e and 7f. More information regarding conductive bonding contact regions and bonding and growth interfaces can be found in related U.S. patent application Ser. Nos. 11/092,500, 11/092,501 and 11/092,521, as well as in the other above-identified related patents and patent applications.

In this embodiment, vertically oriented memory control device 140 includes a semiconductor layer stack 141. It should be noted that semiconductor layer stack can be formed in many different ways, such as those discussed in more detail above with FIGS. 3a-3c and 4a-4c. As can be seen in FIGS. 5a and 5c, semiconductor layer stack 141 is in the form of a mesa structure 260 having a sidewall 148 extending along the layer stack. More information regarding vertically oriented semiconductor devices formed from mesa structures can be found in the above-identified related patents and patent applications. In this embodiment, mesa structure 260 includes opposed surfaces 261 and 262, wherein surfaces 261 and 262 are planarized surfaces. In this way, vertically oriented memory control device 140 includes a mesa structure 260 with a planarized surface 262 which faces bonding interface 134.

Surfaces 261 and 262 can be planarized in many different ways, such as by chemical mechanical polishing. More information regarding planarizing surfaces 261 and 262 is provided in the above-identified related patent and patent applications. The planarization of surfaces 261 and 262 is typically determined by determining their surface roughness with a profilometer. The surface roughness of a planarized surface is less than that of an as-grown surface. In this embodiment, surface 262 is positioned towards bonding interface 134 and surface 261 is positioned away from bonding interface 134. Vertically oriented memory control device 140 is carried by conductive bonding contact region 133 so that conductive bonding contact region 133 bonds it to interconnect region 110. In this way, bonded semiconductor structure 100a includes a memory control device which is bonded to an interconnect region. It should be noted that, in some embodiments, only one of surfaces 261 and 262 are planarized. For example, in some embodiments, surface 261 is planarized and surface 262 is not planarized. In other embodiments, surface 262 is planarized and surface 261 is not planarized. It is useful for surface 262 to be planarized because it faces bonding interface 134, and reducing the surface roughness of surface 262 facilitates the formation of bonding interface 134.

Vertically oriented memory control device 140 is carried by conductive bonding contact region 133 so that conductive bonding contact region 133 bonds memory control device 140 to via 117. In this way, bonded semiconductor structure 100a includes a memory control device which is bonded to a via.

It should be noted that, in some embodiments, vertically oriented memory control device 140 is bonded to an interconnect by conductive bonding contact region 133. Vertically oriented memory control device 140 is carried by conductive bonding contact region 133 so that conductive bonding contact region 133 bonds memory control device 140 to bit line 112. In this way, bonded semiconductor structure 100a includes a memory control device which is bonded to a bit line. It should be noted that vertically oriented memory control device 140 and bit line extend away from each other from opposed sides of surface 111 of interconnect region.

Vertically oriented memory control device 140 is carried by conductive bonding contact region 133 so that conductive bonding contact region 133 bonds memory control device 140 to interconnect region 110 through bonding interface 134. In this way, bonded semiconductor structure 100a includes a memory control device which is bonded to an interconnect region through a bonding interface.

Vertically oriented memory control device 140 is carried by bonding region 133 so that bonding region 133 bonds memory control device 140 to via 117 through bonding interface 134. In this way, bonded semiconductor structure 100a includes a memory control device which is bonded to a via through a bonding interface.

It should be noted that, in some embodiments, vertically oriented memory control device 140 is bonded to an interconnect through bonding interface 134 by conductive bonding contact region 133. Vertically oriented memory control device 140 is carried by conductive bonding contact region 133 so that conductive bonding contact region 133 bonds memory control device 140 to bit line 112 through bonding interface 134. In this way, bonded semiconductor structure 100a includes a memory control device which is bonded to a bit line through a bonding interface. It should be noted that vertically oriented memory control device 140 is formed after bonding interface 134 is formed. More information regarding the formation of vertically oriented memory control device 140 and bonding interface 134 can be found in the above-identified related patents and patent applications.

Vertically oriented memory control device 140 can be of many different types, several of which are disclosed in the above-references related patents and patent applications. In this embodiment, memory control device 140 operates as a switch to control the operation of a memory device of memory circuit region 130, as will be discussed in more detail below. The switch can be of many different types, such as a transistor. The transistor can be of many different types, such as a bipolar transistor and a metal-semiconductor field effect transistor (MESFET).

In this embodiment, the transistor is a vertically oriented metal oxide field effect transistor (MOSFET), wherein semiconductor layer stack 141 includes semiconductor layers 142, 143 and 144. Semiconductor layer 142 is positioned adjacent to conductive bonding contact region 133 and semiconductor layer 143 is positioned adjacent to semiconductor layer 142. Further, semiconductor layer 144 is positioned adjacent to semiconductor layer 143 so that semiconductor layer 143 is positioned between semiconductor layers 142 and 144. In this way, semiconductor layers 142, 143 and 144 form a stack of semiconductor layers. It should be noted that sidewall 148 extends between layers 142, 143 and 144. More information regarding processing semiconductor layer stack 141 to form a vertically oriented memory control device, can be found in related U.S. patent application Ser. Nos. 11/092,500 and 11/092,521, as well as in the above-identified related patents and patent applications. It should be noted that semiconductor layers 142, 143 and 144 are positioned between surfaces 261 and 262, wherein surface 262 is a surface of layer 142 and surface 261 is a surface of layer 144. As mentioned above, in this embodiment, surfaces 261 and 262 are planarized surfaces. Hence, semiconductor layers 142 and 144 include planarized surfaces. It should be noted that the current flow through semiconductor layer stack 141 is between surfaces 261 and 262. Hence, in this embodiment, the current flow through semiconductor layer stack 141 is through opposed planar surfaces 261 and 262.

In this embodiment, memory control device region 131 includes a via 118 connected to vertically oriented memory control device 140. In particular, semiconductor layer 144 is connected to via 118. Vertically oriented memory control device 140 and via 118 extend through a dielectric material region 127 of device region 131. Dielectric material regions 126 and 127 form a dielectric-to-dielectric growth interface 108 proximate to surface 111. Dielectric-to-dielectric growth interface 108 is a dielectric-to-dielectric growth interface because it is formed in response to growing one dielectric material region on another dielectric material region. Dielectric-to-dielectric growth interface 108 is not a bonding interface because it is not formed in response to bonding one dielectric material region to another dielectric material region.

It should be noted that each of dielectric material regions 126 and 127 typically include the same type of dielectric material. For example, in one embodiment, dielectric material regions 126 and 127 each include silicon dioxide. However, in some embodiments, dielectric material regions 126 and 127 include different dielectric materials. For example, in one embodiment, dielectric material region 126 includes silicon dioxide, and dielectric material region 127 includes silicon nitride.

In this embodiment, the semiconductor material of semiconductor layers 142, 143 and 144 is crystalline semiconductor material and is not non-crystalline semiconductor material. However, in some embodiments, one or more portions of semiconductor layers 142, 143 and 144 can include non-crystalline semiconductor material. Examples of non-crystalline semiconductor material includes polycrystalline and amorphous semiconductor material. It should be noted that polycrystalline semiconductor material typically includes separate regions of crystalline semiconductor material separated from each other by grain boundaries. However, crystalline semiconductor material does not intentionally include separate regions of crystalline semiconductor material separated from each other by grain boundaries. More information regarding crystalline and non-crystalline semiconductor material can be found in the above-identified related patents and patent applications.

It should be noted that semiconductor material has a conductivity that can be controllably adjusted by the introduction of impurities therein. For example the conductivity of semiconductor material can be n-type (n, n$^+$, n$^-$) and p-type (p, p$^+$, p$^-$). Semiconductor material can also be undoped (u) and intrinsically (i) doped. In general, other types of materials, such as metals and insulators, do not have conductivities that can be accurately adjusted by the introduction of impurities therein. More information regarding the conductivity of semiconductor material can be found in the above-identified related patents and patent applications.

Semiconductor layers 142 and 143 are positioned adjacent to each other so that a semiconductor junction is formed therebetween. Further, semiconductor layers 143 and 144 are positioned adjacent to each other so that a semiconductor junction is formed therebetween. The semiconductor junctions can be of many different types, such as an nn (i.e. nn$^-$, nn$^+$, n$^-$n, n$^+$n, etc.) semiconductor junction or a pp (i.e. pp$^-$, pp$^+$, p$^-$p, p$^+$p, etc.) semiconductor junction. However, in this embodiment, the semiconductor junctions are np semiconductor junctions (i.e. np$^-$, np$^+$, n$^-$p, n$^+$p, etc.) because, as mentioned above, memory control device 140 operates as a transistor. A pn and np junction is often referred to as a diode junction.

It should be noted that semiconductor layer stack 141 includes one or more semiconductor junctions. In some embodiments, the semiconductor junction is formed in response to forming differently doped semiconductor layers adjacent to each other and, in other embodiments, the semiconductor junction is formed in response to forming differently doped regions adjacent to each other in a semiconductor layer. Differently doped semiconductor layers can be formed adjacent to each other by doping them during their growth, and differently doped regions in a semiconductor layer can be formed by doping after the layer has been grown, such as by using ion implantation and diffusion doping. Hence, in some embodiments, a stack of semiconductor layers includes semiconductor layers that are grown separately and, in other embodiments, a stack of semiconductor layers includes semiconductor regions that are formed after a semiconductor layer is formed.

In one particular embodiment, semiconductor layers 142, 143 and 144 are doped n-type, p-type and n-type, respectively, so that an np semiconductor junction is formed between semiconductor layers 142 and 143, and a pn semiconductor junction is formed between semiconductor layers 143 and 144. In another particular embodiment, semiconductor layers 142, 143 and 144 are doped p-type, n-type and p-type, respectively, so that an pn semiconductor junction is formed between semiconductor layers 142 and 143, and a np semiconductor junction is formed between semiconductor layers 143 and 144. More information regarding the doping of the semiconductor layers included in semiconductor layer stack 141 can be found in the above-identified related patents and patent applications.

In this embodiment, vertically oriented memory control device 140 includes a control dielectric 145 positioned proximate to semiconductor layer stack 141, and a control terminal 146 positioned proximate to control dielectric 145. Control dielectric 145 is positioned so that it is operatively coupled to semiconductor layer stack 141 through control dielectric 145. In particular, control dielectric 145 is positioned so that it is capable of adjusting the conductivity of semiconductor layer stack 141 through control dielectric 145. Control dielectric 145 is positioned so that it is capable of adjusting the conductivity of one or more of semiconductor layers 142, 143 and 144 through control dielectric 145. Control dielectric 145 and control terminal 146 are shown partially cut-away in the perspective view of memory circuit region 130 shown in FIG. 5c so that semiconductor layer stack 141 can be seen better.

In this embodiment, control dielectric 145 extends around the mesa structure 260. Control dielectric 145 can extend around the mesa structure 260 in many different ways. In this embodiment, control dielectric 145 extends annularly around the mesa structure 260. In this embodiment, control dielectric 145 extends around the mesa structure 260 adjacent to sidewall 148. Control dielectric 145 is positioned so that it is operatively coupled to mesa structure 260 through control dielectric 145. In particular, control dielectric 145 is positioned so that it is capable of adjusting the conductivity of mesa structure 260 through control dielectric 145.

It should be noted that it is desirable to form control dielectric 145 at a low temperature, such as a temperature below about 900° C. It is desirable to form control dielectric 145 at a low temperature to reduce the likelihood that other portions of bonded semiconductor structure 100a will be damaged. The other portions of bonded semiconductor structure 100a are more likely to be damaged in response to their temperature being driven to a temperature above about 900° C. In some embodiments, a portion of semiconductor layer stack 141 is consumed during the formation of control dielectric 145. In other embodiments, control dielectric 145 is formed using deposition, such as sputtering. More information regarding forming control terminal 145 can be found in U.S. Pat. No. 7,326,655 and U.S. Patent Application No. 20070037412.

It should also be noted that some of the vertically oriented memory control devices of bonded semiconductor structure 100a can have their control terminals connected to the control terminals of adjacent vertically oriented memory control devices. In this way, a control signal can be applied to the control terminals of adjacent vertically oriented memory control devices. It should be noted that, in these embodiments, the control terminal of a vertically oriented memory control device operates as a word line.

Control dielectric 145 is positioned between control terminal 146 and semiconductor layer stack 141. In this way, control terminal 146 is spaced from semiconductor layer stack 141 by control dielectric 145. Control dielectric 145 and control terminal 146 extend annularly around the outer periphery of semiconductor layer stack 141. In particular, control dielectric 145 and control terminal 146 extend around sidewall 148 of semiconductor layer stack 141, as shown in FIGS. 5a and 5c.

It should be noted that sidewall 148 is a tapered sidewall. A tapered sidewall is a sidewall that extends at a non-perpendicular angle relative to surface 111, wherein the non-perpendicular angle is generally between about ten degrees and less than about ninety degrees. A non-tapered sidewall is a sidewall that extends at a perpendicular angle relative to surface 111, wherein the perpendicular angle is about ninety degrees. Information regarding the operation of vertically oriented semiconductor devices can be found in the above-identified related patents and patent applications. The operation of vertically oriented memory control device 140 will be discussed in more detail below.

As can be seen in FIGS. 5a and 5c, control dielectric 145 and control terminal 146 extend annularly around semiconductor layer stack 141. Control dielectric 145 and control terminal 146 extend annularly around semiconductor layer stack 141 so that the flow of the memory signal can be better controlled as it flows between conductive bonding contact 133 and via 118. For example, the gradient of the memory signal can be controlled as it flows between conductive bonding contact region 133 and via 118. The amplitude of memory signal can be adjusted over a wider range of amplitude values. Increasing the amplitude of the memory signal is useful so that the memory device can be erased faster. The memory device is erased faster when it is erased in less time. It should be noted that the memory signal is typically a current signal.

In this embodiment, memory circuit region 130 includes a memory device region 150 in communication with interconnect region 110 through memory control device region 131. In this embodiment, memory device region 150 includes one or more memory devices connected to a corresponding electronic device of memory control device region 131. The memory devices of memory device region 150 are typically connected to corresponding vertically oriented memory control devices 140 through a via, such as via 118. The memory device(s) of memory device region 150 can be of many different types of memory devices, several of which are discussed in more detail below. The memory device(s) of memory device region 150 can operate as volatile memory devices or non-volatile memory devices. Examples of non-volatile memory devices include random access memory devices. Examples of volatile memory devices will be discussed in more detail presently, as well as with FIGS. 8-13.

In this embodiment, memory device region 150 includes a ferroelectric memory device 151 in communication with vertically oriented memory control device 140 through via 118. Ferroelectric memory device 151 and via 119 extend through a dielectric material region 128. Dielectric material regions 127 and 128 form a dielectric-to-dielectric growth interface 109. Vertically oriented memory control device 140 extends between bonding interface 134 and dielectric-to-dielectric growth interfaces 109. Dielectric-to-dielectric growth interface 109 is a dielectric-to-dielectric growth interface because it is formed in response to growing one dielectric material region on another dielectric material region. Dielectric-to-dielectric growth interface 109 is not a bonding interface because it is not formed in response to bonding one dielectric material region to another dielectric material region.

In this embodiment, ferroelectric memory device 151 includes a ferroelectric material layer 155 positioned between memory device contacts 153 and 154, wherein memory device contact 153 is connected to via 118. Further, memory device contact 154 is in communication with via 118 through ferroelectric material layer 155 and memory device contact 153. Ferroelectric memory device 151 operates as a ferroelectric random access memory (FRAM) device. More information regarding FRAM devices can be found in U.S. Pat. Nos. 5,959,922, 6,061,266, 6,088,257, 6,137,711, 6,178,107, 6,200,821 and 6,201,727.

Memory device contacts 153 and 154 can include many different types of materials, such as metals and doped semiconductors. The material included with memory device contacts 153 and 154 is typically conductive. Memory device contacts 153 and 154 can include metal alloys such as TiAlN and TiW. These materials are useful because they are stable up to about 650° C.

It should be noted that memory device contacts 153 and 154 generally include one or more material layers. However, memory device contacts 153 and 154 are shown as including one layer in this embodiment for simplicity. The material of memory device contacts 153 and 154 is typically chosen so that it can be deposited at a temperature less than about 700° C. In some embodiments, memory device contacts 153 and 154 include conductive material that is deposited at a temperature less than about 700° C.

In this embodiment, a via 119 is connected to memory device contact 154, and an interconnect 122 is connected to via 119. Interconnect 122 is connected to interconnect region 110 through a drive line 114. In this embodiment, drive line 114 includes a via 120 which is connected to a via 116b through an interconnect 121b. It should be noted that drive line 114 is sometimes referred to as a sense line and is in communication with a sense amplifier. It should also be noted that, in this embodiment, via 116b and interconnect 121b are included with interconnect region 110. Via 120 extends through dielectric material regions 126, 127 and 128. Further, via 120 extends through dielectric-to-dielectric growth interfaces 108 and 109. More information regarding bit line 112, word line 113 and drive line 114 can be found in the above referenced patents which provide information regarding FRAM devices, as well as in the references cited below which provide information regarding phase change random access memory (PRAM) devices.

In this embodiment, the number of bonding regions 133 included with bonded semiconductor structure 100a corresponds with the number of vertically oriented memory control devices of memory control device region 131. In some embodiments, the number of bonding regions 133 included with bonded semiconductor structure 100a is the same as the number of vertically oriented memory control devices of memory control device region 131.

Further, in this embodiment, the number of bonding regions 133 included with bonded semiconductor structure 100a corresponds with the number of memory devices of memory device region 150. In some embodiments, the number of bonding regions 133 included with bonded semiconductor structure 100a is the same as the number of memory devices of memory device region 150.

In this embodiment, the number of bonding interfaces 134 included with bonded semiconductor structure 100a corresponds with the number of vertically oriented memory control devices of memory control device region 131. In some embodiments, the number of bonding interfaces 134 included with bonded semiconductor structure 100a is the same as the number of vertically oriented memory control devices of memory control device region 131.

Further, in this embodiment, the number of bonding interfaces 134 included with bonded semiconductor structure 100a corresponds with the number of memory devices of memory device region 150. In some embodiments, the number of bonding interfaces 134 included with bonded semiconductor structure 100a is the same as the number of memory devices of memory device region 150.

In operation, control terminal 146 modulates the conductivity of semiconductor layer stack 141 in response to a control signal applied thereto. Control terminal 146 modulates the conductivity of semiconductor layer stack 141 through control dielectric 145. In this particular embodiment, control terminal 146 modulates the conductivity of semiconductor layer 143 in response to the control signal. In this way, control terminal 146 controls the flow of the memory signal between conductive bonding contact region 133 and via 118.

Vertically oriented memory control device 140 allows and restricts the flow of the memory signal to ferroelectric memory device 151 when control terminal 146 is activated and deactivated, respectively. Control terminal 146 is activated and deactivated in response to a control signal provided thereto. The control signal is provided to control terminal 146 through word line 113. When control terminal 146 is activated, the memory signal is allowed to flow to ferroelectric memory device 151 through bit line 112, conductive bonding contact region 133, bonding interface 134 and vertically oriented memory control device 140.

When control terminal 146 is deactivated, the memory signal is restricted from flowing to ferroelectric memory device 151 through bit line 112, conductive bonding contact region 133, bonding interface 134 and vertically oriented memory control device 140. In this way, a control signal provided to a control terminal of a vertically oriented memory control device controls the flow of a memory signal through the vertically oriented memory control device, a bit line, and a conductive bonding contact region and bonding interface.

In some situations, ferroelectric memory device 151 is read in response to the flow of the memory signal through vertically oriented memory control device 140, bit line 112, conductive bonding contact region 133 and bonding interface 134. In some situations, ferroelectric memory device 151 is written to in response to the flow of the memory signal through vertically oriented memory control device 140, bit line 112, conductive bonding contact region 133 and bonding interface 134. In some situations, ferroelectric memory device 151 is erased in response to the flow of the memory signal through vertically oriented memory control device 140, bit line 112, conductive bonding contact region 133 and bonding interface 134. In this way, ferroelectric memory device 151 operates in response to a memory signal flowing through a vertically oriented memory control device, conductive bonding contact region and bonding interface.

Figure 6:
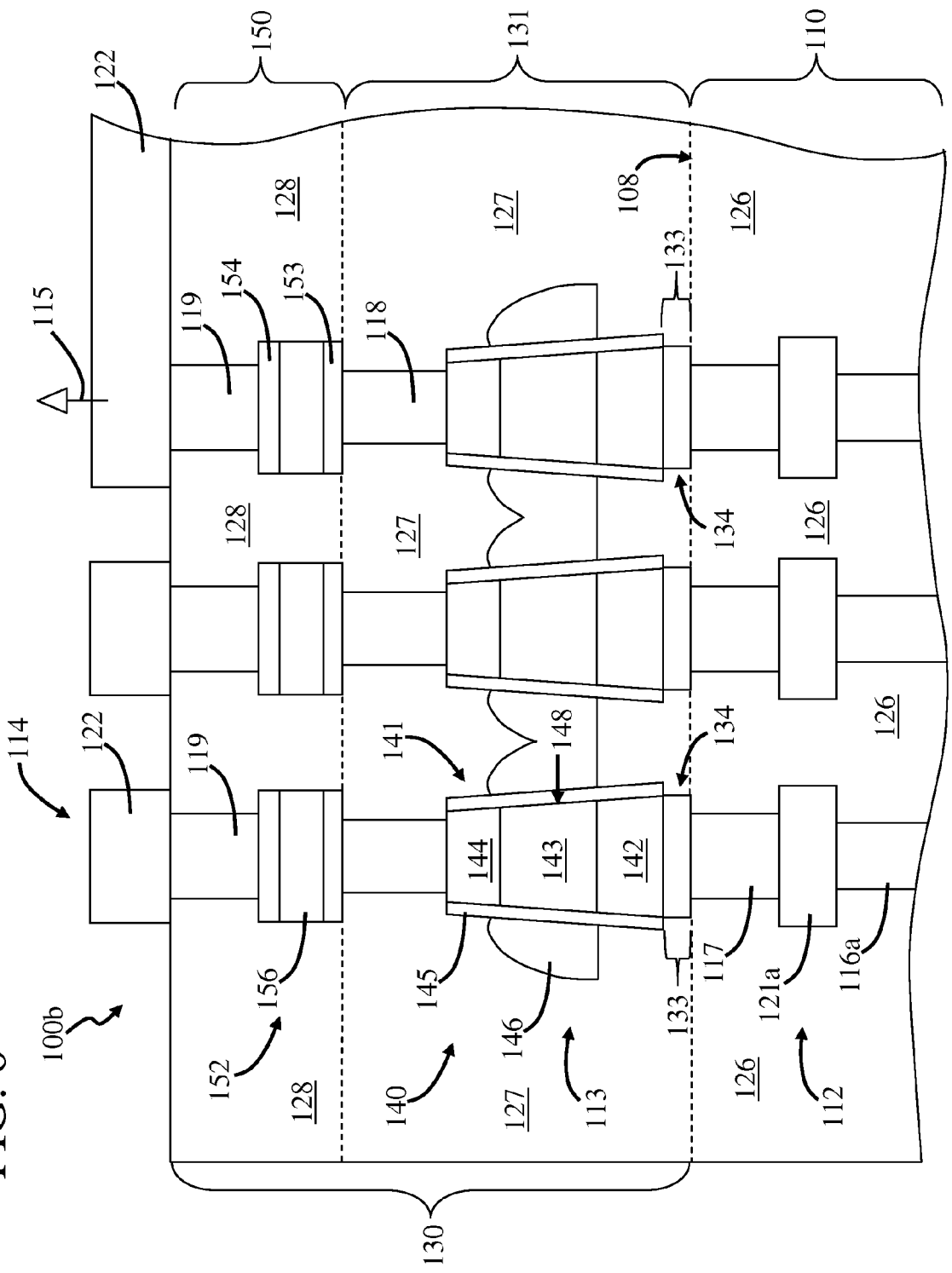
FIG. 6 is a side view of a bonded semiconductor structure which includes a phase change memory device.

FIG. 6 is a partial side view of a bonded semiconductor structure 100b. Bonded semiconductor structure 100b is similar to bonded semiconductor structure 100a discussed in FIG. 5a. However, in this embodiment, drive line 114 is not connected to interconnect region 110. Instead, bonded semiconductor structure 100b includes interconnect 122, which is connected to a current return 115. Current return 115 operates to complete a circuit which includes interconnect region 110 and memory circuit region 130, so that current is capable of flowing therethrough.

Further, memory device region 150 includes a phase change memory device 152 instead of ferroelectric memory device 151. In this embodiment, phase change memory device 152 includes memory device contacts 153 and 154, as described above, with a phase change material layer 156 positioned between them. Phase change memory device 152 operates as a PRAM device. More information regarding PRAM devices can be found in U.S. Pat. Nos. 7,061,005, 7,262,502, 7,283,387, 7,371,429, 7,440,308, 7,459,715, 7,459,716 and 7,474,556. It should be noted that a phase change memory device is sometimes referred to as a resistance change memory device and Ovonic Unified Memory (OUM) cell.

In general, phase change memory device 152 operates by changing the phase of the material of phase change material layer 156 in response to a current. The phase of the material of phase change material layer 156 is changed in response to a current because the current provides heat to phase change material layer 156. For example, the phase of the material of phase change material layer 156 can be changed between amorphous and polycrystalline crystal phases. The phase of the material of phase change material layer 156 is changed in response to the amount of current of the memory signal. The phase of the material of phase change material layer 156 is changed in response to the amount of time the memory signal is flowed through phase change material layer 156. It should be noted that phase change material layer 156 has a lower and higher resistance when the material included therein has a polycrystalline and crystalline phase, respectively.

The material of phase change material layer 156 can be of many different types. In general the material of phase change material layer 156 is capable of changing phases in response to the memory signal flowing therethrough. Examples of materials that can be included with phase change material layer 156 are chalcogenides and alloys which include an element from column VI of the Periodic Table of the Elements. Examples of chalcogenides and elements from column VI of the Periodic Table of the Elements include GeSbTe, GaSb, InSb, InSe, SbTe, GeTe, GeSbTe5, InSbTe, GaSeTe, SbTe, InSbGe, AgInSbTe, (GeSn)SbTe, GeSb(SeTe) and TeGeSbS, among others.

FIGS. 7a, 7b, 7c, 7d, 7e and 7f are close-up side views of interconnect region 110 and memory control device region 131. It should be noted that any of the embodiments of FIGS. 7a, 7b, 7c, 7d, 7e and 7f can be included with any of the bonded semiconductor structures discussed herein.

Figure 7A:
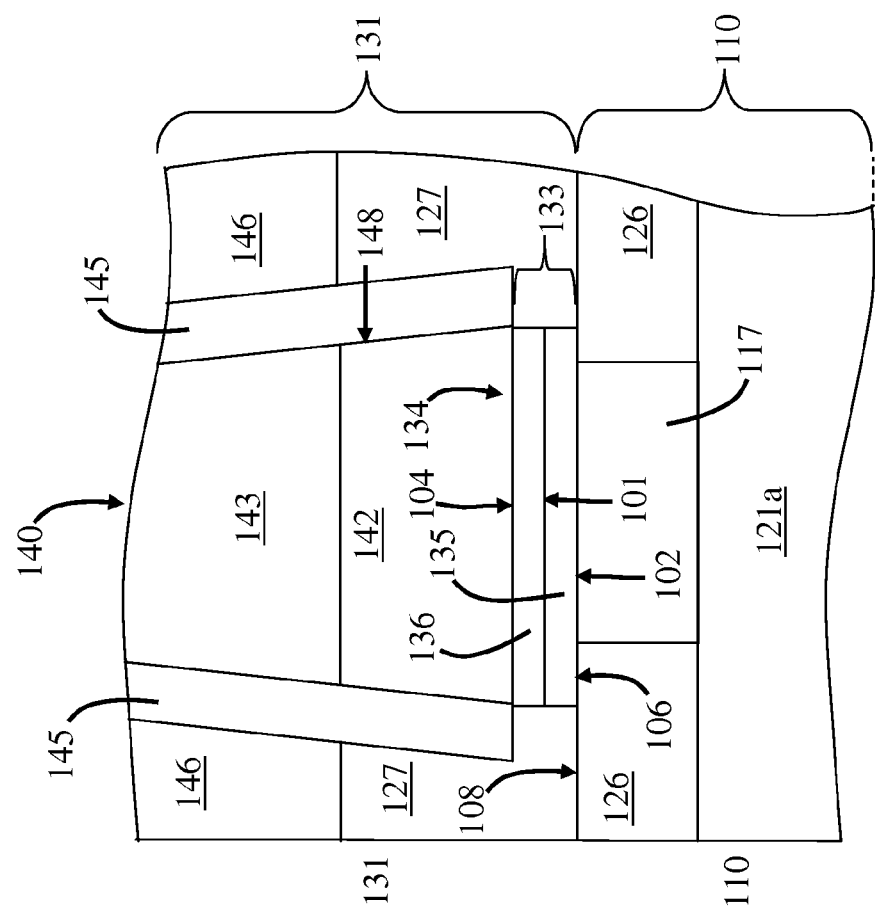
FIGS. 7a, 7b, 7c, 7d, 7e and 7f are close-up side views of an interconnect region and memory control device region which can be included with a bonded semiconductor structure.

In the embodiment of FIG. 7a, conductive bonding contact region 133 includes a conductive bonding layer 135, and bonding interface 134 includes a metal-to-semiconductor bonding interface 103. Metal-to-semiconductor bonding interface 103 is formed in response to bonding semiconductor layer 142 and conductive bonding layer 135 together. Metal-to-semiconductor bonding interface 103 is between vertically oriented memory control device 140 and interconnect region 110. Further, metal-to-semiconductor bonding interface 103 is between conductive bonding layer 135 and vertically oriented memory control device 140. In particular, metal-to-semiconductor bonding interface 103 is between conductive bonding layer 135 and semiconductor layer 142. In this way, vertically oriented memory control device 140 is bonded to interconnect region 110 through conductive bonding layer 135 and metal-to-semiconductor bonding interface 103.

In the embodiment of FIG. 7a, a metal-to-dielectric growth interface 106 is formed in response to growing conductive bonding layer 135 on dielectric material region 126. Further, a metal-to-metal growth interface 102 is formed in response to growing conductive bonding layer 135 on via 117. Hence, vertically oriented memory control device 140 is coupled to interconnect region 110 through metal-to-semiconductor bonding interface 103, as well as through metal-to-metal growth interface 102 and metal-to-dielectric growth interface 106.

Figure 7B:
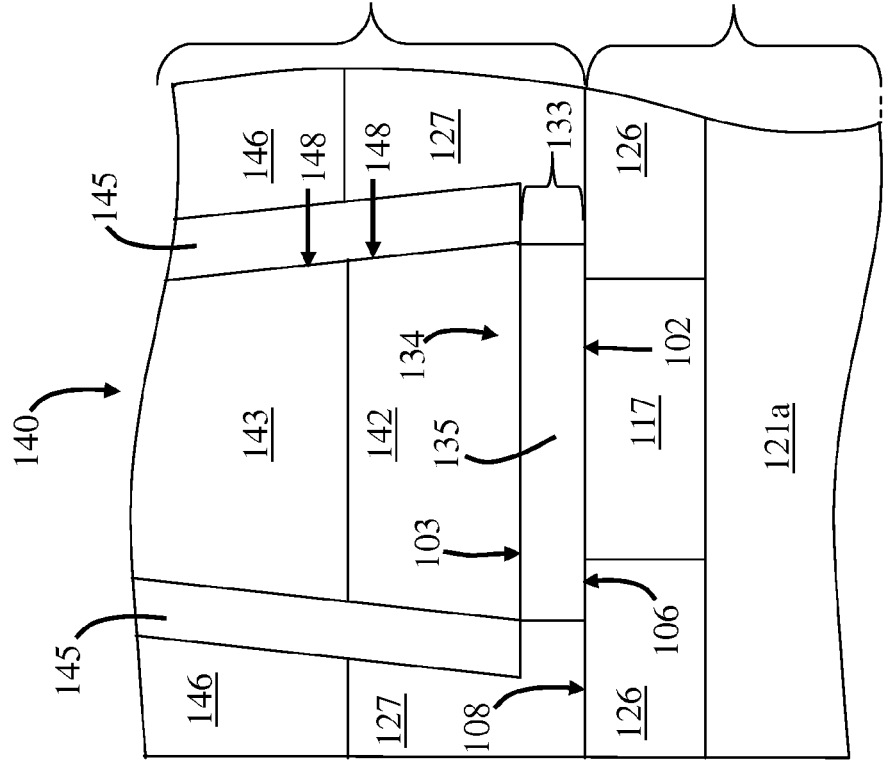

In the embodiment of FIG. 7b, conductive bonding contact region 133 includes conductive bonding layers 135 and 136, wherein conductive bonding layer 135 is adjacent to via 117 and dielectric material region 126, and conductive bonding layer 136 is adjacent to vertically oriented semiconductor device 140. In particular, conductive bonding layer 136 is adjacent to semiconductor layer 142.

In this embodiment, bonding interface 134 includes a metal-to-metal bonding interface 101. Metal-to-metal bonding interface 101 is formed in response to bonding conductive bonding layers 135 and 136 together. Metal-to-metal bonding interface 101 is between vertically oriented memory control device 140 and interconnect region 110. Further, metal-to-metal bonding interface 101 is between conductive bonding layer 135 and vertically oriented memory control device 140. In particular, metal-to-metal bonding interface 101 is between conductive bonding layer 135 and semiconductor layer 142. Conductive bonding layer 136 is between metal-to-metal bonding interface 101 and vertically oriented semiconductor device 140. Conductive bonding layer 136 is between metal-to-metal bonding interface and semiconductor layer 142. In this way, vertically oriented memory control device 140 is bonded to interconnect region 110 through conductive bonding layers 135 and 136, and metal-to-metal bonding interface 101.

In the embodiment of FIG. 7b, metal-to-dielectric growth interface 106 is formed in response to growing conductive bonding layer 135 on dielectric material region 126. Further, metal-to-metal growth interface 102 is formed in response to growing conductive bonding layer 135 on via 117. A metal-to-semiconductor growth interface 104 is formed in response to growing conductive bonding layer 136 on semiconductor layer 142. Hence, vertically oriented memory control device 140 is coupled to interconnect region 110 through metal-to-metal bonding interface 101, as well as through metal-to-metal growth interface 102, metal-to-metal growth interface 104 and metal-to-dielectric growth interface 106.

Figure 7C:
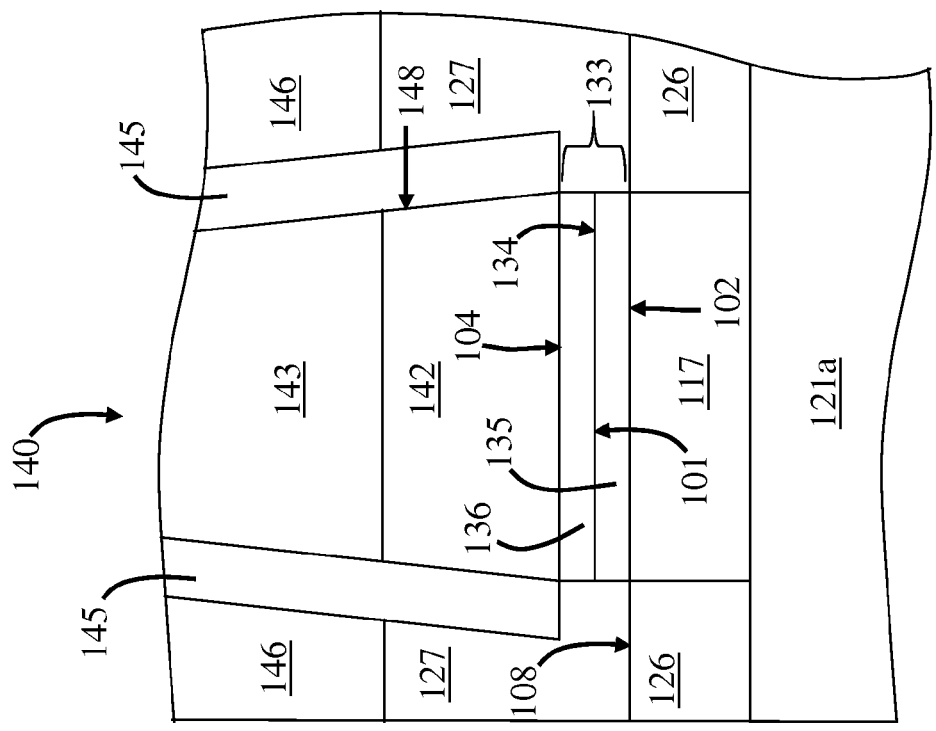

In the embodiment of FIG. 7c, conductive bonding contact region 133 includes conductive bonding layer 135, and bonding interface 134 includes metal-to-metal bonding interface 101. Metal-to-metal bonding interface 101 is formed in response to bonding conductive bonding layer 135 and via 117 together. Metal-to-metal bonding interface 101 is between vertically oriented memory control device 140 and interconnect region 110. Further, metal-to-metal bonding interface 101 is between conductive bonding layer 135 and vertically oriented memory control device 140. In particular, metal-to-metal bonding interface 101 is between conductive bonding layer 135 and via 117. In this way, vertically oriented memory control device 140 is bonded to interconnect region 110 through conductive bonding layer 135 and metal-to-metal bonding interface 101.

In the embodiment of FIG. 7c, a metal-to-dielectric bonding interface 105 is formed in response to bonding conductive bonding layer 135 to dielectric material region 126. Further, metal-to-semiconductor growth interface 104 is formed in response to growing conductive bonding layer 135 on semiconductor layer 142. Hence, vertically oriented memory control device 140 is coupled to interconnect region 110 through metal-to-metal bonding interface 101, as well as through metal-to-semiconductor growth interface 104 and metal-to-dielectric bonding interface 105.

Figure 7D:
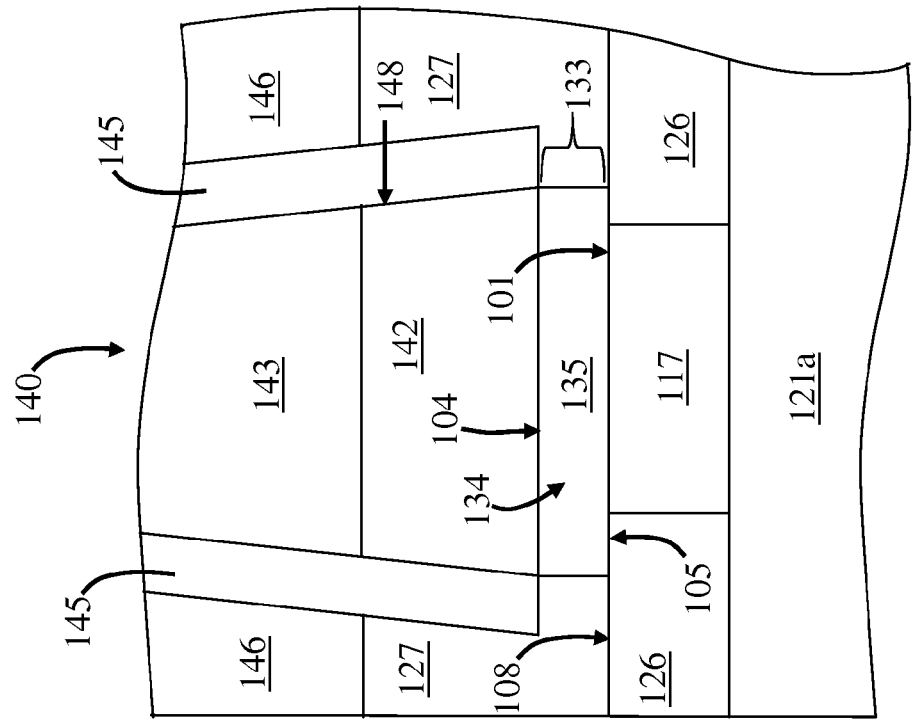

In the embodiment of FIG. 7d, conductive bonding contact region 133 includes conductive bonding layers 135 and 136, wherein conductive bonding layer 135 is adjacent to via 117, and conductive bonding layer 136 is adjacent to vertically oriented semiconductor device 140. In particular, conductive bonding layer 136 is adjacent to semiconductor layer 142.

In this embodiment, bonding interface 134 includes metal-to-metal bonding interface 101. Metal-to-metal bonding interface 101 is formed in response to bonding conductive bonding layers 135 and 136 together. Metal-to-metal bonding interface 101 is between vertically oriented memory control device 140 and interconnect region 110. Further, metal-to-metal bonding interface 101 is between conductive bonding layer 135 and vertically oriented memory control device 140. In particular, metal-to-metal bonding interface 101 is between conductive bonding layer 135 and semiconductor layer 142. Conductive bonding layer 136 is between metal-to-metal bonding interface 101 and vertically oriented semiconductor device 140. Conductive bonding layer 136 is between metal-to-metal bonding interface and semiconductor layer 142. In this way, vertically oriented memory control device 140 is bonded to interconnect region 110 through conductive bonding layers 135 and 136 and metal-to-metal bonding interface 101.

In this embodiment, conductive bonding layer 135 is wider than in the embodiment of FIG. 7b. The dimension of metal-to-dielectric growth interface 106 is adjusted in response to adjusting the width of conductive bonding layer 135 relative to the width of via 117. The dimension of metal-to-dielectric growth interface 106 decreases in response to increasing the width of conductive bonding layer 135 relative to the width of via 117. Further, the dimension of metal-to-dielectric growth interface 106 increases in response to decreasing the width of conductive bonding layer 135 relative to the width of via 117. Here, the width of conductive bonding layer 135 is equal to the width of via 117 so that the dimension of metal-to-dielectric growth interface 106 is driven to zero.

In the embodiment of FIG. 7d, metal-to-metal growth interface 102 is formed in response to growing conductive bonding layer 135 on via 117. Further, metal-to-semiconductor growth interface 104 is formed in response to growing conductive bonding layer 135 on semiconductor layer 142. Hence, vertically oriented memory control device 140 is coupled to interconnect region 110 through metal-to-metal bonding interface 101, as well as through metal-to-metal growth interface 102 and metal-to-semiconductor growth interface 104.

Figure 7E:
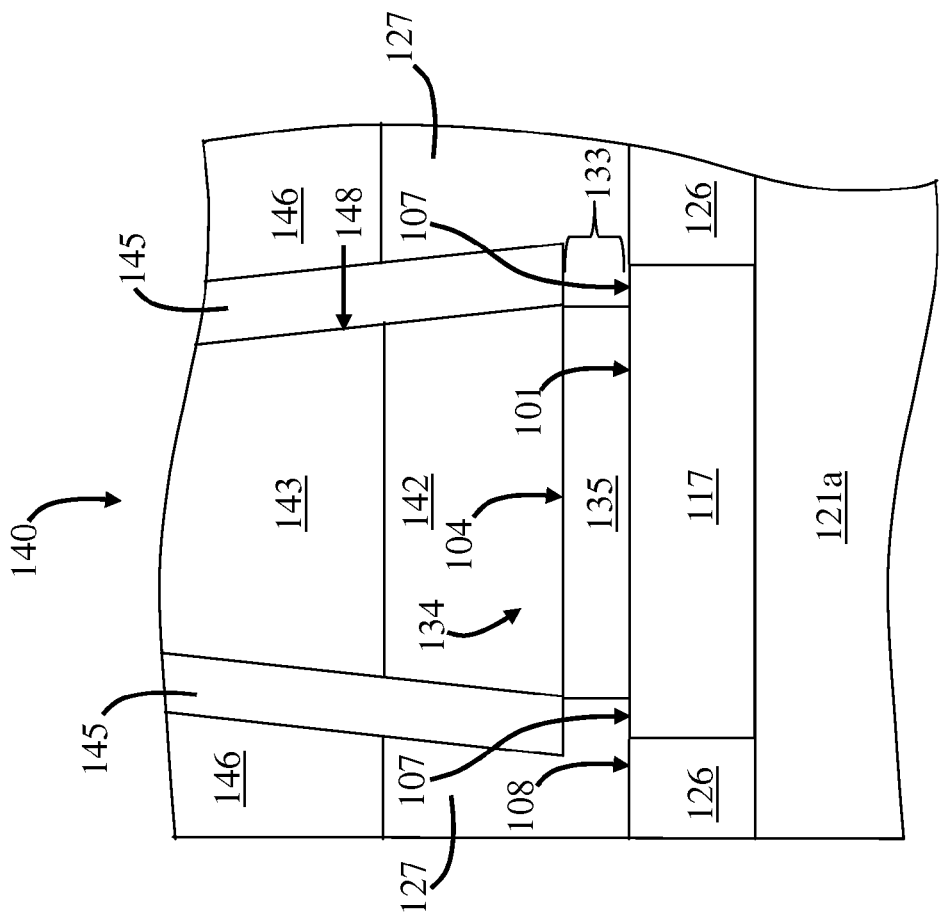

In the embodiment of FIG. 7e, conductive bonding contact region 133 includes conductive bonding layer 135, and bonding interface 134 includes metal-to-metal bonding interface 101. Metal-to-metal bonding interface 101 is formed in response to bonding via 117 and conductive bonding layer 135 together. Metal-to-metal bonding interface 101 is between vertically oriented memory control device 140 and interconnect region 110. Further, metal-to-metal bonding interface 101 is between conductive bonding layer 135 and interconnect region 110. In particular, metal-to-metal bonding interface 101 is between conductive bonding layer 135 and via 117. In this way, vertically oriented memory control device 140 is bonded to interconnect region 110 through conductive bonding layer 135 and metal-to-metal bonding interface 101.

In this embodiment, conductive bonding layer 135 is wider than in the embodiment of FIG. 7a. As mentioned above with FIG. 7d, the dimension of metal-to-dielectric growth interface 106 is adjusted in response to adjusting the width of conductive bonding layer 135 relative to the width of via 117. Here, the width of conductive bonding layer 135 is equal to the width of via 117 so that the dimension of metal-to-dielectric growth interface 106 is driven to zero.

In the embodiment of FIG. 7e, metal-to-semiconductor growth interface 104 is formed in response to growing conductive bonding layer 135 on semiconductor layer 142. Hence, vertically oriented memory control device 140 is coupled to interconnect region 110 through metal-to-metal bonding interface 101, as well as through metal-to-semiconductor growth interface 104.

Figure 7F:
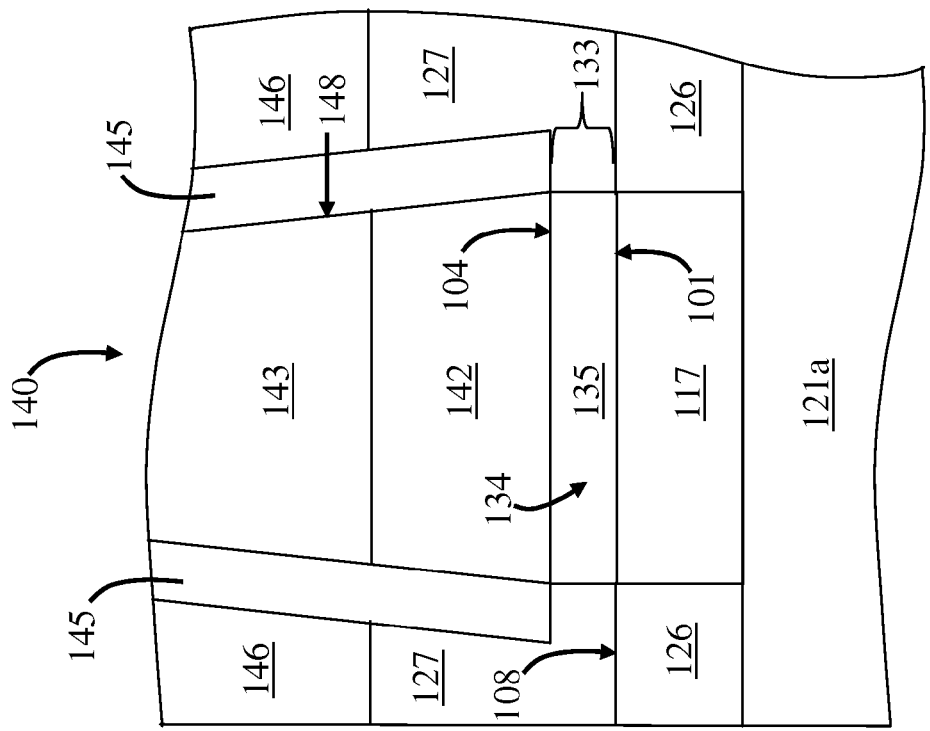

In the embodiment of FIG. 7f, conductive bonding contact region 133 includes conductive bonding layer 135, and bonding interface 134 includes metal-to-metal bonding interface 101. Metal-to-metal bonding interface 101 is formed in response to bonding via 117 and conductive bonding layer 135 together. Metal-to-metal bonding interface 101 is between vertically oriented memory control device 140 and interconnect region 110. Further, metal-to-metal bonding interface 101 is between conductive bonding layer 135 and interconnect region 110. In particular, metal-to-metal bonding interface 101 is between conductive bonding layer 135 and via 117. In this way, vertically oriented memory control device 140 is bonded to interconnect region 110 through conductive bonding layer 135 and metal-to-metal bonding interface 101.

In this embodiment, conductive bonding layer 135 is narrower than in the embodiments of FIGS. 7b and 7d. The width of conductive bonding layer 135 is narrower than the width of via 117 so that a metal-to-dielectric growth interface 107 is formed in response to growing dielectric material region 127 on via 117. The dimension of metal-to-dielectric growth interface 107 is adjusted in response to adjusting the width of conductive bonding layer 135 relative to the width of via 117. The dimension of metal-to-dielectric growth interface 107 increases in response to decreasing the width of conductive bonding layer 135 relative to the width of via 117. Further, the dimension of metal-to-dielectric growth interface 107 decreases in response to increasing the width of conductive bonding layer 135 relative to the width of via 117. Here, the width of conductive bonding layer 135 is narrower than the width of via 117 so that the dimension of metal-to-dielectric growth interface 107 is non-zero.

In the embodiment of FIG. 7f, metal-to-semiconductor growth interface 104 is formed in response to growing conductive bonding layer 135 on semiconductor layer 142. Hence, vertically oriented memory control device 140 is coupled to interconnect region 110 through metal-to-metal bonding interface 101, as well as through metal-to-semiconductor growth interface 104.

Figure 8:
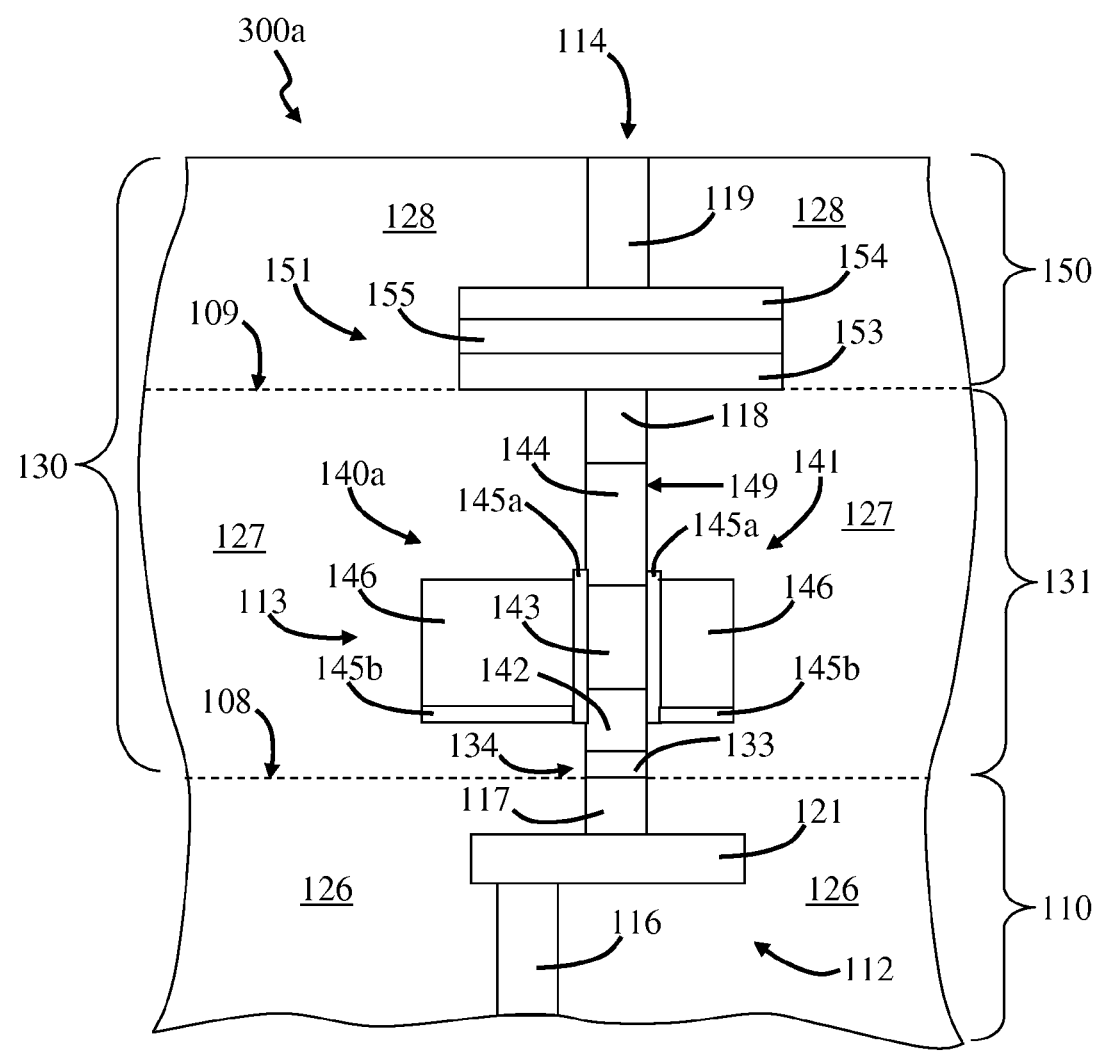
FIG. 8 is a side view of a bonded semiconductor structure, which includes an interconnect region and memory circuit region.

FIG. 8 is a partial side view of a bonded semiconductor structure 300a, which includes interconnect region 110 and memory circuit region 130. In this embodiment, interconnect region 110 includes bit line 112 having vias 116 and 117 connected together through an interconnect 121. Vias 116 and 117, as well as interconnect 121, extend through dielectric material region 126.

In this embodiment, memory circuit region 130 includes memory control device region 131 and memory device region 150. Memory control device region 131 includes a vertically oriented memory control device 140a, which is carried by conductive bonding contact region 133. Vertically oriented memory control device 140a is coupled to interconnect region using bonding, as described in more detail above with vertically oriented memory control device 140. In particular, vertically oriented memory control device 140a is carried by conductive bonding contact region 133 so that device 140a is coupled to interconnect region 110 through bonding interface 134. In this way, vertically oriented memory control device 140a is bonded to interconnect region 110. Further, vertically oriented memory control device 140a is carried by conductive bonding contact region 133 so that device 140a is coupled to via 117 through bonding interface 134. In this way, vertically oriented memory control device 140a is bonded to a via through a bonding interface. Vertically oriented memory control device 140a is carried by bit line 112 so that device 140a is coupled to bit line 112 through bonding interface 134. In this way, vertically oriented memory control device 140a is bonded to a bit line through a bonding interface. It should be noted that bonding interface 134 can correspond to many different types of bonding interfaces, such as those discussed in more detail above with FIGS. 7a-7f.

In this embodiment, vertically oriented memory control device 140a includes semiconductor layer stack 141, wherein stack 141 includes semiconductor layers 141, 142 and 143. Semiconductor layer stack 141 is carried by conductive bonding contact region 133, as described in more detail above.

In this embodiment, vertically oriented memory control device 140a includes a control dielectric 145a and support dielectric 145b, wherein control dielectric layer 145a extends along a non-tapered sidewall 149 of semiconductor layer stack 141, and support dielectric 145b extends away from non-tapered sidewall 149.

In this embodiment, vertically oriented memory control device 140a includes word line 113 having control terminal 146, wherein control terminal 146 extends along control and support dielectric layers 145a and 145b. Control terminal 146 extends along control dielectric layer 145a so that control terminal 146 is spaced from sidewall 149. In particular, control terminal 146 extends along control dielectric layer 145a so that control terminal 146 is spaced from semiconductor layers 142, 143 and 144 by control dielectric layer 145a.

Control terminal 146 extends along support dielectric layer 145b so that it is supported by support dielectric layer 145b. Further, control terminal 146 extends along support dielectric layer 145b so that it extends between control terminal 146 and interconnect region 110. Support dielectric 145b provides electrical and thermal isolation between control terminal 146 and interconnect region 110. Support dielectric 145b is useful to restrict the ability of an electrical signal and/or heat to flow through dielectric material region 127 between control terminal 146 and interconnect region 110.

The dielectric material of support dielectric 145b can be the same dielectric material of dielectric material region 127 or different dielectric material. In some embodiments, the dielectric material of support dielectric 145b has a higher permittivity than the dielectric material of dielectric material region 127 so that better isolation is provided between control terminal 146 and interconnect region 110. In general, more isolation is provided between control terminal 146 and interconnect region 110 in response to increasing the permittivity of the dielectric material of support dielectric 145b. Further, less isolation is provided between control terminal 146 and interconnect region 110 in response to decreasing the permittivity of the dielectric material of support dielectric 145b.

In this embodiment, memory device region 150 includes a ferroelectric memory device 151, which is in communication with vertically oriented memory control device 140a through via 118. Ferroelectric memory device 151 includes a ferroelectric material layer 155 positioned between memory device contacts 153 and 154, wherein memory device contact 153 is connected to via 118. Memory device contact 154 is connected to via 118 through ferroelectric material layer 155 and memory device contact 153. In particular, ferroelectric memory device 151 is in communication with vertically oriented memory control device 140a through via 118.

In this embodiment, vertically oriented memory control device 140a is positioned between ferroelectric memory device 151 and interconnect region 110. Further, vertically oriented memory control device 140a is positioned between ferroelectric memory device 151 and conductive bonding contact region 133. Vertically oriented memory control device 140a is positioned between ferroelectric memory device 151 and bonding interface 134. Vertically oriented memory control device 140a is positioned between ferroelectric memory device 151 and bit line 112.

Ferroelectric material layer 155 can include many different types of ferroelectric materials. Examples of ferroelectric materials include $(PbZr)TiO_3$ (PZT), $SrBi_2Ta_2O_9$ (SBT), and $YMnO_3$. The ferroelectric material of ferroelectric material layer 155 has first and second polarization states, as will be discussed in more detail below. The polarization state of the ferroelectric material of ferroelectric material layer 155 is adjustable in response to an electric field. In this embodiment, the electric field extends between memory device contacts 153 and 154 and is provided in response to providing a potential difference between memory device contacts 153 and 154. The potential difference is provided by flowing the memory signal through vertically oriented memory control device 140a.

In operation, the ferroelectric material of ferroelectric material layer 155 experiences the electric field in response to a potential difference applied to memory device contacts 153 and 154. The potential difference can be applied to memory device contacts 153 and 154 in many different ways. In this embodiment, the potential difference is applied to memory device contacts 153 and 154 in response to a memory signal provided by vertically oriented memory control device 140. The memory signal flows through conductive bonding contact region 133 and bonding interface 134. In this way, the polarization of the ferroelectric material of ferroelectric material layer 155 is adjustable in response to a memory signal which flows through conductive bonding contact region 133 and bonding interface 134.

The memory signal can be provided to memory device contacts 153 and 154 by vertically oriented memory control device 140 in many different ways. In this embodiment, the memory signal is allowed to flow through semiconductor layer stack 141 in response to a control signal applied to control terminal 146. Further, the memory signal is restricted from flowing through semiconductor layer stack 141 in response to the absence of the control signal applied to control terminal 146.

Figure 9:
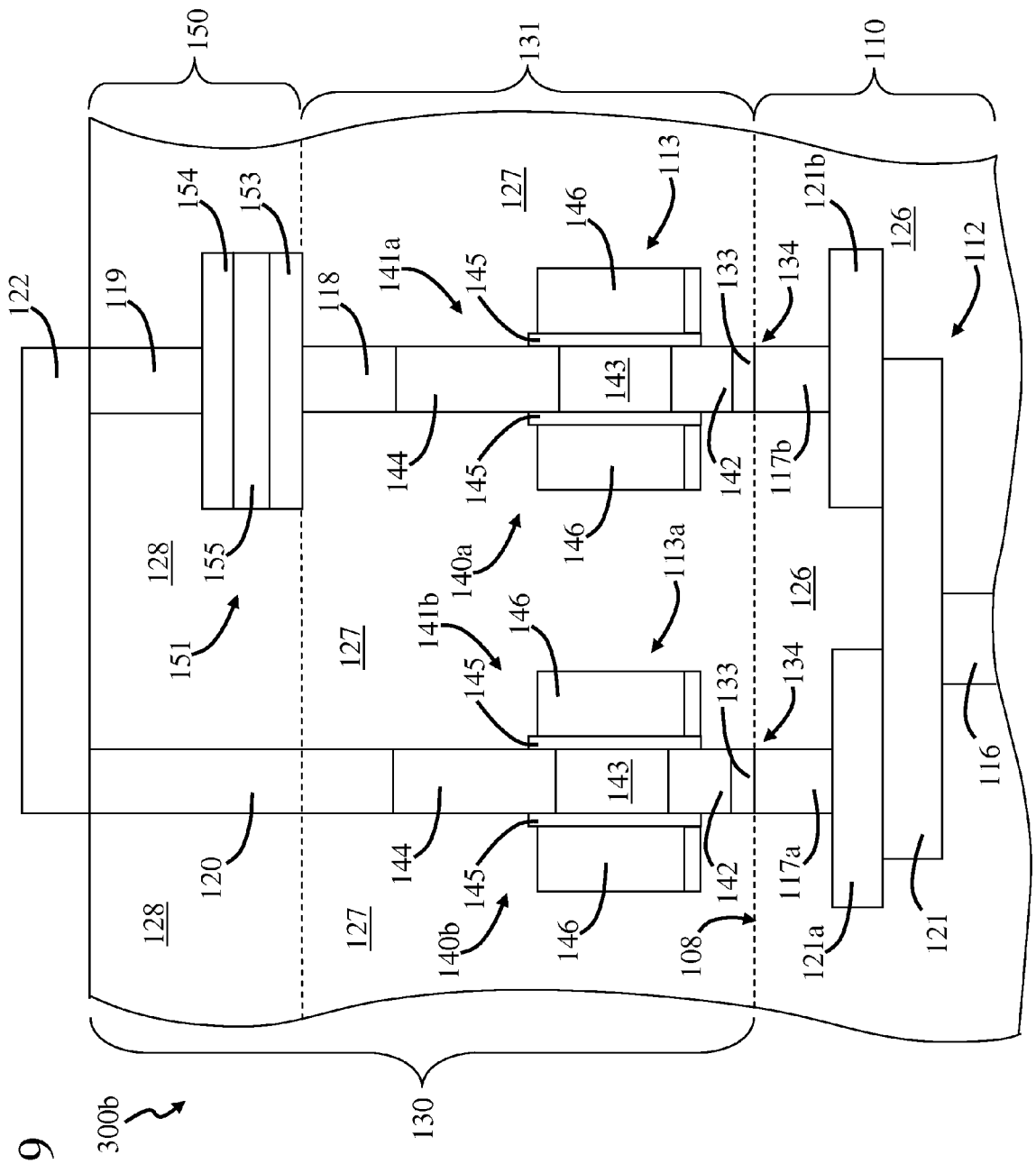
FIG. 9 is a side view of a bonded semiconductor structure, which includes an interconnect region and memory circuit region.

FIG. 9 is a partial side view of a bonded semiconductor structure 300b, which includes interconnect region 110 and memory circuit region 130. In this embodiment, interconnect region 110 includes bit line 112 having interconnect 121 connected to via 116. Interconnect region 110 includes vias 117a and 117b connected to interconnect 121 through interconnects 121a and 121b, respectively. Bit line 112 extends through dielectric material region 126.

In this embodiment, memory circuit region 130 includes memory control device region 131 and memory device region 150. Memory control device region 131 includes a vertically oriented memory control device 140a, which is carried by conductive bonding contact region 133. Vertically oriented memory control device 140a is coupled to interconnect region using bonding, as described in more detail above with vertically oriented memory control device 140. In particular, vertically oriented memory control device 140a is carried by conductive bonding contact region 133 so that device 140a is coupled to interconnect region 110 through bonding interface 134. In this way, vertically oriented memory control device 140a is bonded to interconnect region 110. Further, vertically oriented memory control device 140a is carried by conductive bonding contact region 133 so that device 140a is coupled to via 117b through bonding interface 134. In this way, vertically oriented memory control device 140a is bonded to a via through a bonding interface. Vertically oriented memory control device 140a is carried by bit line 112 so that device 140a is coupled to bit line 112 through bonding interface 134. In this way, vertically oriented memory control device 140a is bonded to a bit line through a bonding interface. It should be noted that bonding interface 134 can correspond to many different types of bonding interfaces, such as those discussed in more detail above with FIGS. 7a-7f.

In this embodiment, vertically oriented memory control device 140a includes semiconductor layer stack 141, wherein stack 141 includes semiconductor layers 141, 142 and 143. Semiconductor layer stack 141 is carried by conductive bonding contact region 133, as described in more detail above.

In this embodiment, vertically oriented memory control device 140a includes a control dielectric 145a and support dielectric 145b, wherein control dielectric layer 145a extends along a non-tapered sidewall 149 of semiconductor layer stack 141, and support dielectric 145b extends away from non-tapered sidewall 149.

In this embodiment, vertically oriented memory control device 140a includes word line 113 having control terminal 146, wherein control terminal 146 extends along control and support dielectric layers 145a and 145b. Control terminal 146 extends along control dielectric layer 145a so that control terminal 146 is spaced from sidewall 149. In particular, control terminal 146 extends along control dielectric layer 145a so that control terminal 146 is spaced from semiconductor layers 142, 143 and 144 by control dielectric layer 145a.

Control terminal 146 extends along support dielectric layer 145b so that it is supported by support dielectric layer 145b. Further, control terminal 146 extends along support dielectric layer 145b so that it extends between control terminal 146 and interconnect region 110. Support dielectric 145b provides electrical and thermal isolation between control terminal 146 and interconnect region 110. Support dielectric 145b is useful to restrict the ability of an electrical signal and/or heat to flow through dielectric material region 127 between control terminal 146 and interconnect region 110.

The dielectric material of support dielectric 145b can be the same dielectric material of dielectric material region 127 or different dielectric material. In some embodiments, the dielectric material of support dielectric 145b has a higher permittivity than the dielectric material of dielectric material region 127 so that better isolation is provided between control terminal 146 and interconnect region 110. In general, more isolation is provided between control terminal 146 and interconnect region 110 in response to increasing the permittivity of the dielectric material of support dielectric 145b. Further, less isolation is provided between control terminal 146 and interconnect region 110 in response to decreasing the permittivity of the dielectric material of support dielectric 145b.

In this embodiment, memory control device region 131 includes a vertically oriented memory control device 140b, which is the same as vertically oriented memory control device 140a. However, vertically oriented memory control device 140b is connected to via 117a. Further, vertically oriented memory control device 140b is connected to via 118 through via 120 and an interconnect 122, wherein via 120 extends through dielectric material region 128. A reference control signal is provided to control terminal 146 of vertically oriented memory control device 140b, which allows a reference control current to flow through vertically oriented memory control device 140b. The reference control signal and current allows ferroelectric memory device 151 to operate faster because the potential difference between memory device contacts 153 and 154 can be established faster.

In this embodiment, memory device region 150 includes ferroelectric memory device 151, which is in communication with vertically oriented memory control device 140a through via 118. Ferroelectric memory device 151 is in communication with vertically oriented memory control device 140b through via 118. Ferroelectric memory device 151 includes ferroelectric material layer 155 positioned between memory device contacts 153 and 154, wherein memory device contact 153 is connected to via 118. Memory device contact 154 is connected to via 118 through ferroelectric material layer 155 and memory device contact 153. In particular, ferroelectric memory device 151 is in communication with vertically oriented memory control device 140a through via 118.

Figure 10:
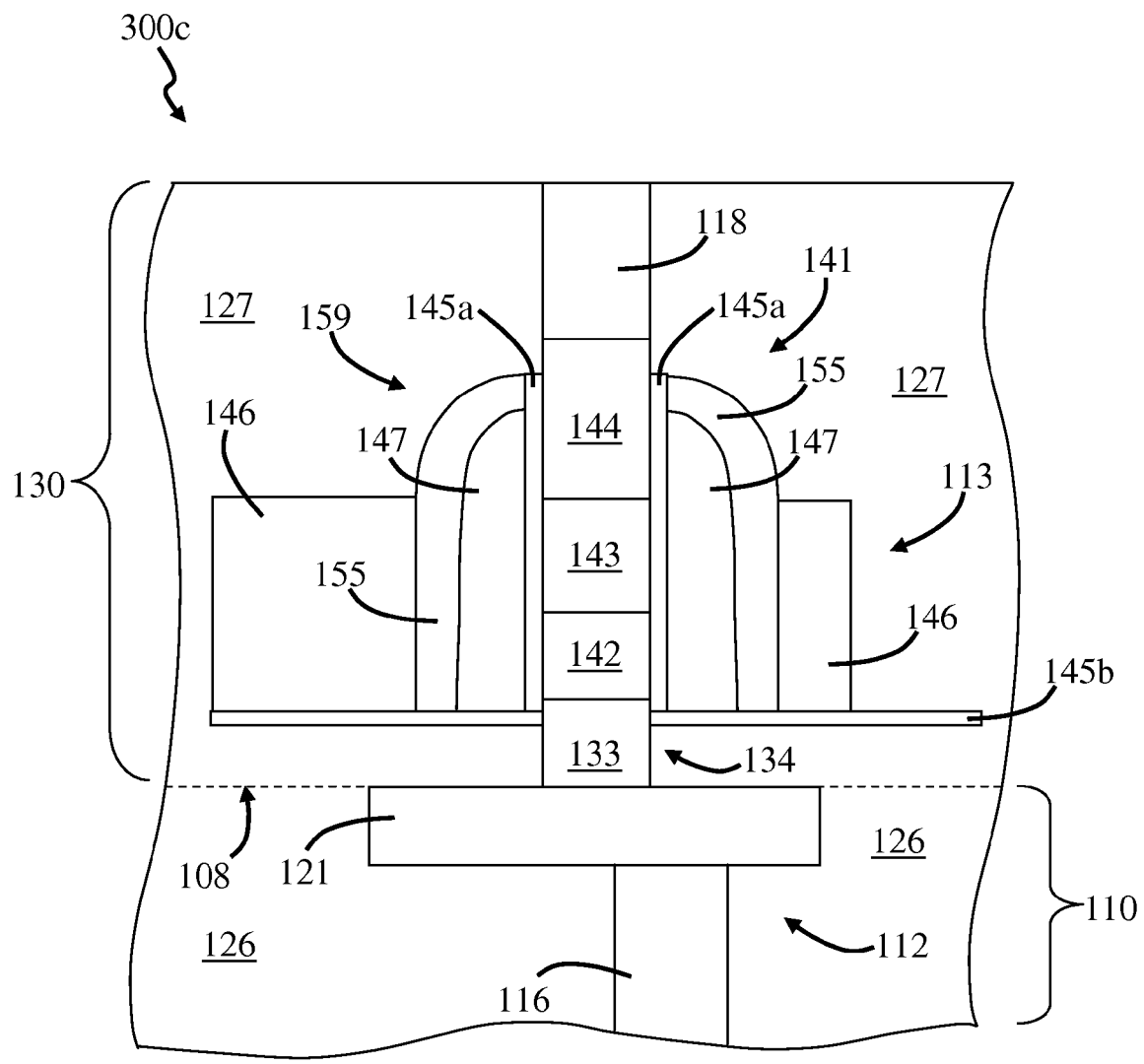
FIGS. 10, 11, 12 and 13 are side views of a bonded semiconductor structure, which includes an interconnect region and memory circuit region.

FIG. 10 is a partial side view of a bonded semiconductor structure 300c, which includes interconnect region 110 and memory circuit region 130. In this embodiment, interconnect region 110 includes bit line 112 having via 116 connected to interconnect 121. Via 116 and interconnect 121 extend through dielectric material region 126.

In this embodiment, memory circuit region 130 includes a floating contact memory device 159, which is carried by conductive bonding contact region 133. Floating contact memory device 159 is coupled to interconnect region using bonding, as described in more detail above with vertically oriented memory control device 140. In particular, floating contact memory device 159 is carried by conductive bonding contact region 133 so that device 159 is coupled to interconnect region 110 through bonding interface 134. In this way, floating contact memory device 159 is bonded to interconnect region 110. Further, floating contact memory device 159 is carried by conductive bonding contact region 133 so that device 159 is coupled to via 117 through bonding interface 134. In this way, floating contact memory device 159 is bonded to a via through a bonding interface. Floating contact memory device 159 is carried by bit line 112 so that device 159 is coupled to bit line 112 through bonding interface 134. In this way, floating contact memory device 159 is bonded to a bit line through a bonding interface. It should be noted that bonding interface 134 can correspond to many different types of bonding interfaces, such as those discussed in more detail above with FIGS. 7a-7f.

In this embodiment, floating contact memory device 159 includes semiconductor layer stack 141, wherein stack 141 includes semiconductor layers 141, 142 and 143. Semiconductor layer stack 141 is carried by conductive bonding contact region 133, as described in more detail above.

In this embodiment, floating contact memory device 159 includes control dielectric 145a and support dielectric 145b, wherein control dielectric layer 145a extends along non-tapered sidewall 149 of semiconductor layer stack 141, and support dielectric 145b extends away from non-tapered sidewall 149.

In this embodiment, floating contact memory device 159 includes a floating contact 147 which extends along control dielectric layer 145a, and ferroelectric material layer 155 which extends along floating contact 147. Floating contact 147 can include many different types of contact materials, such as a metal.

In this embodiment, floating contact memory device 159 includes word line 113 having control terminal 146, wherein control terminal 146 extends along ferroelectric material layer 155 and support dielectric layer 145b. Control terminal 146 extends along ferroelectric material layer 155 so that control terminal 146 is spaced from sidewall 149 by floating contact 147 and ferroelectric material layer 155. In particular, control terminal 146 extends along control dielectric layer 145a so that control terminal 146 is spaced from semiconductor layers 142, 143 and 144 by control dielectric layer 145*a*, floating contact 147 and ferroelectric material layer 155.

In operation, charge is stored on floating contact 147 in response to the memory signals, wherein the memory signal flows through conductive bonding contact region 133 and bonding interface 134.

Figure 11:
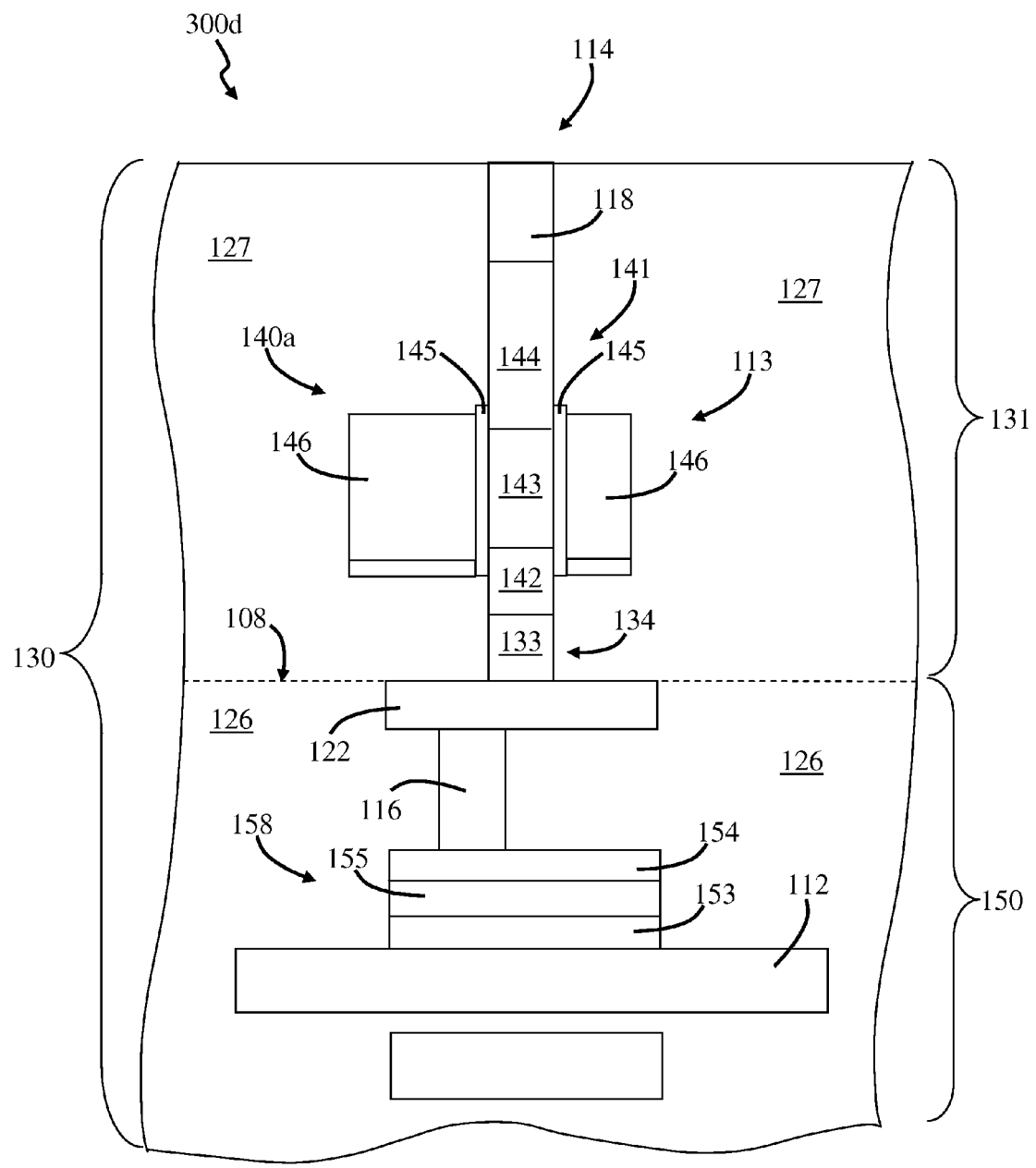

FIG. 11 is a partial side view of a bonded semiconductor structure 300*d*, which includes memory circuit region 130 having memory device region 150 and memory control device region 131.

In this embodiment, memory device region 150 includes a magnetoresistive memory device 158 connected to bit line 112. Magnetoresistive memory device 158 includes a ferroelectric material layer 155 positioned between memory device contacts 153 and 154. Memory device contact 154 is connected to interconnect 122 through via 116.

In this embodiment, memory control device region 131 includes vertically oriented memory control device 140*a*, which is carried by conductive bonding contact region 133. More information regarding vertically oriented memory control device 140*a* is provided above with the discussion of FIGS. 8 and 9. Vertically oriented memory control device 140*a* is coupled to interconnect 122 using bonding, as described in more detail above with vertically oriented memory control device 140. In this way, vertically oriented memory control device 140*a* is bonded to an interconnect. It should be noted that bonding interface 134 can correspond to many different types of bonding interfaces, such as those discussed in more detail above with FIGS. 7*a*-7*f*. Vertically oriented memory control device 140*a* is connected to via 118, which operates as drive line 114.

Figure 12:
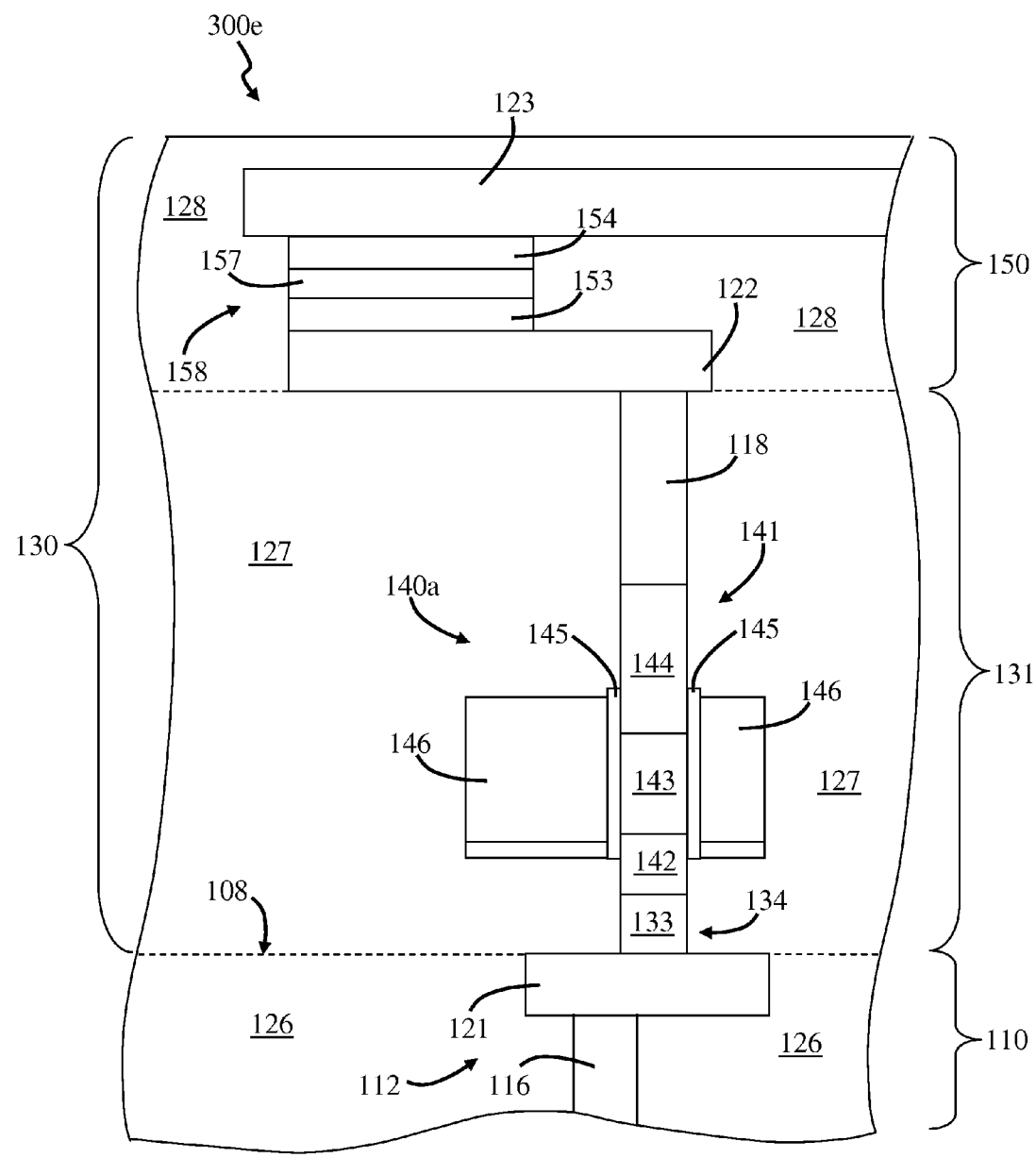

FIG. 12 is a partial side view of a bonded semiconductor structure 300*e*, which includes interconnect region 110 and memory circuit region 130, wherein memory circuit region 130 includes memory device region 150 and memory control device region 131.

In this embodiment, interconnect region 110 includes bit line 112 having via 116 connected to interconnect 121. Via 116 and interconnect 121 extend through dielectric material region 126.

In this embodiment, memory control device region 131 includes vertically oriented memory control device 140*a*, which is carried by conductive bonding contact region 133. More information regarding vertically oriented memory control device 140*a* is provided above with the discussion of FIGS. 8 and 9. Vertically oriented memory control device 140*a* is coupled to interconnect 121 using bonding, as described in more detail above with vertically oriented memory control device 140. In this way, vertically oriented memory control device 140*a* is bonded to an interconnect. It should be noted that bonding interface 134 can correspond to many different types of bonding interfaces, such as those discussed in more detail above with FIGS. 7*a*-7*f*. Vertically oriented memory control device 140*a* is connected to via 118, which extends through dielectric material region 127.

In this embodiment, memory device region 150 includes magnetoresistive memory device 158 connected to via 118 through interconnect 122. Magnetoresistive memory device 158 includes ferroelectric material layer 155 positioned between memory device contacts 153 and 154. Memory device contact 153 is connected to via 118 through interconnect 122, and memory device contact 154 is connected to an interconnect 123. Interconnects 122 and 123 extend through dielectric material region 128.

In operation, the resistance of magnetoresistive material layer 157 is adjustable in response to adjusting an applied magnetic field. The resistance of magnetoresistive material layer 157 depends on the polarization of the magnetic material included therein. The magnetic field is applied to magnetoresistive material layer 157 in response to the memory signal. More information regarding the operation of a magnetoresistive memory device can be found in U.S. Pat. Nos. 6,531,723, 6,545,906, 6,633,498, 6,714,446, 6,720,597, 6,885,582, 6,980,466, 7,009,872 and 7,161,875.

Figure 13:
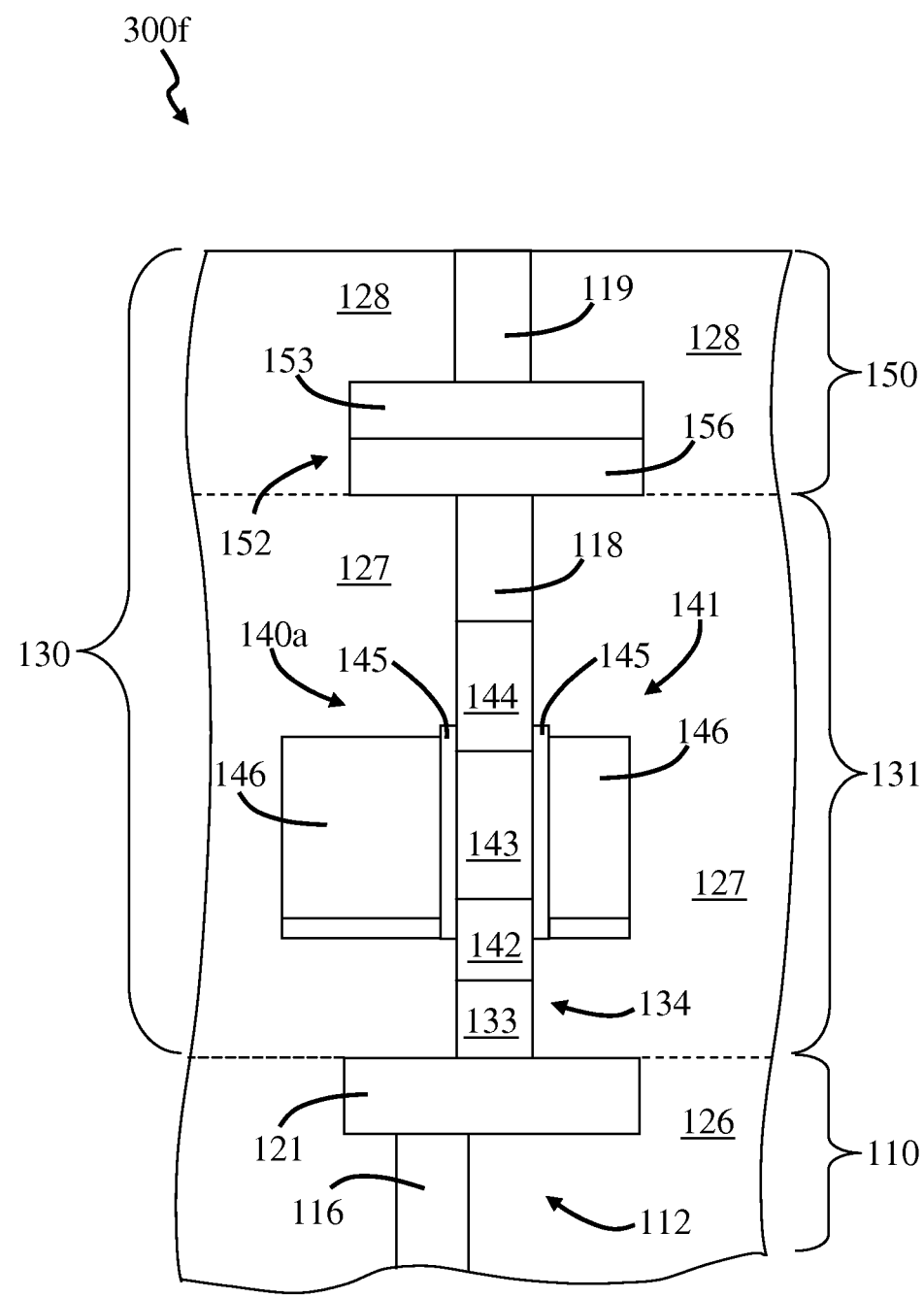

FIG. 13 is a partial side view of a bonded semiconductor structure 300*f*, which includes interconnect region 110 and memory circuit region 130, wherein memory circuit region 130 includes memory device region 150 and memory control device region 131.

In this embodiment, interconnect region 110 includes bit line 112 having via 116 connected to interconnect 121. Via 116 and interconnect 121 extend through dielectric material region 126.

In this embodiment, memory control device region 131 includes vertically oriented memory control device 140*a*, which is carried by conductive bonding contact region 133. More information regarding vertically oriented memory control device 140*a* is provided above with the discussion of FIGS. 8 and 9. Vertically oriented memory control device 140*a* is coupled to interconnect 121 using bonding, as described in more detail above with vertically oriented memory control device 140. In this way, vertically oriented memory control device 140*a* is bonded to an interconnect. It should be noted that bonding interface 134 can correspond to many different types of bonding interfaces, such as those discussed in more detail above with FIGS. 7*a*-7*f*. Vertically oriented memory control device 140*a* is connected to via 118, which extends through dielectric material region 127.

In this embodiment, memory device region 150 includes phase change memory device 152 connected to via 118. Phase change memory device 152 includes phase change material layer 156 and memory device contact 153, wherein phase change material layer 156 is positioned between memory device contact 153 and via 118. Via 119 is connected to memory device contact 153 and extends through dielectric material region 128.

It should be noted that, in general, a bonded semiconductor structure disclosed herein includes one or more memory circuit regions stacked on each other. For example, FIGS. 14*a*, 15*a* and 16*a* show embodiments of bonded semiconductor structures having one, two and three memory circuit regions. It should also be noted that the memory circuit regions generally include one or more vertically oriented memory control devices, such as the vertically oriented memory control devices discussed in more detail above. The memory circuit regions generally include one or more memory devices, such as the memory devices discussed in more detail above.

The memory devices of a bonded semiconductor structure disclosed herein can be the same type. For example, in some embodiments, the memory devices of a first bonded semiconductor structure are ferroelectric memory device and, in other embodiments, the memory devices of a second bonded semiconductor structure are phase change memory devices. Embodiments in which a bonded semiconductor structure includes the same type of memory devices are disclosed in FIGS. 14*a* and 15*a*.

A bonded semiconductor structure disclosed herein can include different types of memory devices, such as in FIG. 16*a*. For example, in some embodiments, some of the memory devices of the bonded semiconductor structure are ferroelectric memory devices and other memory devices of the bonded semiconductor structure are phase change memory devices. An embodiment in which a bonded semiconductor structure includes different types of memory devices is disclosed in FIG. 16a.

Figure 14B:
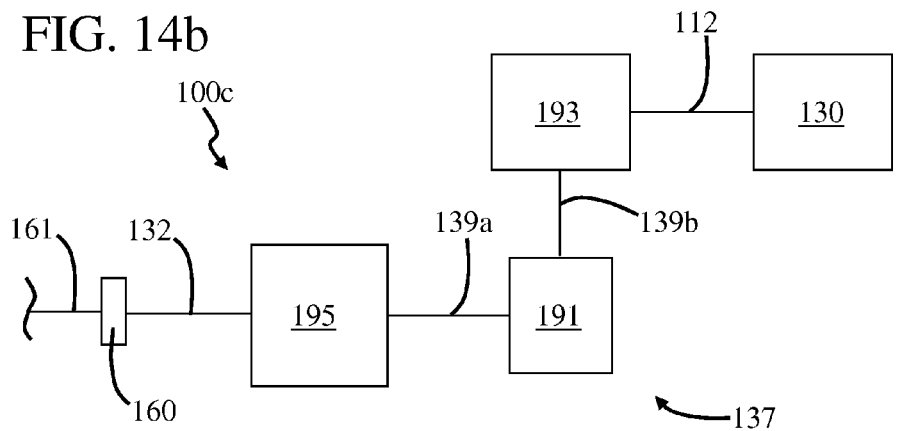

FIG. 14a is a side view of a bonded semiconductor structure 100c, and FIG. 14b is a block diagram of bonded semiconductor structure 100c. In this embodiment, bonded semiconductor structure 100c includes information storage system circuitry 137 which carries interconnect region 110. Information storage system circuitry 137 can include many different types of circuitry, and the circuitry generally includes one or more electronic devices. In this embodiment, the electronic device(s) of the circuitry of information storage system circuitry 137 are horizontally oriented electronic devices. However, in general, the circuitry of information storage system circuitry 137 can include horizontally and/or vertically oriented electronic devices.

In this embodiment, information storage system circuitry 137 includes a host interface 195, which is connected to bonding pad 160 through a conductive line 132, wherein bonding pad 160 is connected to bonding wire 161. Conductive line 132 allows signals to flow between host interface 195 and bonding pad 160 and bonding wire 161. Conductive line 132, bonding pad 160 and bonding wire 161 allow host interface 195 to communicate with circuitry external to the circuitry of bonded semiconductor structure 100c. The circuitry external to the circuitry of bonded semiconductor structure 100c can be of many different types, such as a controller and processor. More information regarding the operation of a host interface is provided in U.S. Pat. No. 6,385,677.

Figure 14C:
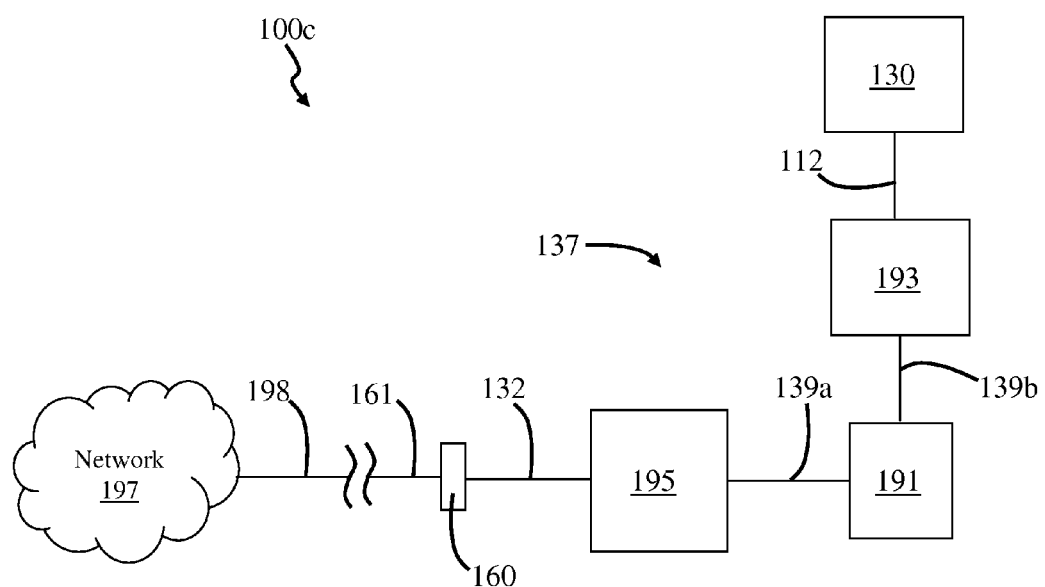

FIG. 14c is a block diagram of a network 197 and bonded semiconductor structure 100c of FIGS. 14a and 14b. In this embodiment, the circuitry external to the circuitry of bonded semiconductor structure 100c includes network 197. Network 197 can be of many different types, such as a computer network, which generally includes a number of computers in communication with each other. The communication between the computers can be through wired and/or wireless computer links. Examples of computer networks include a local area network and wide area network. One type of computer network that can be included with network 197 is the Internet. The Internet generally includes wide and local area networks in communication with each other.

It should be noted that network 197 can include a cellular network, which controls the flow of cell phone signals. The cell phone signals generally flow through a wireless cell phone link. However, the cellular network can include wired phone links, such as land lines, if desired.

The communication between network 197 and the circuitry of bonded semiconductor structure 100c is through a communication link 198, which is in communication with bonding pad 160 and bonding wire 161. Communication link 198 can be a wired and/or wireless communication link, such as those mentioned above. Communication link 198 can be in communication with bonding pad 160 and bonding wire 161 in many different ways, such as by using a circuit board which carries a chip package and interface. Information regarding circuit boards, chip packages and interfaces is provided in more detail below. It should be noted that, in some embodiments, the communication between communication link 198 and bonding pad 160 and bonding wire 161 generally involves a computer motherboard and a modem, such as an Ethernet card.

In this embodiment, information storage system circuitry 137 includes an information storage system controller 191 connected to host interface 195 through a conductive line, such as conductive line 139a of interconnect region 110. In this way, information storage system controller 191 is in communication with host interface 195. It should be noted that, in general, host interface 195 and information storage system 191 are connected together through a plurality of conductive lines. However, a single conductive line is shown here for simplicity. Host interface 195 controls the flow of signals between information storage system controller 191 and bonding pad 160 and bonding wire 161. Information storage system controller 191 controls the operation of one or more bonded semiconductor structure memory controllers in response to an indication from host interface 195, as will be discussed in more detail presently.

In this embodiment, information storage system circuitry 137 includes a bonded semiconductor structure memory controller 193 connected to information storage system controller 191 through a conductive line, such as conductive line 139b of interconnect region 110. In this way, bonded semiconductor structure memory controller 193 is in communication with information storage system controller 191. It should be noted that, in general, information storage system controller 191 and bonded semiconductor structure memory controller 193 are connected together through a plurality of conductive lines. However, a single conductive line is shown here for simplicity. Information storage system controller 191 controls the flow of signals between host interface 195 and bonded semiconductor structure memory controller 193. Bonded semiconductor structure memory controller 193 controls the operation of one or more memory circuit regions, as will be discussed in more detail below.

In this embodiment, bonded semiconductor structure 100c includes memory circuit region 130 coupled to interconnect region 110 through bonding interface 134 and conductive bonding contact region 133. More information regarding memory circuit region 130 of bonded semiconductor structure 100c is provided above with the discussion of FIGS. 5a, 5b and 5c. Conductive bonding contact region 133 is coupled to bit line 112 of interconnect region 110 through bonding interface 134 and conductive bonding contact region 133, wherein bit line 112 extends through dielectric material region 126. In this embodiment, memory circuit region 130 includes vertically oriented memory control device 140 operatively coupled to ferroelectric memory device 151. Vertically oriented memory control device 140 extends through dielectric material region 127, wherein dielectric material region 127 forms dielectric-to-dielectric growth interface 108 with dielectric material region 126 of interconnect region 110 proximate to surface 111.

It should be noted that information storage system circuitry 137 and vertically oriented memory control device 140 are positioned on opposed sides of bonding interface 134 and conductive bonding contact region 133. For example, in this embodiment, information storage system circuitry 137 is positioned below bonding interface 134 and conductive bonding contact region 133, and vertically oriented memory control device 140 is positioned above bonding interface 134 and conductive bonding contact region 133.

Further, interconnect region 110 and vertically oriented memory control device 140 are positioned on opposed sides of bonding interface 134 and conductive bonding contact region 133. For example, in this embodiment, interconnect region 110 is positioned below bonding interface 134 and conductive bonding contact region 133, and vertically oriented memory control device 140 is positioned above bonding interface 134 and conductive bonding contact region 133. Interconnect region 110 and information storage system circuitry 137 are positioned on the same side of bonding interface 134 and conductive bonding contact region 133. Interconnect region 110 and information storage system circuitry 137 are positioned below bonding interface 134 and conductive bonding contact region 133.

Bonded semiconductor structure 100c includes word line 113, which is connected to control terminal 146 of vertically oriented memory control device 140 and bonded semiconductor structure memory controller 193. A portion of word line 113 extends above bonding interface 134 and conductive bonding contact region 133, and another portion of word line 113 extends below bonding interface 134 and conductive bonding contact region 133. In this way, word line 113 extends above and below bonding interface 134 and conductive bonding contact region 133. In this embodiment, a portion 189 of dielectric material region 127 extends between word line 113 and bonding interface 134. In this embodiment, portion 189 of dielectric material region 127 extends between word line 113 and conductive bonding contact region 133. In this embodiment, a portion 189 of dielectric material region 127 extends between control terminal 146 and bonding interface 134. In this embodiment, portion 189 of dielectric material region 127 extends between control terminal 146 and conductive bonding contact region 133. Further, bonded semiconductor structure 100c includes drive line 114, which is connected to via 119 of memory device region 150 (FIG. 5a) and bonded semiconductor structure memory controller 193. A portion of drive line 114 extends above bonding interface 134 and conductive bonding contact region 133, and another portion of drive line 114 extends below bonding interface 134 and conductive bonding contact region 133. In this way, drive line 114 extends above and below bonding interface 134 and conductive bonding contact region 133. It should be noted that drive line 114 is typically connected to a sense amplifier of bonded semiconductor structure memory controller 193.

In operation, bonded semiconductor structure memory controller 193 controls the operation of memory circuit region 130 through bit line 112, word line 113 and drive line 114. Further, bonded semiconductor structure memory controller 193 determines, with the sense amplifier, the state of the memory devices of memory circuit region 130. More information regarding the operation of memory circuit region 130 is provided in more detail above with FIGS. 5a, 5b and 5c.

In this embodiment, bonded semiconductor structure memory controller 193 controls the flow of a memory signal to vertically oriented memory control device 140 through bit line 112, conductive bonding contact region 133 and bonding interface 134. Vertically oriented memory control device 140 allows and restricts the flow of the memory signal to ferroelectric memory device 151 when control terminal 146 is activated and deactivated, respectively. Control terminal 146 is activated and deactivated in response to a control signal provided thereto by bonded semiconductor structure memory controller 193. The control signal is provided by bonded semiconductor structure memory controller 193 to control terminal 146 through word line 113. When control terminal 146 is activated, the memory signal is allowed to flow to ferroelectric memory device 151 through bit line 112, conductive bonding contact region 133, bonding interface 134 and vertically oriented memory control device 140. When control terminal 146 is deactivated, the memory signal is restricted from flowing to ferroelectric memory device 151 through bit line 112, conductive bonding contact region 133, bonding interface 134 and vertically oriented memory control device 140. In this way, a control signal provided to a control terminal of a vertically oriented memory control device controls the flow of a memory signal through the vertically oriented memory control device, a bit line, and a conductive bonding contact region and bonding interface.

In some situations, ferroelectric memory device 151 is read in response to the flow of the memory signal through vertically oriented memory control device 140, bit line 112, conductive bonding contact region 133 and bonding interface 134. In some situations, ferroelectric memory device 151 is written to in response to the flow of the memory signal through vertically oriented memory control device 140, bit line 112, conductive bonding contact region 133 and bonding interface 134. In some situations, ferroelectric memory device 151 is erased in response to the flow of the memory signal through vertically oriented memory control device 140, bit line 112, conductive bonding contact region 133 and bonding interface 134. In this way, ferroelectric memory device 151 operates in response to a memory signal flowing through a vertically oriented memory control device, conductive bonding contact region and bonding interface.

In this embodiment, bonded semiconductor structure memory controller 193 provides the memory and control signals in response to an indication from information storage system controller 191 through conductive line 139b. Hence, information storage system controller 191 is in communication with vertically oriented memory control device 140 through bonded semiconductor structure memory controller 193, bit line 112, conductive bonding contact region 133 and bonding interface 134. As mentioned above, ferroelectric memory device 151 operates in response to the memory signal when control terminal 146 of vertically oriented semiconductor device 140 is activated. Hence, information storage system controller 191 is in communication with ferroelectric memory device 151 through bonded semiconductor structure memory controller 193 and vertically oriented memory control device 140, as well as through bit line 112, conductive bonding contact region 133 and bonding interface 134 when control terminal 146 is activated. In this way, information storage system controller 191 is in communication with a vertically oriented memory control device and ferroelectric memory device through a conductive bonding contact region and bonding interface.

In this embodiment, information storage system controller 191 provides the indication to bonded semiconductor structure memory controller 193 to provide the memory and control signals in response to an indication from host interface 195 through conductive line 139a. Hence, host interface 195 is in communication with vertically oriented memory control device 140 through information storage system controller 191, bonded semiconductor structure memory controller 193, bit line 112, conductive bonding contact region 133 and bonding interface 134. As mentioned above, ferroelectric memory device 151 operates in response to the memory signal when control terminal 146 of vertically oriented semiconductor device 140 is activated. Hence, host interface 195 is in communication with ferroelectric memory device 151 through information storage system controller 191, bonded semiconductor structure memory controller 193 and vertically oriented memory control device 140, as well as through bit line 112, conductive bonding contact region 133 and bonding interface 134 when control terminal 146 is activated. In this way, host interface 195 is in communication with a vertically oriented memory control device and ferroelectric memory device through a conductive bonding contact region and bonding interface.

In this embodiment, the indications provided to information storage system controller 191 and bonded semiconductor structure memory controller 193 are provided in response to a signal received by host interface 195 through bonding pad 160 and bonding wire 161. The signal received by host interface 195 can be from many different sources, such as a computer network. The communication between the computer network and host interface 195 can be through a wired link and/or wireless link.

As mentioned above, bonding pad 160 and bonding wire 161 are in communication with host interface 195 through conductive line 132. Hence, bonding pad 160 and bonding wire 161 are in communication with vertically oriented memory control device 140 through host interface 195, information storage system controller 191 and bonded semiconductor structure memory controller 193, as well as through bit line 112, conductive bonding contact region 133 and bonding interface 134. As mentioned above, ferroelectric memory device 151 operates in response to the memory signal when control terminal 146 of vertically oriented semiconductor device 140 is activated. Hence, bonding pad 160 and bonding wire 161 are in communication with ferroelectric memory device 151 through host interface 195, information storage system controller 191 and bonded semiconductor structure memory controller 193 and vertically oriented memory control device 140, as well as through bit line 112, conductive bonding contact region 133 and bonding interface 134 when control terminal 146 is activated. In this way, bonding pad 160 and bonding wire 161 are in communication with a vertically oriented memory control device and ferroelectric memory device through a conductive bonding contact region and bonding interface.

Figure 15B:
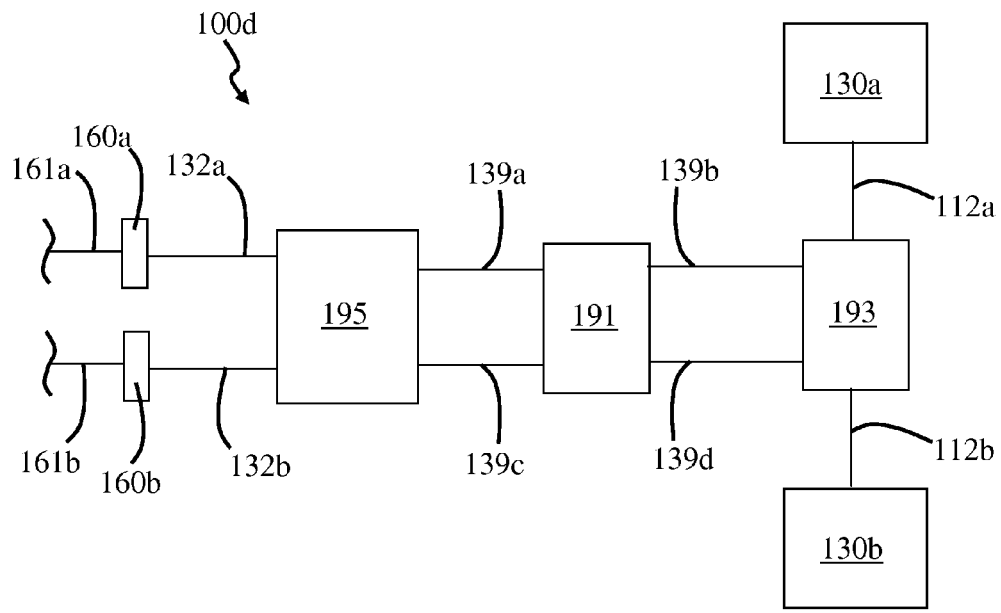

FIG. 15a is a side view of a bonded semiconductor structure 100d, and FIG. 15b is a block diagram of bonded semiconductor structure 100d. In this embodiment, bonded semiconductor structure 100d includes information storage system circuitry 137 which carries interconnect region 110. More information regarding information storage system circuitry 137 is provided above with FIGS. 14a and 14b.

In this embodiment, information storage system circuitry 137 includes host interface 195, which includes host interface circuit portions 195a and 195b. Circuit portion 195a is connected to a bonding pad 160a through a conductive line 132a, wherein bonding pad 160a is connected to a bonding wire 161a. Conductive line 132a allows signals to flow between host interface circuit portion 195a and bonding pad 160a and bonding wire 161a. Conductive line 132a, bonding pad 160a and bonding wire 161a allow host interface circuit portion 195a to communicate with circuitry external to the circuitry of bonded semiconductor structure 100d.

Host interface circuit portion 195b is connected to a bonding pad 160b through a conductive line 132b, wherein bonding pad 160b is connected to a bonding wire 161b. Conductive line 132b allows signals to flow between host interface circuit portion 195b and bonding pad 160b and bonding wire 161b. Conductive line 132b, bonding pad 160b and bonding wire 161b allow host interface circuit portion 195b to communicate with circuitry external to the circuitry of bonded semiconductor structure 100d. The circuitry external to the circuitry of bonded semiconductor structure 100d can be of many different types, such as a controller and processor.

In this embodiment, information storage system circuitry 137 includes information storage system controller 191 having information storage system controller portions 191a and 191b. Information storage system controller portion 191a is connected to host interface circuit portion 195a through a conductive line, such as conductive line 139a of interconnect region 110. In this way, information storage system controller portion 191a is in communication with host interface circuit portion 195a. It should be noted that, in general, host interface circuit portion 195a and information storage system portion 191a are connected together through a plurality of conductive lines. However, a single conductive line is shown here for simplicity. Host interface circuit portion 195a controls the flow of signals between information storage system controller portion 191a and bonding pad 160a and bonding wire 161a. Information storage system controller portion 191a controls the operation of one or more bonded semiconductor structure memory controllers in response to an indication from host interface circuit portion 195a, as will be discussed in more detail below.

In this embodiment, information storage system controller portion 191b is connected to host interface circuit portion 195b through a conductive line, such as a conductive line 139c of interconnect region 110. In this way, information storage system controller portion 191b is in communication with host interface circuit portion 195b. It should be noted that, in general, host interface circuit portion 195b and information storage system portion 191b are connected together through a plurality of conductive lines. However, a single conductive line is shown here for simplicity. Host interface circuit portion 195b controls the flow of signals between information storage system controller portion 191b and bonding pad 160b and bonding wire 161b. Information storage system controller portion 191b controls the operation of one or more bonded semiconductor structure memory controllers in response to an indication from host interface circuit portion 195b, as will be discussed in more detail presently.

In this embodiment, information storage system circuitry 137 includes bonded semiconductor structure memory controller 193 having bonded semiconductor structure memory controller portions 193a and 193b. Bonded semiconductor structure memory controller portion 193a is connected to information storage system controller portion 191a through a conductive line, such as conductive line 139b of interconnect region 110. In this way, bonded semiconductor structure memory controller portion 193a is in communication with information storage system controller portion 191a. It should be noted that, in general, information storage system controller portion 191a and bonded semiconductor structure memory controller portion 193a are connected together through a plurality of conductive lines. However, a single conductive line is shown here for simplicity. Information storage system controller portion 191a controls the flow of signals between host interface circuit portion 195a and bonded semiconductor structure memory controller portion 193a. Bonded semiconductor structure memory controller portion 193a controls the operation of one or more memory circuit regions, as will be discussed in more detail below.

Bonded semiconductor structure memory controller portion 193b is connected to information storage system controller portion 191b through a conductive line, such as a conductive line 139d of interconnect region 110. In this way, bonded semiconductor structure memory controller portion 193b is in communication with information storage system controller portion 191b. It should be noted that, in general, information storage system controller portion 191b and bonded semiconductor structure memory controller portion 193b are connected together through a plurality of conductive lines. However, a single conductive line is shown here for simplicity. Information storage system controller portion 191b controls the flow of signals between host interface circuit portion 195b and bonded semiconductor structure memory controller portion 193b. Bonded semiconductor structure memory controller portion 193b controls the operation of one or more memory circuit regions, as will be discussed in more detail below.

In this embodiment, bonded semiconductor structure 100d includes a memory circuit region 130a coupled to interconnect region 110 through a bonding interface 134a and conductive bonding contact region 133a. More information regarding memory circuit region 130a of bonded semiconductor structure 100d is provided above with the discussion of FIGS. 5a, 5b and 5c. Conductive bonding contact region 133a is coupled to a bit line 112a of interconnect region 110 through bonding interface 134a and conductive bonding contact region 133a, wherein bit line 112a extends through dielectric material region 126. In this embodiment, memory circuit region 130a includes a vertically oriented memory control device 140a operatively coupled to a ferroelectric memory device 151a. Vertically oriented memory control device 140a extends through dielectric material region 127a, wherein dielectric material region 127a forms a dielectric-to-dielectric growth interface 108a with dielectric material region 126 of interconnect region 110 proximate to a surface 111a. Memory circuit region 130a includes a dielectric material region 128a positioned on dielectric material region 127a. Dielectric material regions 127a and 128a form a dielectric-to-dielectric growth interface 109a.

It should be noted that information storage system circuitry 137 and vertically oriented memory control device 140a are positioned on opposed sides of bonding interface 134a and conductive bonding contact region 133a. For example, in this embodiment, information storage system circuitry 137 is positioned below bonding interface 134a and conductive bonding contact region 133a, and vertically oriented memory control device 140a is positioned above bonding interface 134a and conductive bonding contact region 133a.

Further, interconnect region 110 and vertically oriented memory control device 140a are positioned on opposed sides of bonding interface 134a and conductive bonding contact region 133a. For example, in this embodiment, interconnect region 110 is positioned below bonding interface 134a and conductive bonding contact region 133a, and vertically oriented memory control device 140a is positioned above bonding interface 134a and conductive bonding contact region 133a. Interconnect region 110 and information storage system circuitry 137 are positioned on the same side of bonding interface 134a and conductive bonding contact region 133a. Interconnect region 110 and information storage system circuitry 137 are positioned below bonding interface 134a and conductive bonding contact region 133a.

Bonded semiconductor structure 100d includes a word line 113a, which is connected to a control terminal 146a of vertically oriented memory control device 140a and bonded semiconductor structure memory controller portion 193a. A portion of word line 113a extends above bonding interface 134a and conductive bonding contact region 133a, and another portion of word line 113a extends below bonding interface 134a and conductive bonding contact region 133a. In this way, word line 113a extends above and below bonding interface 134a and conductive bonding contact region 133a. Further, bonded semiconductor structure 100d includes a drive line 114a, which is connected to a via 119a of memory device region 150a (FIG. 5a) and bonded semiconductor structure memory controller 193a. A portion of drive line 114a extends above bonding interface 134a and conductive bonding contact region 133a, and another portion of drive line 114a extends below bonding interface 134a and conductive bonding contact region 133a. In this way, drive line 114a extends above and below bonding interface 134a and conductive bonding contact region 133a. It should be noted that drive line 114a is typically connected to a sense amplifier of bonded semiconductor structure memory controller 193a.

In this embodiment, bonded semiconductor structure 100d includes a memory circuit region 130b coupled to memory circuit region 130a through a bonding interface 134b and conductive bonding contact region 133b. More information regarding memory circuit region 130b of bonded semiconductor structure 100d is provided above with the discussion of FIGS. 5a, 5b and 5c. Conductive bonding contact region 133b is coupled to a bit line 112b through bonding interface 134b and conductive bonding contact region 133b, wherein bit line 112b extends through dielectric material regions 126, 127a and 128a.

In this embodiment, memory circuit region 130b includes a vertically oriented memory control device 140b operatively coupled to a ferroelectric memory device 151b. Vertically oriented memory control device 140b extends through a dielectric material region 127b, wherein dielectric material region 127b forms a dielectric-to-dielectric growth interface 108b with dielectric material region 128a. Memory circuit region 130b includes a dielectric material region 128b positioned on dielectric material region 127b. Dielectric material regions 127b and 128b form a dielectric-to-dielectric growth interface 109b. It should be noted that each of dielectric material regions 126, 127a, 128a, 127b and 128b typically include the same type of dielectric material. For example, in one embodiment, dielectric material regions 126, 127a, 128a, 127b and 128b each include silicon dioxide. However, in some embodiments, one or more of dielectric material regions 126, 127a, 128a, 127b and 128b include a dielectric material different from the others. For example, in one embodiment, dielectric material regions 126, 127a, 128a and 127b each include silicon dioxide, and dielectric material region 128b includes silicon nitride.

It should be noted that information storage system circuitry 137 and vertically oriented memory control device 140b are positioned on opposed sides of bonding interface 134b and conductive bonding contact region 133b. For example, in this embodiment, information storage system circuitry 137 is positioned below bonding interface 134b and conductive bonding contact region 133b, and vertically oriented memory control device 140b is positioned above bonding interface 134b and conductive bonding contact region 133b.

Further, interconnect region 110 and vertically oriented memory control device 140b are positioned on opposed sides of bonding interface 134b and conductive bonding contact region 133b. For example, in this embodiment, interconnect region 110 is positioned below bonding interface 134b and conductive bonding contact region 133b, and vertically oriented memory control device 140b is positioned above bonding interface 134b and conductive bonding contact region 133b. Interconnect region 110 and information storage system circuitry 137 are positioned on the same side of bonding interface 134b and conductive bonding contact region 133b. Interconnect region 110 and information storage system circuitry 137 are positioned below bonding interface 134b and conductive bonding contact region 133b.

Vertically oriented memory control device 140a and vertically oriented memory control device 140b are positioned on opposed sides of bonding interface 134b and conductive bonding contact region 133b. For example, in this embodiment, vertically oriented memory control device 140a is positioned below bonding interface 134b and conductive bonding contact region 133b, and vertically oriented memory control device 140b is positioned above bonding interface 134b and conductive bonding contact region 133b.

Bonded semiconductor structure 100d includes a word line 113b, which is connected to a control terminal 146b of vertically oriented memory control device 140b and bonded semiconductor structure memory controller portion 193b. A portion of word line 113b extends above bonding interface 134b and conductive bonding contact region 133b, and another portion of word line 113*b* extends below bonding interface 134*b* and conductive bonding contact region 133*b*. In this way, word line 113*b* extends above and below bonding interface 134*b* and conductive bonding contact region 133*b*. Further, bonded semiconductor structure 100*d* includes a drive line 114*b*, which is connected to a via 119*b* of memory device region 150*b* (FIG. 5*a*) and bonded semiconductor structure memory controller 193*b*. A portion of drive line 114*b* extends above bonding interface 134*b* and conductive bonding contact region 133*b*, and another portion of drive line 114*b* extends below bonding interface 134*b* and conductive bonding contact region 133*b*. In this way, drive line 114*b* extends above and below bonding interface 134*b* and conductive bonding contact region 133*b*. It should be noted that drive line 114*b* is typically connected to a sense amplifier of bonded semiconductor structure memory controller 193*b*.

In operation, bonded semiconductor structure memory controller portion 193*a* controls the operation of memory circuit region 130*a* through bit line 112*a*, word line 113*a* and drive line 114*a*. Further, bonded semiconductor structure memory controller 193*a* determines, with the sense amplifier, the state of the memory devices of memory circuit region 130*a*. More information regarding the operation of memory circuit region 130*a* is provided in more detail above with FIGS. 5*a*, 5*b* and 5*c*.

In this embodiment, bonded semiconductor structure memory controller portion 193*a* controls the flow of a memory signal to vertically oriented memory control device 140*a* through bit line 112*a*, conductive bonding contact region 133*a* and bonding interface 134*a*. Vertically oriented memory control device 140*a* allows and restricts the flow of the memory signal to ferroelectric memory device 151*a* when control terminal 146*a* is activated and deactivated, respectively. Control terminal 146*a* is activated and deactivated in response to a control signal provided thereto by bonded semiconductor structure memory controller portion 193*a*. The control signal is provided by bonded semiconductor structure memory controller 193*a* to control terminal 146*a* through word line 113*a*. When control terminal 146*a* is activated, the memory signal is allowed to flow to ferroelectric memory device 151*a* through bit line 112*a*, conductive bonding contact region 133*a*, bonding interface 134*a* and vertically oriented memory control device 140*a*. When control terminal 146*a* is deactivated, the memory signal is restricted from flowing to ferroelectric memory device 151*a* through bit line 112*a*, conductive bonding contact region 133*a*, bonding interface 134*a* and vertically oriented memory control device 140*a*. In this way, a control signal provided to a control terminal of a vertically oriented memory control device controls the flow of a memory signal through the vertically oriented memory control device, a bit line, and a conductive bonding contact region and bonding interface.

In some situations, ferroelectric memory device 151*a* is read in response to the flow of the memory signal through vertically oriented memory control device 140*a*, bit line 112*a*, conductive bonding contact region 133*a* and bonding interface 134*a*. In some situations, ferroelectric memory device 151*a* is written to in response to the flow of the memory signal through vertically oriented memory control device 140*a*, bit line 112*a*, conductive bonding contact region 133*a* and bonding interface 134*a*. In some situations, ferroelectric memory device 151*a* is erased in response to the flow of the memory signal through vertically oriented memory control device 140*a*, bit line 112*a*, conductive bonding contact region 133*a* and bonding interface 134*a*. In this way, ferroelectric memory device 151*a* operates in response to a memory signal flowing through a vertically oriented memory control device, bit line, conductive bonding contact region and bonding interface.

In this embodiment, bonded semiconductor structure memory controller 193*a* provides the memory and control signals in response to an indication from information storage system controller 191*a* through conductive line 139*b*. Hence, information storage system controller 191*a* is in communication with vertically oriented memory control device 140*a* through bonded semiconductor structure memory controller 193*a*, bit line 112*a*, conductive bonding contact region 133*a* and bonding interface 134*a*. As mentioned above, ferroelectric memory device 151*a* operates in response to the memory signal when control terminal 146*a* of vertically oriented semiconductor device 140*a* is activated. Hence, information storage system controller portion 191*a* is in communication with ferroelectric memory device 151*a* through bonded semiconductor structure memory controller portion 193*a* and vertically oriented memory control device 140*a*, as well as through bit line 112*a*, conductive bonding contact region 133*a* and bonding interface 134*a* when control terminal 146*a* is activated. In this way, information storage system controller 191*a* is in communication with a vertically oriented memory control device and ferroelectric memory device through a conductive bonding contact region and bonding interface.

In this embodiment, information storage system controller portion 191*a* provides, in response to an indication from host interface circuit portion 195*a* through conductive line 139*a*, the indication to bonded semiconductor structure memory controller 193*a* to provide the memory and control signals. Hence, host interface circuit portion 195*a* is in communication with vertically oriented memory control device 140*a* through information storage system controller portion 191*a*, bonded semiconductor structure memory controller portion 193*a*, bit line 112*a*, conductive bonding contact region 133*a* and bonding interface 134*a*. As mentioned above, ferroelectric memory device 151*a* operates in response to the memory signal when control terminal 146*a* of vertically oriented semiconductor device 140*a* is activated. Hence, host interface circuit portion 195*a* is in communication with ferroelectric memory device 151*a* through information storage system controller portion 191*a*, bonded semiconductor structure memory controller portion 193*a* and vertically oriented memory control device 140*a*, as well as through bit line 112*a*, conductive bonding contact region 133*a* and bonding interface 134*a*, when control terminal 146*a* is activated. In this way, host interface circuit portion 195*a* is in communication with a vertically oriented memory control device and ferroelectric memory device through a conductive bonding contact region and bonding interface.

In this embodiment, the indications provided to information storage system controller portion 191*a* and bonded semiconductor structure memory controller 193*a* are provided in response to a signal received by host interface circuit portion 195*a* through bonding pad 160*a* and bonding wire 161*a*. The signal received by host interface circuit portion 195*a* can be from many different sources, such as a computer network. The communication between the computer network and host interface circuit portion 195*a* can be through a wired link and/or wireless link.

As mentioned above, bonding pad 160*a* and bonding wire 161*a* are in communication with host interface circuit portion 195*a* through conductive line 132*a*. Hence, bonding pad 160*a* and bonding wire 161*a* are in communication with vertically oriented memory control device 140*a* through host interface circuit portion 195*a*, information storage system controller 191*a* and bonded semiconductor structure memory controller 193*a*, as well as through bit line 112*a*, conductive bonding contact region 133*a* and bonding interface 134*a*.

Ferroelectric memory device 151*a* operates in response to the memory signal when control terminal 146*a* of vertically oriented semiconductor device 140*a* is activated. Hence, bonding pad 160*a* and bonding wire 161*a* are in communication with ferroelectric memory device 151*a* through host interface circuit portion 195*a*, information storage system controller 191*a* and bonded semiconductor structure memory controller 193*a* and vertically oriented memory control device 140*a*, as well as through bit line 112*a*, conductive bonding contact region 133*a* and bonding interface 134*a*, when control terminal 146*a* is activated. In this way, bonding pad 160*a* and bonding wire 161*a* are in communication with a vertically oriented memory control device and ferroelectric memory device through a conductive bonding contact region and bonding interface.

In operation, bonded semiconductor structure memory controller portion 193*b* controls the operation of memory circuit region 130*b* through bit line 112*b*, word line 113*b* and drive line 114*b*. Further, bonded semiconductor structure memory controller 193*b* determines, with the sense amplifier, the state of the memory devices of memory circuit region 130*b*. More information regarding the operation of memory circuit region 130*b* is provided in more detail above with FIGS. 5*a*, 5*b* and 5*c*.

In this embodiment, bonded semiconductor structure memory controller portion 193*b* controls the flow of a memory signal to vertically oriented memory control device 140*b* through bit line 112*b*, conductive bonding contact region 133*b* and bonding interface 134*b*. Vertically oriented memory control device 140*b* allows and restricts the flow of the memory signal to ferroelectric memory device 151*b* when control terminal 146*b* is activated and deactivated, respectively. Control terminal 146*b* is activated and deactivated in response to a control signal provided thereto by bonded semiconductor structure memory controller portion 193*b*. The control signal is provided by bonded semiconductor structure memory controller 193*b* to control terminal 146*b* through word line 113*b*. When control terminal 146*b* is activated, the memory signal is allowed to flow to ferroelectric memory device 151*b* through bit line 112*b*, conductive bonding contact region 133*b*, bonding interface 134*b* and vertically oriented memory control device 140*b*. When control terminal 146*b* is deactivated, the memory signal is restricted from flowing to ferroelectric memory device 151*b* through bit line 112*b*, conductive bonding contact region 133*b*, bonding interface 134*b* and vertically oriented memory control device 140*b*. In this way, a control signal provided to a control terminal of a vertically oriented memory control device controls the flow of a memory signal through the vertically oriented memory control device, a bit line, and a conductive bonding contact region and bonding interface.

In some situations, ferroelectric memory device 151*b* is read in response to the flow of the memory signal through vertically oriented memory control device 140*b*, bit line 112*b*, conductive bonding contact region 133*b* and bonding interface 134*b*. In some situations, ferroelectric memory device 151*b* is written to in response to the flow of the memory signal through vertically oriented memory control device 140*b*, bit line 112*b*, conductive bonding contact region 133*b* and bonding interface 134*b*. In some situations, ferroelectric memory device 151*b* is erased in response to the flow of the memory signal through vertically oriented memory control device 140*b*, bit line 112*b*, conductive bonding contact region 133*b* and bonding interface 134*b*. In this way, ferroelectric memory device 151*b* operates in response to a memory signal flowing through a vertically oriented memory control device, bit line, conductive bonding contact region and bonding interface.

In this embodiment, bonded semiconductor structure memory controller 193*b* provides the memory and control signals in response to an indication from information storage system controller 191*b* through conductive line 139*b*. Hence, information storage system controller 191*b* is in communication with vertically oriented memory control device 140*b* through bonded semiconductor structure memory controller 193*b*, bit line 112*b*, conductive bonding contact region 133*b* and bonding interface 134*b*. As mentioned above, ferroelectric memory device 151*b* operates in response to the memory signal when control terminal 146*b* of vertically oriented semiconductor device 140*b* is activated. Hence, information storage system controller portion 191*b* is in communication with ferroelectric memory device 151*b* through bonded semiconductor structure memory controller portion 193*b* and vertically oriented memory control device 140*b*, as well as through bit line 112*b*, conductive bonding contact region 133*b* and bonding interface 134*b* when control terminal 146*b* is activated. In this way, information storage system controller 191*b* is in communication with a vertically oriented memory control device and ferroelectric memory device through a conductive bonding contact region and bonding interface.

In this embodiment, information storage system controller portion 191*b* provides, in response to an indication from host interface circuit portion 195*b* through conductive line 139*b*, the indication to bonded semiconductor structure memory controller 193*b* to provide the memory and control signals. Hence, host interface circuit portion 195*b* is in communication with vertically oriented memory control device 140*b* through information storage system controller portion 191*b*, bonded semiconductor structure memory controller portion 193*b*, bit line 112*b*, conductive bonding contact region 133*b* and bonding interface 134*b*. As mentioned above, ferroelectric memory device 151*b* operates in response to the memory signal when control terminal 146*b* of vertically oriented semiconductor device 140*b* is activated. Hence, host interface circuit portion 195*b* is in communication with ferroelectric memory device 151*b* through information storage system controller portion 191*b*, bonded semiconductor structure memory controller portion 193*b* and vertically oriented memory control device 140*b*, as well as through bit line 112*b*, conductive bonding contact region 133*a* and bonding interface 134*b*, when control terminal 146*b* is activated. In this way, host interface circuit portion 195*b* is in communication with a vertically oriented memory control device and ferroelectric memory device through a conductive bonding contact region and bonding interface.

In this embodiment, the indications provided to information storage system controller portion 191*b* and bonded semiconductor structure memory controller 193*b* are provided in response to a signal received by host interface circuit portion 195*b* through bonding pad 160*b* and bonding wire 161*b*. The signal received by host interface circuit portion 195*b* can be from many different sources, such as a computer network. The communication between the computer network and host interface circuit portion 195*b* can be through a wired link and/or wireless link.

As mentioned above, bonding pad 160*b* and bonding wire 161*b* are in communication with host interface circuit portion 195*b* through conductive line 132*b*. Hence, bonding pad 160*b* and bonding wire 161*b* are in communication with vertically oriented memory control device 140*b* through host interface circuit portion 195b, information storage system controller 191b and bonded semiconductor structure memory controller 193b, as well as through bit line 112b, conductive bonding contact region 133a and bonding interface 134b.

Ferroelectric memory device 151b operates in response to the memory signal when control terminal 146b of vertically oriented semiconductor device 140b is activated. Hence, bonding pad 160b and bonding wire 161b are in communication with ferroelectric memory device 151b through host interface circuit portion 195b, information storage system controller 191b and bonded semiconductor structure memory controller 193b and vertically oriented memory control device 140b, as well as through bit line 112b, conductive bonding contact region 133a and bonding interface 134b, when control terminal 146b is activated. In this way, bonding pad 160b and bonding wire 161b are in communication with a vertically oriented memory control device and ferroelectric memory device through a conductive bonding contact region and bonding interface.

Figure 16B:
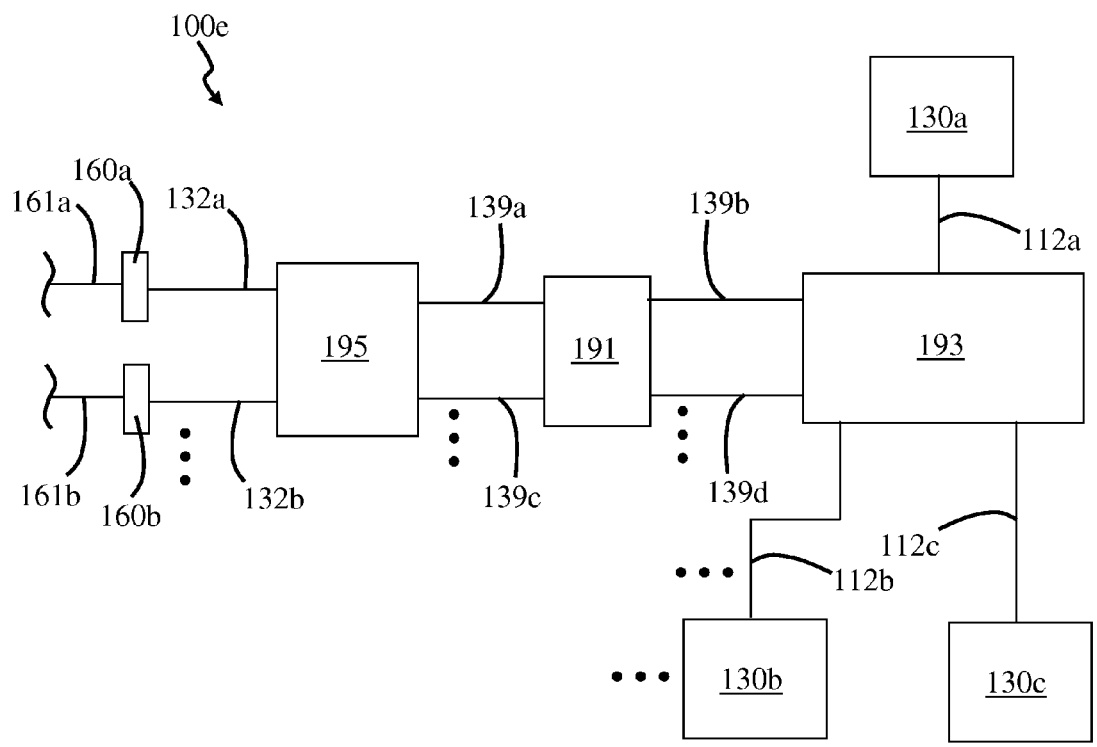

FIG. 16a is a side view of a bonded semiconductor structure 100e, and FIG. 16b is a block diagram of bonded semiconductor structure 100e. It should be noted that bonded semiconductor structure 100e is similar to bonded semiconductor structure 100d of FIGS. 15a and 15b. In this embodiment, bonded semiconductor structure 100e includes information storage system circuitry 137 which carries interconnect region 110. More information regarding information storage system circuitry 137 is provided above with FIGS. 14a and 14b and FIGS. 15a and 15b.

In this embodiment, information storage system circuitry 137 includes host interface 195 having host interface circuit portions 195a and 195b. Circuit portion 195a is connected to bonding pad 160a through conductive line 132a, wherein bonding pad 160a is connected to bonding wire 161a. Conductive line 132a allows signals to flow between host interface circuit portion 195a and bonding pad 160a and bonding wire 161a. Conductive line 132a, bonding pad 160a and bonding wire 161a allow host interface circuit portion 195a to communicate with circuitry external to the circuitry of bonded semiconductor structure 100e.

Host interface circuit portion 195b is connected to bonding pad 160b through conductive line 132b, wherein bonding pad 160b is connected to bonding wire 161b. Conductive line 132b allows signals to flow between host interface circuit portion 195b and bonding pad 160b and bonding wire 161b. Conductive line 132b, bonding pad 160b and bonding wire 161b allow host interface circuit portion 195b to communicate with circuitry external to the circuitry of bonded semiconductor structure 100e. The circuitry external to the circuitry of bonded semiconductor structure 100e can be of many different types, such as a controller and processor.

In this embodiment, information storage system circuitry 137 includes information storage system controller 191 having information storage system controller portions 191a and 191b. Information storage system controller portion 191a is connected to host interface circuit portion 195a through a conductive line, such as conductive line 139a of interconnect region 110. In this way, information storage system controller portion 191a is in communication with host interface circuit portion 195a. It should be noted that, in general, host interface circuit portion 195a and information storage system portion 191a are connected together through a plurality of conductive lines. However, a single conductive line is shown here for simplicity. Host interface circuit portion 195a controls the flow of signals between information storage system controller portion 191a and bonding pad 160a and bonding wire 161a. Information storage system controller portion 191a controls the operation of one or more bonded semiconductor structure memory controllers in response to an indication from host interface circuit portion 195a, as will be discussed in more detail below.

In this embodiment, information storage system controller portion 191b is connected to host interface circuit portion 195b through a conductive line, such as conductive line 139c of interconnect region 110. In this way, information storage system controller portion 191b is in communication with host interface circuit portion 195b. It should be noted that, in general, host interface circuit portion 195b and information storage system portion 191b are connected together through a plurality of conductive lines. However, a single conductive line is shown here for simplicity. Host interface circuit portion 195b controls the flow of signals between information storage system controller portion 191b and bonding pad 160b and bonding wire 161b. Information storage system controller portion 191b controls the operation of one or more bonded semiconductor structure memory controllers in response to an indication from host interface circuit portion 195b, as will be discussed in more detail presently.

In this embodiment, information storage system circuitry 137 includes bonded semiconductor structure memory controller 193 having bonded semiconductor structure memory controller portions 193a and 193b. Bonded semiconductor structure memory controller portion 193a is connected to information storage system controller portion 191a through a conductive line, such as conductive line 139b of interconnect region 110. In this way, bonded semiconductor structure memory controller portion 193a is in communication with information storage system controller portion 191a. It should be noted that, in general, information storage system controller portion 191a and bonded semiconductor structure memory controller portion 193a are connected together through a plurality of conductive lines. However, a single conductive line is shown here for simplicity. Information storage system controller portion 191a controls the flow of signals between host interface circuit portion 195a and bonded semiconductor structure memory controller portion 193a. Bonded semiconductor structure memory controller portion 193a controls the operation of one or more memory circuit regions, as will be discussed in more detail below.

Bonded semiconductor structure memory controller portion 193b is connected to information storage system controller portion 191b through a conductive line, such as conductive line 139d of interconnect region 110. In this way, bonded semiconductor structure memory controller portion 193b is in communication with information storage system controller portion 191b. It should be noted that, in general, information storage system controller portion 191b and bonded semiconductor structure memory controller portion 193b are connected together through a plurality of conductive lines. However, a single conductive line is shown here for simplicity. Information storage system controller portion 191b controls the flow of signals between host interface circuit portion 195b and bonded semiconductor structure memory controller portion 193b. Bonded semiconductor structure memory controller portion 193b controls the operation of one or more memory circuit regions, as will be discussed in more detail below.

In this embodiment, bonded semiconductor structure 100e includes memory circuit region 130a coupled to interconnect region 110 through bonding interface 134a and conductive bonding contact region 133a. More information regarding memory circuit region 130a of bonded semiconductor structure 100e is provided above with the discussion of FIGS. 5a, 5b and 5c. Conductive bonding contact region 133a is coupled to bit line 112a of interconnect region 110 through bonding interface 134a and conductive bonding contact region 133a, wherein bit line 112a extends through dielectric material region 126. In this embodiment, memory circuit region 130a includes vertically oriented memory control device 140a operatively coupled to ferroelectric memory device 151a. Vertically oriented memory control device 140a extends through dielectric material region 127a, wherein dielectric material region 127a forms dielectric-to-dielectric growth interface 108a with dielectric material region 126 of interconnect region 110 proximate to surface 111a. Memory circuit region 130a includes dielectric material region 128a positioned on dielectric material region 127a. Dielectric material regions 127a and 128a form a dielectric-to-dielectric growth interface 109a.

It should be noted that information storage system circuitry 137 and vertically oriented memory control device 140a are positioned on opposed sides of bonding interface 134a and conductive bonding contact region 133a. For example, in this embodiment, information storage system circuitry 137 is positioned below bonding interface 134a and conductive bonding contact region 133a, and vertically oriented memory control device 140a is positioned above bonding interface 134a and conductive bonding contact region 133a.

Further, interconnect region 110 and vertically oriented memory control device 140a are positioned on opposed sides of bonding interface 134a and conductive bonding contact region 133a. For example, in this embodiment, interconnect region 110 is positioned below bonding interface 134a and conductive bonding contact region 133a, and vertically oriented memory control device 140a is positioned above bonding interface 134a and conductive bonding contact region 133a. Interconnect region 110 and information storage system circuitry 137 are positioned on the same side of bonding interface 134a and conductive bonding contact region 133a. Interconnect region 110 and information storage system circuitry 137 are positioned below bonding interface 134a and conductive bonding contact region 133a.

Bonded semiconductor structure 100e includes word line 113a, which is connected to control terminal 146a of vertically oriented memory control device 140a and bonded semiconductor structure memory controller portion 193a, as shown in FIG. 15a. A portion of word line 113a extends above bonding interface 134a and conductive bonding contact region 133a, and another portion of word line 113a extends below bonding interface 134a and conductive bonding contact region 133a. In this way, word line 113a extends above and below bonding interface 134a and conductive bonding contact region 133a. Further, bonded semiconductor structure 100e includes drive line 114a, which is connected to via 119a of memory device region 150a (FIG. 5a) and bonded semiconductor structure memory controller 193a, as shown in FIG. 16a. A portion of drive line 114a extends above bonding interface 134a and conductive bonding contact region 133a, and another portion of drive line 114a extends below bonding interface 134a and conductive bonding contact region 133a. In this way, drive line 114a extends above and below bonding interface 134a and conductive bonding contact region 133a. It should be noted that drive line 114a is typically connected to a sense amplifier of bonded semiconductor structure memory controller 193a.

In this embodiment, bonded semiconductor structure 100e includes memory circuit region 130b coupled to memory circuit region 130a through bonding interface 134b and conductive bonding contact region 133b. Conductive bonding contact region 133b is coupled to bit line 112b through bonding interface 134b and conductive bonding contact region 133b, wherein bit line 112b extends through dielectric material regions 126, 127a and 128a.

In this embodiment, memory circuit region 130b includes vertically oriented memory control device 140b operatively coupled to a phase change memory device 152b. More information regarding memory circuit region 130b of bonded semiconductor structure 100e is provided above with the discussion of FIG. 6. Vertically oriented memory control device 140b extends through dielectric material region 127b, wherein dielectric material region 127b forms dielectric-to-dielectric growth interface 108b with dielectric material region 128a. Memory circuit region 130b includes dielectric material region 128b positioned on dielectric material region 127b. Dielectric material regions 127b and 128b form a dielectric-to-dielectric growth interface 109b. It should be noted that dielectric material regions 126, 127a, 128a, 127b and 128b typically include the same type of dielectric material, such as silicon dioxide. However, in some embodiments, one or more of dielectric material regions 126, 127a, 128a, 127b and 128b can include a dielectric material different from the others, as discussed in more detail above with FIGS. 16a and 16b.

It should be noted that information storage system circuitry 137 and vertically oriented memory control device 140b are positioned on opposed sides of bonding interface 134b and conductive bonding contact region 133b. For example, in this embodiment, information storage system circuitry 137 is positioned below bonding interface 134b and conductive bonding contact region 133b, and vertically oriented memory control device 140b is positioned above bonding interface 134b and conductive bonding contact region 133b.

Further, interconnect region 110 and vertically oriented memory control device 140b are positioned on opposed sides of bonding interface 134b and conductive bonding contact region 133b. For example, in this embodiment, interconnect region 110 is positioned below bonding interface 134b and conductive bonding contact region 133b, and vertically oriented memory control device 140b is positioned above bonding interface 134b and conductive bonding contact region 133b. Interconnect region 110 and information storage system circuitry 137 are positioned on the same side of bonding interface 134b and conductive bonding contact region 133b. Interconnect region 110 and information storage system circuitry 137 are positioned below bonding interface 134b and conductive bonding contact region 133b.

Vertically oriented memory control device 140a and vertically oriented memory control device 140b are positioned on opposed sides of bonding interface 134b and conductive bonding contact region 133b. For example, in this embodiment, vertically oriented memory control device 140a is positioned below bonding interface 134b and conductive bonding contact region 133b, and vertically oriented memory control device 140b is positioned above bonding interface 134b and conductive bonding contact region 133b.

Bonded semiconductor structure 100e includes word line 113b, which is connected to control terminal 146b of vertically oriented memory control device 140b and bonded semiconductor structure memory controller portion 193b, as shown in FIG. 15a. A portion of word line 113b extends above bonding interface 134b and conductive bonding contact region 133b, and another portion of word line 113b extends below bonding interface 134b and conductive bonding contact region 133b. In this way, word line 113b extends above and below bonding interface 134b and conductive bonding contact region 133b. Further, bonded semiconductor structure 100e includes drive line 114b, which is connected to via 119b of memory device region 150b (FIG. 6) and bonded semiconductor structure memory controller 193b, as shown in FIG. 16a. A portion of drive line 114b extends above bonding interface 134b and conductive bonding contact region 133b, and another portion of drive line 114b extends below bonding interface 134b and conductive bonding contact region 133b. In this way, drive line 114b extends above and below bonding interface 134b and conductive bonding contact region 133b. It should be noted that drive line 114b is typically connected to a sense amplifier of bonded semiconductor structure memory controller 193b.

In this embodiment, bonded semiconductor structure 100e includes a memory circuit region 130c coupled to memory circuit region 130b through a bonding interface 134c and conductive bonding contact region 133c. More information regarding memory circuit region 130c of bonded semiconductor structure 100e is provided above with the discussion of FIG. 6. Conductive bonding contact region 133c is coupled to a bit line 112c through bonding interface 134c and conductive bonding contact region 133c, wherein bit line 112c extends through dielectric material regions 126, 127a, 128a and 128b.

In this embodiment, memory circuit region 130c includes a vertically oriented memory control device 140c operatively coupled to a phase change memory device 152c. Vertically oriented memory control device 140c extends through dielectric material region 127c, wherein dielectric material region 127c forms a dielectric-to-dielectric growth interface 108c with dielectric material region 128b. Memory circuit region 130c includes dielectric material region 128c positioned on dielectric material region 127c. Dielectric material regions 127c and 128c form a dielectric-to-dielectric growth interface 109c. It should be noted that dielectric material regions 126, 127a, 128a, 127b, 128b, 127c and 128c typically include the same type of dielectric material, such as silicon dioxide. However, in some embodiments, one or more of dielectric material regions 126, 127a, 128a, 127b, 128b, 127c and 128c can include a dielectric material different from the others, as discussed in more detail above with FIGS. 16a and 16b.

It should be noted that information storage system circuitry 137 and vertically oriented memory control device 140c are positioned on opposed sides of bonding interface 134c and conductive bonding contact region 133c. For example, in this embodiment, information storage system circuitry 137 is positioned below bonding interface 134c and conductive bonding contact region 133c, and vertically oriented memory control device 140c is positioned above bonding interface 134c and conductive bonding contact region 133c.

Further, interconnect region 110 and vertically oriented memory control device 140c are positioned on opposed sides of bonding interface 134c and conductive bonding contact region 133c. For example, in this embodiment, interconnect region 110 is positioned below bonding interface 134c and conductive bonding contact region 133c, and vertically oriented memory control device 140c is positioned above bonding interface 134c and conductive bonding contact region 133c. Interconnect region 110 and information storage system circuitry 137 are positioned on the same side of bonding interface 134c and conductive bonding contact region 133c. Interconnect region 110 and information storage system circuitry 137 are positioned below bonding interface 134c and conductive bonding contact region 133c.

Vertically oriented memory control device 140b and vertically oriented memory control device 140c are positioned on opposed sides of bonding interface 134c and conductive bonding contact region 133c. For example, in this embodiment, vertically oriented memory control device 140b is positioned below bonding interface 134c and conductive bonding contact region 133c, and vertically oriented memory control device 140c is positioned above bonding interface 134c and conductive bonding contact region 133c.

Bonded semiconductor structure 100e includes a word line 113c, which is connected to a control terminal 146c of vertically oriented memory control device 140c and bonded semiconductor structure memory controller portion 193c, as shown with the word lines in FIG. 16a. A portion of word line 113c extends above bonding interface 134c and conductive bonding contact region 133c, and another portion of word line 113c extends below bonding interface 134c and conductive bonding contact region 133c. In this way, word line 113c extends above and below bonding interface 134c and conductive bonding contact region 133c. Further, bonded semiconductor structure 100c includes a drive line 114c, which is connected to via 119c of memory device region 150c (FIG. 6) and bonded semiconductor structure memory controller 193b, as shown with the word lines in FIG. 16a. A portion of drive line 114c extends above bonding interface 134c and conductive bonding contact region 133c, and another portion of drive line 114c extends below bonding interface 134c and conductive bonding contact region 133c. In this way, drive line 114c extends above and below bonding interface 134c and conductive bonding contact region 133c. It should be noted that drive line 114c is typically connected to a sense amplifier of bonded semiconductor structure memory controller 193b.

In operation, bonded semiconductor structure memory controller portion 193a controls the operation of memory circuit region 130a through bit line 112a, word line 113a and drive line 114a. Further, bonded semiconductor structure memory controller 193a determines, with the sense amplifier, the state of the memory devices of memory circuit region 130a. More information regarding the operation of memory circuit region 130a is provided in more detail above with FIGS. 5a, 5b and 5c.

In this embodiment, bonded semiconductor structure memory controller portion 193a controls the flow of a memory signal to vertically oriented memory control device 140a through bit line 112a, conductive bonding contact region 133a and bonding interface 134a. Vertically oriented memory control device 140a allows and restricts the flow of the memory signal to ferroelectric memory device 151a when control terminal 146a is activated and deactivated, respectively. Control terminal 146a is activated and deactivated in response to a control signal provided thereto by bonded semiconductor structure memory controller portion 193a. The control signal is provided by bonded semiconductor structure memory controller 193a to control terminal 146a through word line 113a. When control terminal 146a is activated, the memory signal is allowed to flow to ferroelectric memory device 151a through bit line 112a, conductive bonding contact region 133a, bonding interface 134a and vertically oriented memory control device 140a. When control terminal 146a is deactivated, the memory signal is restricted from flowing to ferroelectric memory device 151a through bit line 112a, conductive bonding contact region 133a, bonding interface 134a and vertically oriented memory control device 140a. In this way, a control signal provided to a control terminal of a vertically oriented memory control device controls the flow of a memory signal through the vertically oriented memory control device, a bit line, and a conductive bonding contact region and bonding interface.

In some situations, ferroelectric memory device 151a is read in response to the flow of the memory signal through vertically oriented memory control device 140a, bit line 112a, conductive bonding contact region 133a and bonding interface 134a. In some situations, ferroelectric memory device 151*a* is written to in response to the flow of the memory signal through vertically oriented memory control device 140*a*, bit line 112*a*, conductive bonding contact region 133*a* and bonding interface 134*a*. In some situations, ferroelectric memory device 151*a* is erased in response to the flow of the memory signal through vertically oriented memory control device 140*a*, bit line 112*a*, conductive bonding contact region 133*a* and bonding interface 134*a*. In this way, ferroelectric memory device 151*a* operates in response to a memory signal flowing through a vertically oriented memory control device, bit line, conductive bonding contact region and bonding interface.

In this embodiment, bonded semiconductor structure memory controller 193*a* provides the memory and control signals in response to an indication from information storage system controller 191*a* through conductive line 139*b*. Hence, information storage system controller 191*a* is in communication with vertically oriented memory control device 140*a* through bonded semiconductor structure memory controller 193*a*, bit line 112*a*, conductive bonding contact region 133*a* and bonding interface 134*a*. As mentioned above, ferroelectric memory device 151*a* operates in response to the memory signal when control terminal 146*a* of vertically oriented semiconductor device 140*a* is activated. Hence, information storage system controller portion 191*a* is in communication with ferroelectric memory device 151*a* through bonded semiconductor structure memory controller portion 193*a* and vertically oriented memory control device 140*a*, as well as through bit line 112*a*, conductive bonding contact region 133*a* and bonding interface 134*a* when control terminal 146*a* is activated. In this way, information storage system controller 191*a* is in communication with a vertically oriented memory control device and ferroelectric memory device through a conductive bonding contact region and bonding interface.

In this embodiment, information storage system controller portion 191*a* provides, in response to an indication from host interface circuit portion 195*a* through conductive line 139*a*, the indication to bonded semiconductor structure memory controller 193*a* to provide the memory and control signals. Hence, host interface circuit portion 195*a* is in communication with vertically oriented memory control device 140*a* through information storage system controller portion 191*a*, bonded semiconductor structure memory controller portion 193*a*, bit line 112*a*, conductive bonding contact region 133*a* and bonding interface 134*a*. As mentioned above, ferroelectric memory device 151*a* operates in response to the memory signal when control terminal 146*a* of vertically oriented semiconductor device 140*a* is activated. Hence, host interface circuit portion 195*a* is in communication with ferroelectric memory device 151*a* through information storage system controller portion 191*a*, bonded semiconductor structure memory controller portion 193*a* and vertically oriented memory control device 140*a*, as well as through bit line 112*a*, conductive bonding contact region 133*a* and bonding interface 134*a*, when control terminal 146*a* is activated. In this way, host interface circuit portion 195*a* is in communication with a vertically oriented memory control device and ferroelectric memory device through a conductive bonding contact region and bonding interface.

In this embodiment, the indications provided to information storage system controller portion 191*a* and bonded semiconductor structure memory controller 193*a* are provided in response to a signal received by host interface circuit portion 195*a* through bonding pad 160*a* and bonding wire 161*a*. The signal received by host interface circuit portion 195*a* can be from many different sources, such as a computer network. The communication between the computer network and host interface circuit portion 195*a* can be through a wired link and/or wireless link.

As mentioned above, bonding pad 160*a* and bonding wire 161*a* are in communication with host interface circuit portion 195*a* through conductive line 132*a*. Hence, bonding pad 160*a* and bonding wire 161*a* are in communication with vertically oriented memory control device 140*a* through host interface circuit portion 195*a*, information storage system controller 191*a* and bonded semiconductor structure memory controller 193*a*, as well as through bit line 112*a*, conductive bonding contact region 133*a* and bonding interface 134*a*.

Ferroelectric memory device 151*a* operates in response to the memory signal when control terminal 146*a* of vertically oriented semiconductor device 140*a* is activated. Hence, bonding pad 160*a* and bonding wire 161*a* are in communication with ferroelectric memory device 151*a* through host interface circuit portion 195*a*, information storage system controller 191*a* and bonded semiconductor structure memory controller 193*a* and vertically oriented memory control device 140*a*, as well as through bit line 112*a*, conductive bonding contact region 133*a* and bonding interface 134*a*, when control terminal 146*a* is activated. In this way, bonding pad 160*a* and bonding wire 161*a* are in communication with a vertically oriented memory control device and ferroelectric memory device through a conductive bonding contact region and bonding interface.

In operation, bonded semiconductor structure memory controller portion 193*b* controls the operation of memory circuit region 130*b* through bit line 112*b*, word line 113*b* and drive line 114*b*. Further, bonded semiconductor structure memory controller 193*b* determines, with the sense amplifier, the state of the memory devices of memory circuit region 130*b*. More information regarding the operation of memory circuit region 130*b* is provided in more detail above with FIG. 6.

In this embodiment, bonded semiconductor structure memory controller portion 193*b* controls the flow of a memory signal to vertically oriented memory control device 140*b* through bit line 112*b*, conductive bonding contact region 133*b* and bonding interface 134*b*. Vertically oriented memory control device 140*b* allows and restricts the flow of the memory signal to phase change memory device 152*b* when control terminal 146*b* is activated and deactivated, respectively. Control terminal 146*b* is activated and deactivated in response to a control signal provided thereto by bonded semiconductor structure memory controller portion 193*b*. The control signal is provided by bonded semiconductor structure memory controller 193*b* to control terminal 146*b* through word line 113*b*. When control terminal 146*b* is activated, the memory signal is allowed to flow to phase change memory device 152*b* through bit line 112*b*, conductive bonding contact region 133*b*, bonding interface 134*b* and vertically oriented memory control device 140*b*. When control terminal 146*b* is deactivated, the memory signal is restricted from flowing to phase change memory device 152*b* through bit line 112*b*, conductive bonding contact region 133*b*, bonding interface 134*b* and vertically oriented memory control device 140*b*. In this way, a control signal provided to a control terminal of a vertically oriented memory control device controls the flow of a memory signal through the vertically oriented memory control device, a bit line, and a conductive bonding contact region and bonding interface.

In some situations, phase change memory device 152*b* is read in response to the flow of the memory signal through vertically oriented memory control device 140*b*, bit line 112*b*, conductive bonding contact region 133*b* and bonding interface 134b. In some situations, phase change memory device 152b is written to in response to the flow of the memory signal through vertically oriented memory control device 140b, bit line 112b, conductive bonding contact region 133b and bonding interface 134b. In some situations, phase change memory device 152b is erased in response to the flow of the memory signal through vertically oriented memory control device 140b, bit line 112b, conductive bonding contact region 133b and bonding interface 134b. In this way, phase change memory device 152b operates in response to a memory signal flowing through a vertically oriented memory control device, bit line, conductive bonding contact region and bonding interface.

In this embodiment, bonded semiconductor structure memory controller 193b provides the memory and control signals in response to an indication from information storage system controller 191b through conductive line 139b. Hence, information storage system controller 191b is in communication with vertically oriented memory control device 140b through bonded semiconductor structure memory controller 193b, bit line 112b, conductive bonding contact region 133b and bonding interface 134b. As mentioned above, phase change memory device 152b operates in response to the memory signal when control terminal 146b of vertically oriented semiconductor device 140b is activated. Hence, information storage system controller portion 191b is in communication with phase change memory device 152b through bonded semiconductor structure memory controller portion 193b and vertically oriented memory control device 140b, as well as through bit line 112b, conductive bonding contact region 133b and bonding interface 134b when control terminal 146b is activated. In this way, information storage system controller 191b is in communication with a vertically oriented memory control device and phase change memory device through a conductive bonding contact region and bonding interface.

In this embodiment, information storage system controller portion 191b provides, in response to an indication from host interface circuit portion 195b through conductive line 139b, the indication to bonded semiconductor structure memory controller 193b to provide the memory and control signals. Hence, host interface circuit portion 195b is in communication with vertically oriented memory control device 140b through information storage system controller portion 191b, bonded semiconductor structure memory controller portion 193b, bit line 112b, conductive bonding contact region 133b and bonding interface 134b. As mentioned above, phase change memory device 152b operates in response to the memory signal when control terminal 146b of vertically oriented semiconductor device 140b is activated. Hence, host interface circuit portion 195b is in communication with phase change memory device 152b through information storage system controller portion 191b, bonded semiconductor structure memory controller portion 193b and vertically oriented memory control device 140b, as well as through bit line 112b, conductive bonding contact region 133a and bonding interface 134b, when control terminal 146b is activated. In this way, host interface circuit portion 195b is in communication with a vertically oriented memory control device and phase change memory device through a conductive bonding contact region and bonding interface.

In this embodiment, the indications provided to information storage system controller portion 191b and bonded semiconductor structure memory controller 193b are provided in response to a signal received by host interface circuit portion 195b through bonding pad 160b and bonding wire 161b. The signal received by host interface circuit portion 195b can be from many different sources, such as a computer network. The communication between the computer network and host interface circuit portion 195b can be through a wired link and/or wireless link.

As mentioned above, bonding pad 160b and bonding wire 161b are in communication with host interface circuit portion 195b through conductive line 132b. Hence, bonding pad 160b and bonding wire 161b are in communication with vertically oriented memory control device 140b through host interface circuit portion 195b, information storage system controller 191b and bonded semiconductor structure memory controller 193b, as well as through bit line 112b, conductive bonding contact region 133a and bonding interface 134b.

Phase change memory device 152b operates in response to the memory signal when control terminal 146b of vertically oriented semiconductor device 140b is activated. Hence, bonding pad 160b and bonding wire 161b are in communication with phase change memory device 152b through host interface circuit portion 195b, information storage system controller 191b and bonded semiconductor structure memory controller 193b and vertically oriented memory control device 140b, as well as through bit line 112b, conductive bonding contact region 133b and bonding interface 134b, when control terminal 146b is activated. In this way, bonding pad 160b and bonding wire 161b are in communication with a vertically oriented memory control device and phase change memory device through a conductive bonding contact region and bonding interface.

In operation, bonded semiconductor structure memory controller portion 193b controls the operation of memory circuit region 130c through bit line 112c, word line 113c and drive line 114c. Further, bonded semiconductor structure memory controller 193b determines, with the sense amplifier, the state of the memory devices of memory circuit region 130c. More information regarding the operation of memory circuit region 130c is provided in more detail above with FIG. 6.

In this embodiment, bonded semiconductor structure memory controller portion 193b controls the flow of a memory signal to vertically oriented memory control device 140c through bit line 112c, conductive bonding contact region 133c and bonding interface 134c. Vertically oriented memory control device 140c allows and restricts the flow of the memory signal to phase change memory device 152c when control terminal 146c is activated and deactivated, respectively. Control terminal 146c is activated and deactivated in response to a control signal provided thereto by bonded semiconductor structure memory controller portion 193c. The control signal is provided by bonded semiconductor structure memory controller 193c to control terminal 146c through word line 113c. When control terminal 146c is activated, the memory signal is allowed to flow to phase change memory device 152c through bit line 112c, conductive bonding contact region 133c, bonding interface 134c and vertically oriented memory control device 140c. When control terminal 146c is deactivated, the memory signal is restricted from flowing to phase change memory device 152c through bit line 112c, conductive bonding contact region 133c, bonding interface 134c and vertically oriented memory control device 140c. In this way, a control signal provided to a control terminal of a vertically oriented memory control device controls the flow of a memory signal through the vertically oriented memory control device, a bit line, and a conductive bonding contact region and bonding interface.

In some situations, phase change memory device 152c is read in response to the flow of the memory signal through vertically oriented memory control device 140c, bit line 112c, conductive bonding contact region 133c and bonding interface 134c. In some situations, phase change memory device 152c is written to in response to the flow of the memory signal through vertically oriented memory control device 140c, bit line 112c, conductive bonding contact region 133c and bonding interface 134c. In some situations, phase change memory device 152c is erased in response to the flow of the memory signal through vertically oriented memory control device 140c, bit line 112c, conductive bonding contact region 133c and bonding interface 134c. In this way, phase change memory device 152c operates in response to a memory signal flowing through a vertically oriented memory control device, bit line, conductive bonding contact region and bonding interface.

In this embodiment, bonded semiconductor structure memory controller 193c provides the memory and control signals in response to an indication from information storage system controller 191c through conductive line 139c. Hence, information storage system controller 191c is in communication with vertically oriented memory control device 140c through bonded semiconductor structure memory controller 193c, bit line 112c, conductive bonding contact region 133c and bonding interface 134c. As mentioned above, phase change memory device 152c operates in response to the memory signal when control terminal 146c of vertically oriented semiconductor device 140c is activated. Hence, information storage system controller portion 191c is in communication with phase change memory device 152c through bonded semiconductor structure memory controller portion 193c and vertically oriented memory control device 140c, as well as through bit line 112c, conductive bonding contact region 133c and bonding interface 134c when control terminal 146c is activated. In this way, information storage system controller 191c is in communication with a vertically oriented memory control device and phase change memory device through a conductive bonding contact region and bonding interface.

In this embodiment, information storage system controller portion 191c provides, in response to an indication from host interface circuit portion 195c through conductive line 139c, the indication to bonded semiconductor structure memory controller 193c to provide the memory and control signals. Hence, host interface circuit portion 195c is in communication with vertically oriented memory control device 140c through information storage system controller portion 191c, bonded semiconductor structure memory controller portion 193c, bit line 112c, conductive bonding contact region 133c and bonding interface 134c. As mentioned above, phase change memory device 152c operates in response to the memory signal when control terminal 146c of vertically oriented semiconductor device 140c is activated. Hence, host interface circuit portion 195c is in communication with phase change memory device 152c through information storage system controller portion 191c, bonded semiconductor structure memory controller portion 193c and vertically oriented memory control device 140c, as well as through bit line 112c, conductive bonding contact region 133c and bonding interface 134c, when control terminal 146c is activated. In this way, host interface circuit portion 195c is in communication with a vertically oriented memory control device and phase change memory device through a conductive bonding contact region and bonding interface.

In this embodiment, the indications provided to information storage system controller portion 191c and bonded semiconductor structure memory controller 193c are provided in response to a signal received by host interface circuit portion 195b through bonding pad 160b and bonding wire 161b. As mentioned above, the signal received by host interface circuit portion 195b can be from many different sources, such as a computer network. The communication between the computer network and host interface circuit portion 195b can be through a wired link and/or wireless link.

As mentioned above, bonding pad 160b and bonding wire 161b are in communication with host interface circuit portion 195b through conductive line 132b. Hence, bonding pad 160b and bonding wire 161b are in communication with vertically oriented memory control device 140b through host interface circuit portion 195b, information storage system controller 191b and bonded semiconductor structure memory controller 193b, as well as through bit line 112c, conductive bonding contact region 133c and bonding interface 134c.

Phase change memory device 152c operates in response to the memory signal when control terminal 146c of vertically oriented semiconductor device 140c is activated. Hence, bonding pad 160c and bonding wire 161c are in communication with phase change memory device 152c through host interface circuit portion 195c, information storage system controller 191c and bonded semiconductor structure memory controller 193c and vertically oriented memory control device 140c, as well as through bit line 112c, conductive bonding contact region 133c and bonding interface 134c, when control terminal 146c is activated. In this way, bonding pad 160c and bonding wire 161c are in communication with a vertically oriented memory control device and phase change memory device through a conductive bonding contact region and bonding interface.

Figure 17A:
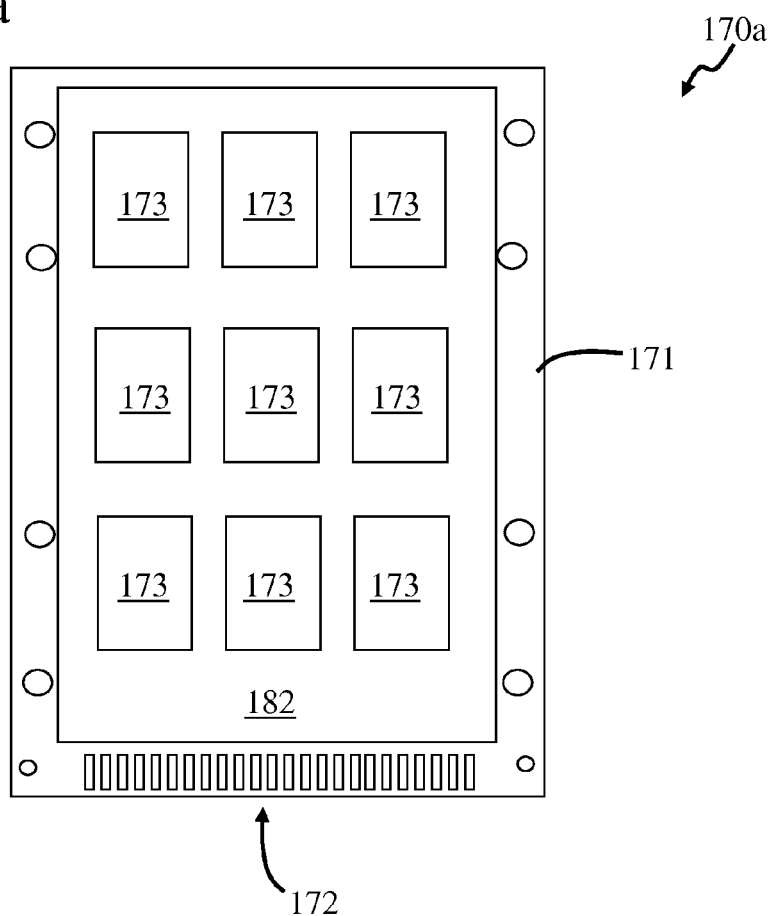
FIGS. 17a and 17b are top and perspective views, respectively, of an information storage system.
Figure 17D:
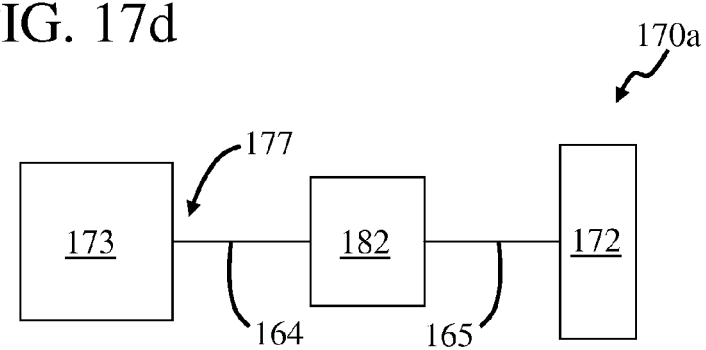
FIG. 17d is a block diagram of the information storage system of FIG. 17a showing the connections between the various components thereof.
Figure 17B:
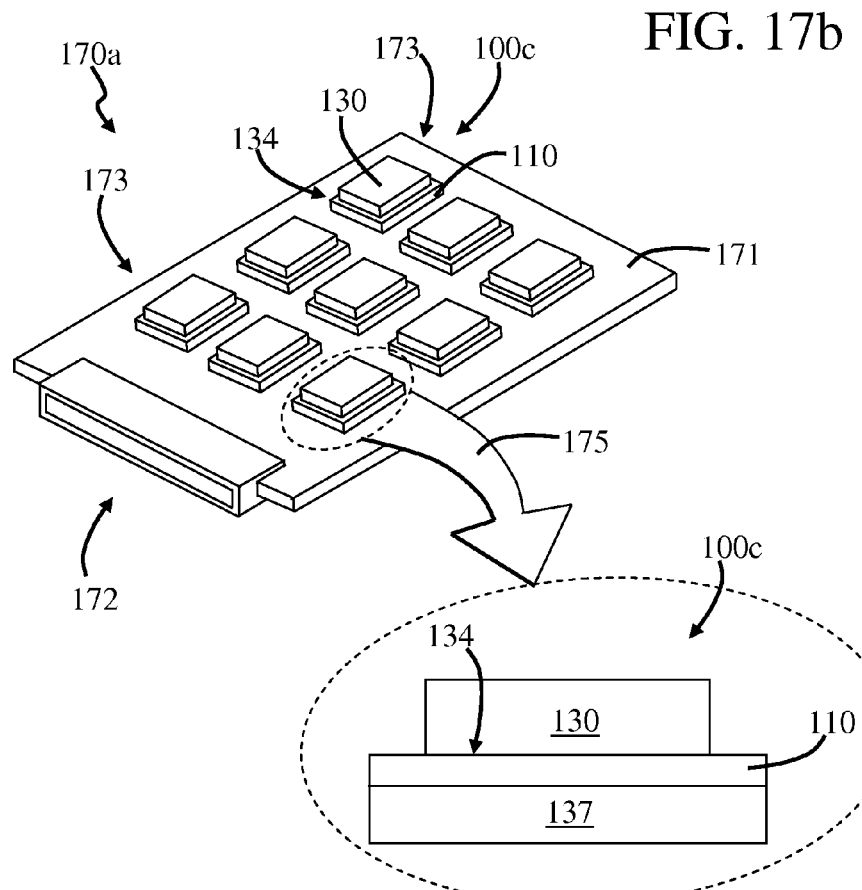

FIGS. 17a and 17b are top and perspective views, respectively, of an information storage system 170a. In this embodiment, information storage system 170a includes a circuit board 171 which carries circuit board circuitry 182. Circuit board circuitry 182 can include many different types of circuitry, such as the active and/or passive electronic devices mentioned in the Background. In some embodiments, circuit board circuitry 182 includes the circuitry of a circuit board for a hard drive. More information regarding circuitry that can be included with circuit board circuitry 182 can be found in U.S. Pat. Nos. 6,404,647, 7,009,872 and 7,039,759.

Information storage system 170a includes an interface 172 which is carried by circuit board 171 and in communication with circuit board circuitry 182. Interface 172 can be of many different types, such as a serial ATA (SATA) interface. Interface 172 provides communication between information storage system 170a and a bus, such as a host bus of a computer system. The computer system can be in communication with a network, such as network 197 (FIG. 14c). For example, the computer system can be in communication with another computer system through a computer network, such as the Internet. The communication between the computer network and interface 172 can be through a wired link and/or wireless link.

The communication between network 197 and interface 172 is through a communication link, such as communication link 198 (FIG. 14c). As discussed in more detail below, interface 172 is in communication with bonding pad 160 and bonding wire 161. It should be noted that, in some embodiments, the communication between communication link 198 and bonding pad 160 and bonding wire 161 generally involves a computer motherboard and a modem, such as an Ethernet card. Communication link 198 can be a wired and/or wireless communication link, such as those mentioned above. Communication link 198 can be in communication with bonding pad 160 and bonding wire 161 in many different ways, as will be discussed in more detail presently.

Figure 17C:
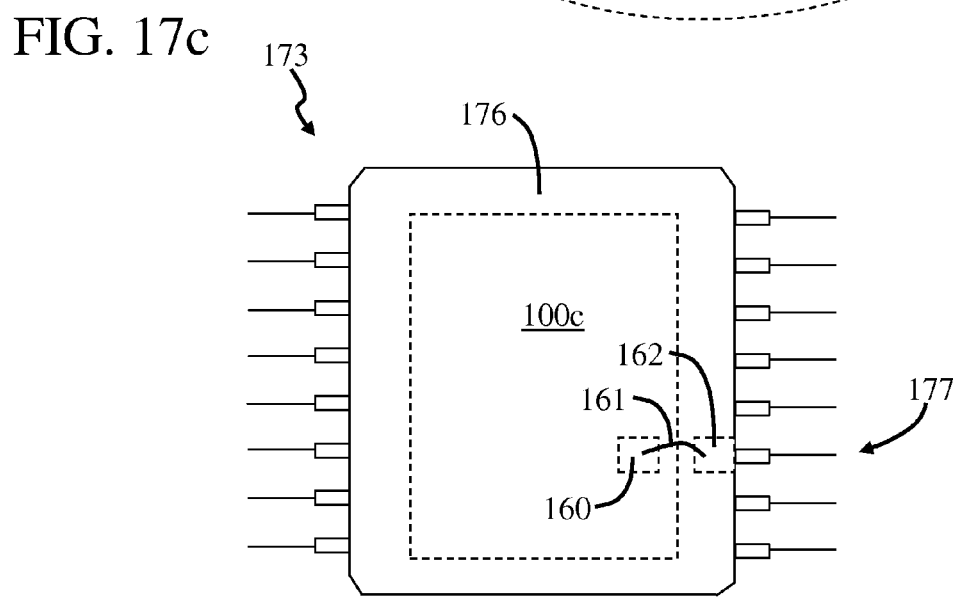

In this embodiment, information storage system 170a includes a bonded semiconductor structure memory chip 173, which is shown in a top view of FIG. 17c. Bonded semiconductor structure memory chip 173 includes a bonded semiconductor structure, which can be of many different types, such as those discussed in more detail herein. In this embodiment, bonded semiconductor structure memory chip 173 includes bonded semiconductor structure 100c (FIG. 14a), as indicated by an indication arrow 175 in FIG. 17b. More information regarding bonded semiconductor structure 100c is provided above.

In this embodiment, bonded semiconductor structure memory chip 173 includes a chip package 176 which carries bonded semiconductor structure 100c. Chip package 176 can be of many different types, such as a Dual Inline Package (DIP) through-hole package, J-lead package and bat-wing package. Other types of chip packages are single inline (SIP) packages and pin grid array (PGA) packages. More information regarding chip packages can be found in U.S. Pat. Nos. 6,214,648, 6,407,446 and 6,838,754.

In this embodiment, chip package 176 includes an outer lead 177 and bonding pad 162 which are connected together. Bonding pad 162 is connected to bonding pad 160 through bonding wire 161 and, as discussed in more detail above with FIG. 14a, bonding pad 160 is in communication with information storage system circuitry 137 through conductive line 132. Conductive line 132 is in communication with memory circuit region 130 through interconnect region 110 and information storage system circuitry 137, as discussed in more detail with FIGS. 14a and 14b. Hence, outer lead 177 is in communication with memory circuit region 130 through bonding pads 160 and 162 and bonding wire 161. Outer lead 177 is in communication with memory circuit region 130 through information storage system circuitry 137. Outer lead 177 is in communication with memory circuit region 130 through interconnect region 110. Outer lead 177 is in communication with memory circuit region 130 through conductive bonding contact region 133. Outer lead 177 is in communication with memory circuit region 130 through bonding interface 134. In this way, outer lead 177 is in communication with bonded semiconductor structure 100c.

Figure 17E:
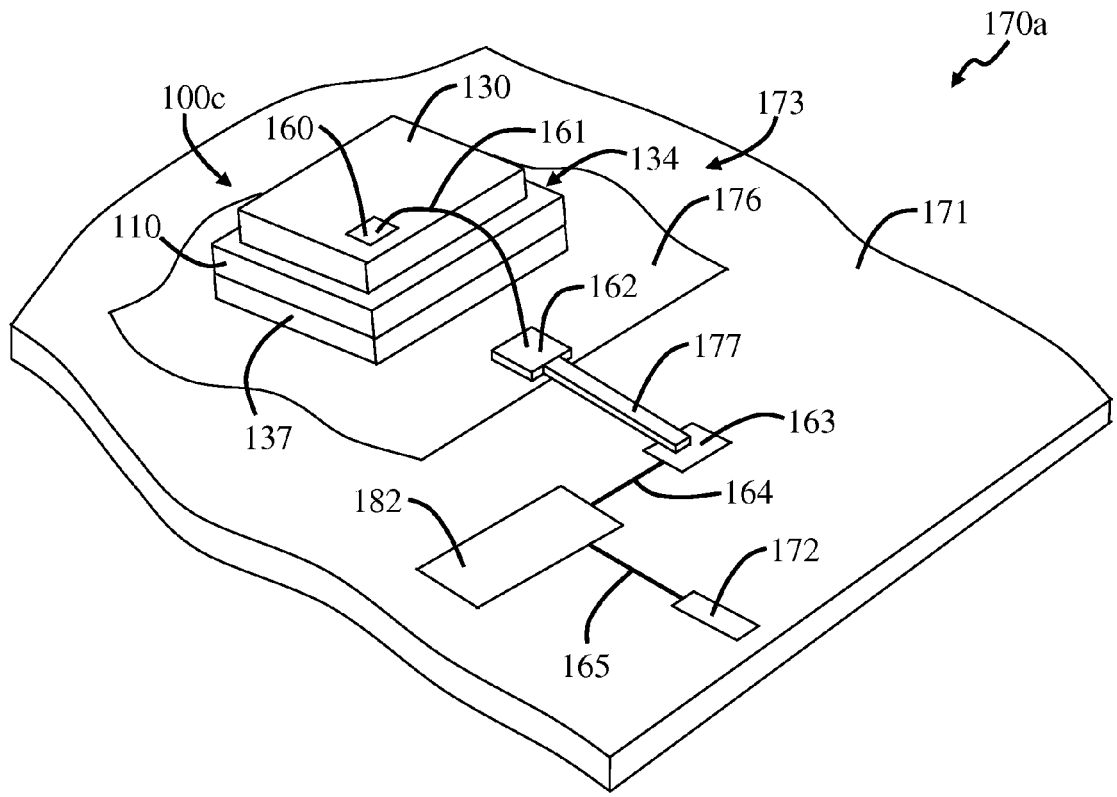
FIG. 17e is a perspective view of the information storage system of FIG. 17a showing the connections between the various components thereof.

FIG. 17d is a block diagram showing the connections between the various components of information storage system 170a, and FIG. 17e is a perspective view showing the connections between the various components of information storage system 170a. Circuit board circuitry 182 is in communication with bonded semiconductor structure memory chip 173 through outer lead 177. In particular, outer lead 177 is connected to a lead connector 163 of circuit board 171, and lead connector 163 is connected to circuit board circuitry 182 through a conductive line 164.

Hence, circuit board circuitry 182 is in communication with memory circuit region 130 through outer lead 177 and information storage system circuitry 137. Circuit board circuitry 182 is in communication with memory circuit region 130 through outer lead 177 and interconnect region 110. Circuit board circuitry 182 is in communication with memory circuit region 130 through outer lead 177 and conductive bonding contact region 133. Circuit board circuitry 182 is in communication with memory circuit region 130 through outer lead 177 and bonding interface 134. Circuit board circuitry 182 is in communication with memory circuit region 130 through bonding pads 160 and 162 and bonding wire 161.

Bonded semiconductor structure memory chip 173 is in communication with interface 172 through outer lead 177. In particular, outer lead 177 is connected to circuit board circuitry 182, as mentioned above, and circuit board circuitry 182 is connected to interface 172 through a conductive line 165.

Hence, interface 172 is in communication with memory circuit region 130 through circuit board circuitry 182, outer lead 177 and information storage system circuitry 137. Interface 172 is in communication with memory circuit region 130 through circuit board circuitry 182, outer lead 177, information storage system circuitry 137 and interconnect region 110. Interface 172 is in communication with memory circuit region 130 through circuit board circuitry 182, outer lead 177 and interconnect region 110. Interface 172 is in communication with memory circuit region 130 through circuit board circuitry 182, outer lead 177 and conductive bonding contact region 133. Interface 172 is in communication with memory circuit region 130 through circuit board circuitry 182, outer lead 177 and bonding interface 134. Interface 172 is in communication with memory circuit region 130 through bonding pads 160 and 162 and bonding wire 161.

It should be noted that, in some embodiments, conductive line 165 is connected to lead connector 163, and circuit board circuitry 182 is not connected to lead connector 163. Hence, in these embodiments, interface 172 is in communication with memory circuit region 130 through outer lead 177 and information storage system circuitry 137. Interface 172 is in communication with memory circuit region 130 through outer lead 177, information storage system circuitry 137 and interconnect region 110. Interface 172 is in communication with memory circuit region 130 through outer lead 177 and interconnect region 110. Interface 172 is in communication with memory circuit region 130 through outer lead 177 and conductive bonding contact region 133. Interface 172 is in communication with memory circuit region 130 through outer lead 177 and bonding interface 134. Interface 172 is in communication with memory circuit region 130 through bonding pads 160 and 162 and bonding wire 161.

As mentioned above, interface 172 provides communication between information storage system 170a and a bus, such as a host bus of a computer system. The computer system can be in communication with another computer system. For example, the computer system can be in communication with another computer system through a computer network, such as the Internet. The communication between the computer network and interface 172 can be through a wired link and/or wireless link.

Hence, in some embodiments, the computer network is in communication with memory circuit region 130 through bonding interface 134. Further, the computer network is in communication with memory circuit region 130 through conductive bonding contact region 133. The computer network is in communication with vertically oriented memory control device 140 through bonding interface 134. Further, the computer network is in communication with vertically oriented memory control device 140 through conductive bonding contact region 133. The computer network is in communication with memory device region 150 through bonding interface 134. Further, the computer network is in communication with memory device region 150 through conductive bonding contact region 133.

In some embodiments, the Internet is in communication with memory circuit region 130 through bonding interface 134. Further, the Internet is in communication with memory circuit region 130 through conductive bonding contact region 133. The Internet is in communication with vertically oriented memory control device 140 through bonding interface 134. Further, the Internet is in communication with vertically oriented memory control device 140 through conductive bonding contact region 133. The Internet is in communication with memory device region 150 through bonding interface 134. Further, the Internet is in communication with memory device region 150 through conductive bonding contact region 133.

In some embodiments, a wireless link is in communication with memory circuit region 130 through bonding interface 134. Further, the wireless link is in communication with memory circuit region 130 through conductive bonding contact region 133. The wireless link is in communication with vertically oriented memory control device 140 through bonding interface 134. Further, the wireless link is in communication with vertically oriented memory control device 140 through conductive bonding contact region 133. The wireless link is in communication with memory device region 150 through bonding interface 134. Further, the wireless link is in communication with memory device region 150 through conductive bonding contact region 133.

In some embodiments, a wired link is in communication with memory circuit region 130 through bonding interface 134. Further, the wired link is in communication with memory circuit region 130 through conductive bonding contact region 133. The wired link is in communication with vertically oriented memory control device 140 through bonding interface 134. Further, the wired link is in communication with vertically oriented memory control device 140 through conductive bonding contact region 133. The wired link is in communication with memory device region 150 through bonding interface 134. Further, the wired link is in communication with memory device region 150 through conductive bonding contact region 133.

Figure 18D:
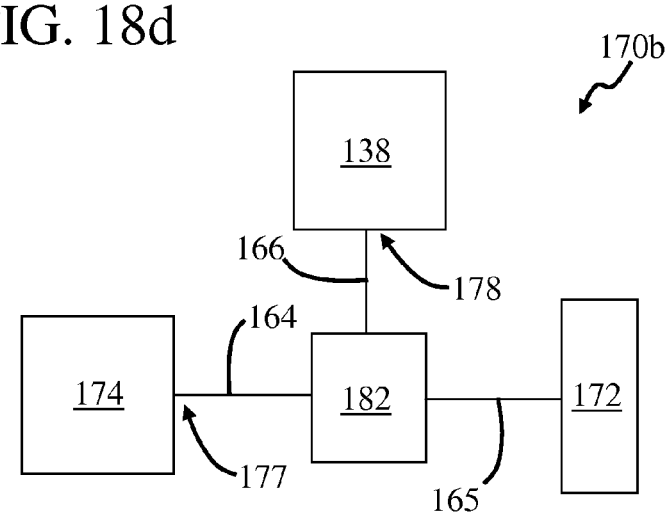
FIG. 18d is a block diagram of the information storage system of FIG. 18a showing the connections between the various components thereof.
Figure 18A:
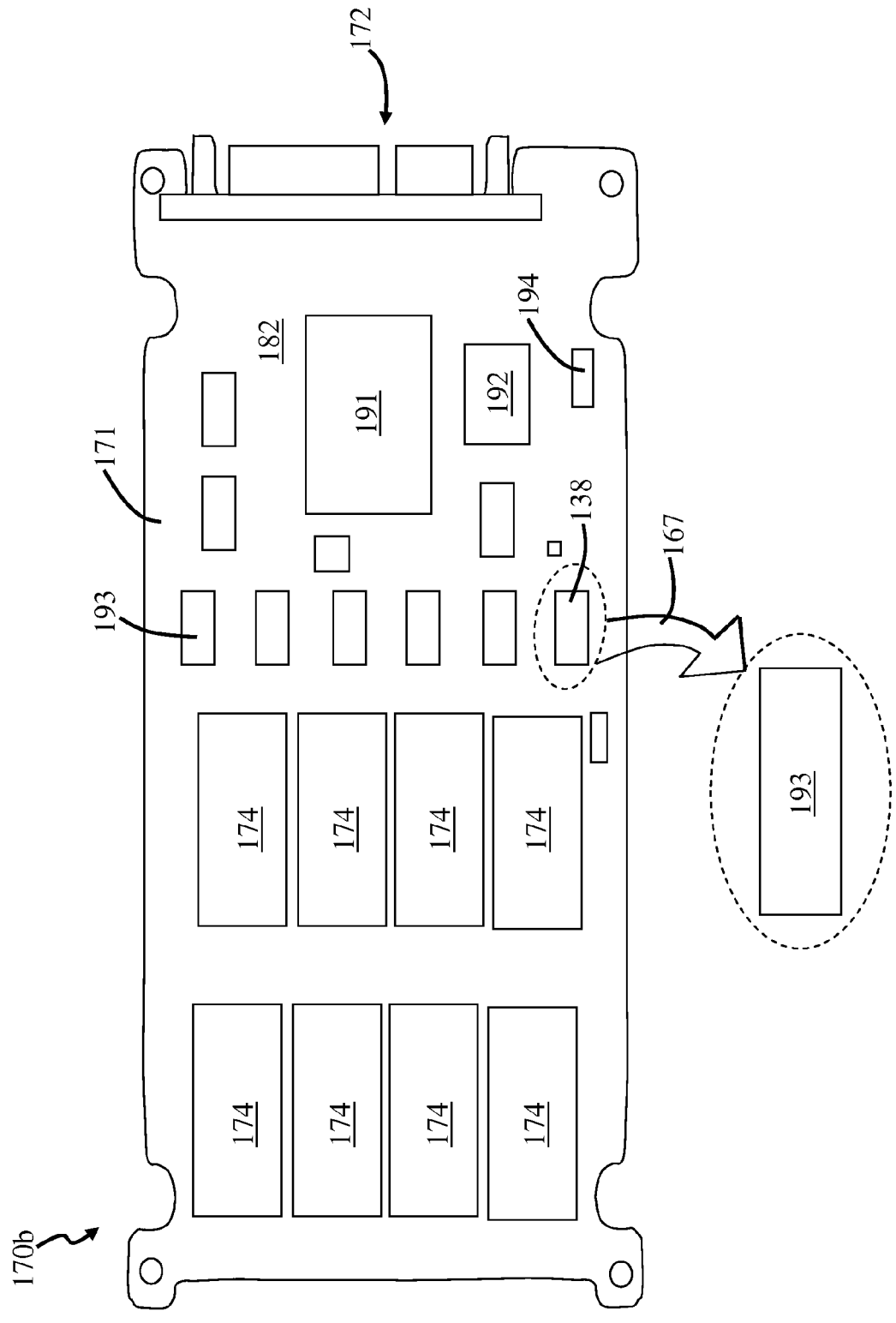
FIGS. 18a and 18b are top and perspective views, respectively, of an information storage system, which includes a bonded semiconductor structure.
Figure 18B:
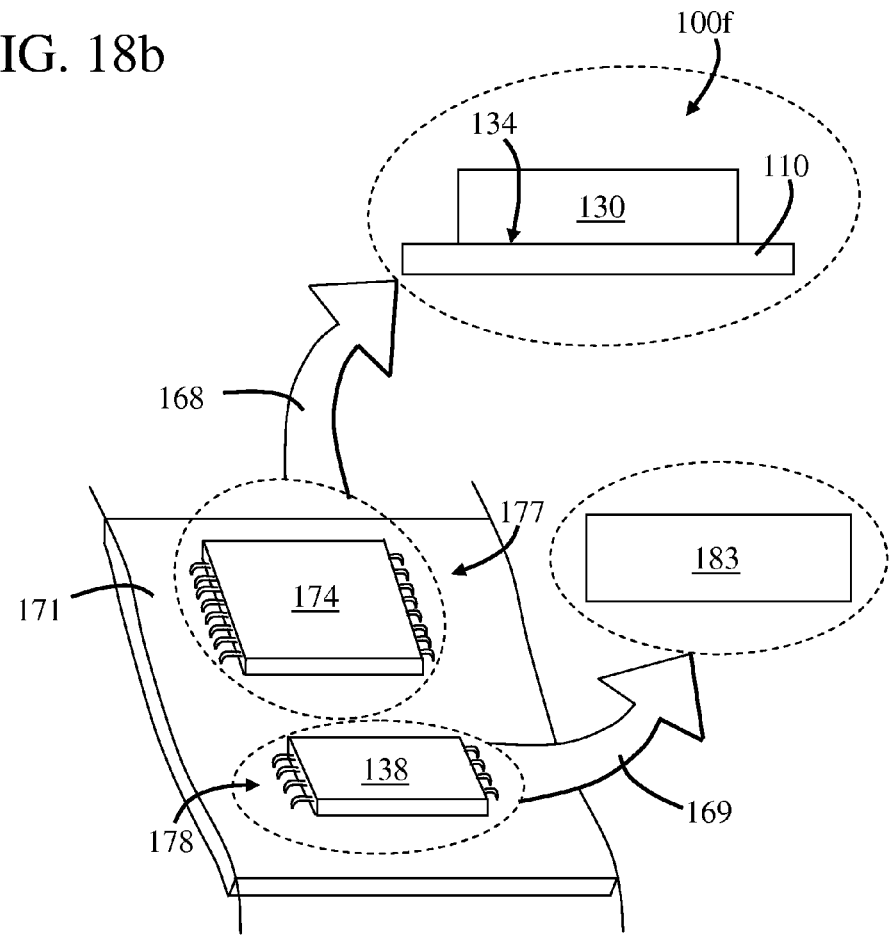

FIGS. 18a and 18b are top and perspective views, respectively, of an information storage system 170b. In this embodiment, information storage system 170b includes circuit board 171 which carries circuit board circuitry 182. Information storage system 170b includes interface 172 which is carried by circuit board 171 and in communication with circuit board circuitry 182. Circuit board circuitry 182 and interface 172 are discussed in more detail above. It should be noted that the components of information storage system 170b are in communication with each other through circuit board circuitry 182.

In this embodiment, information storage system 170b includes a volatile memory chip 192, which is used as a buffer, such as a high speed buffer. Information storage system 170b includes a volatile memory chip controller chip 194, which controls the operation of volatile memory chip 192. Volatile memory chip 192 typically includes laterally oriented semiconductor memory devices. The laterally oriented semiconductor memory devices can be of many different types, such as dynamic and static random access memory devices.

In this embodiment, information storage system 170b includes an information storage system controller chip 190 which controls the operation of information storage system 170b. In this embodiment, information storage system controller chip 190 includes host interface 195 and information storage system controller 191. Information regarding host interface 195 and information storage system controller 191 is provided in more detail above.

Figure 18C:
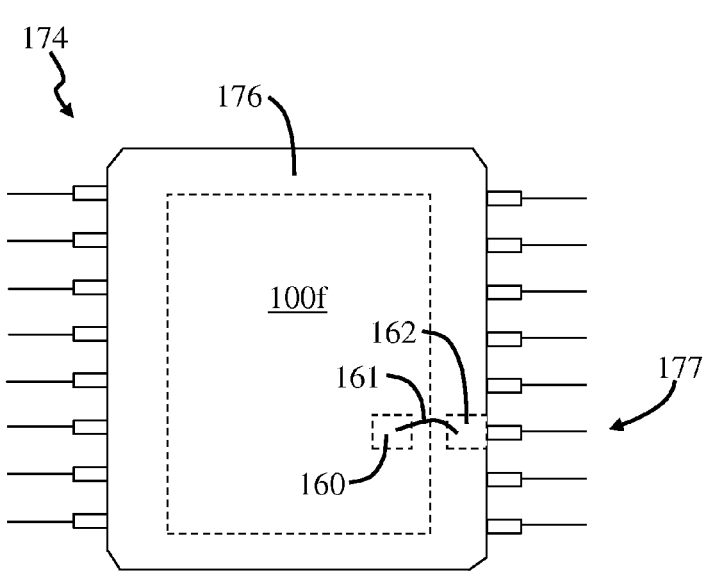

In this embodiment, information storage system 170b includes bonded semiconductor structure memory chip 174, which is shown in a top view of FIG. 18c. Bonded semiconductor structure memory chip 174 includes a bonded semiconductor structure, which can be of many different types, such as those discussed in more detail herein. In this embodiment, bonded semiconductor structure memory chip 174 includes a bonded semiconductor structure 100f. It should be noted that, in some embodiments, bonded semiconductor structure memory chip 174 includes bonded semiconductor structure 100a of FIG. 5a or bonded semiconductor structure 100b of FIG. 6. In some embodiments, bonded semiconductor structure memory chip 174 includes bonded semiconductor structure 100c of FIG. 14a or bonded semiconductor structure 100d of FIG. 15a. In some embodiments, bonded semiconductor structure memory chip 174 includes bonded semiconductor structure 100e of FIG. 16a. It should also be noted that bonded semiconductor structure memory chip 174 can include a bonded semiconductor structure which will be discussed in more detail below with FIGS. 19 and 20.

Figure 18E:
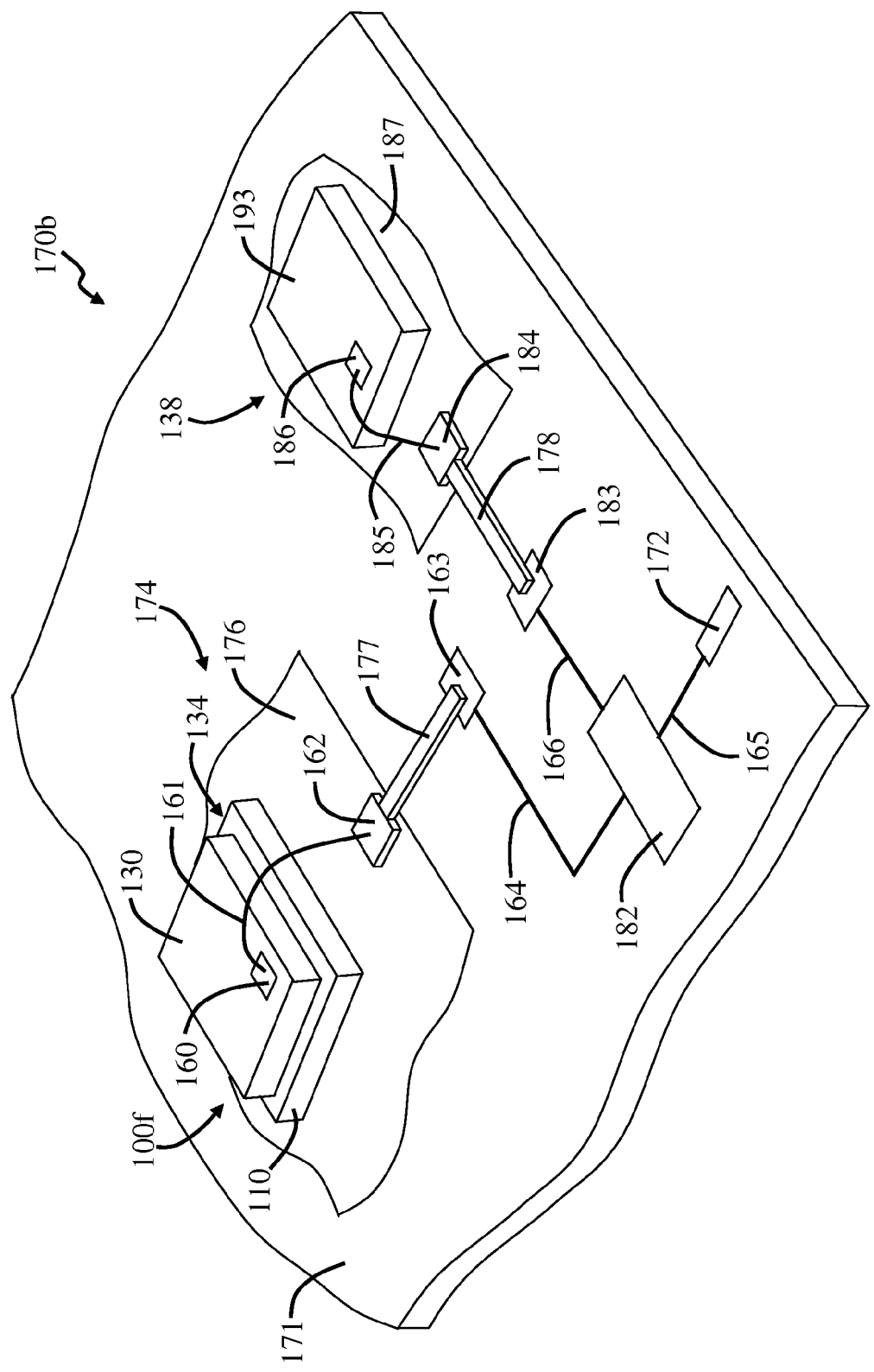
FIG. 18e is a perspective view of the information storage system of FIG. 18a showing the connections between the various components thereof.

FIG. 18d is a block diagram showing the connections between the various components of information storage system 170b, and FIG. 18e is a perspective view showing the connections between the various components of information storage system 170b. Circuit board circuitry 182 is in communication with bonded semiconductor structure memory chip 174 through outer lead 177. In particular, outer lead 177 is connected to lead connector 163 of circuit board 171, and lead connector 163 is connected to circuit board circuitry 182 through conductive line 164.

Hence, circuit board circuitry 182 is in communication with memory circuit region 130 through outer lead 177 and interconnect region 110. Circuit board circuitry 182 is in communication with memory circuit region 130 through outer lead 177 and conductive bonding contact region 133. Circuit board circuitry 182 is in communication with memory circuit region 130 through outer lead 177 and bonding interface 134.

Bonded semiconductor structure memory chip 174 is in communication with interface 172 through outer lead 177. In particular, outer lead 177 is connected to circuit board circuitry 182, as mentioned above, and circuit board circuitry 182 is connected to interface 172 through conductive line 165.

Hence, interface 172 is in communication with memory circuit region 130 through circuit board circuitry 182 and outer lead 177. Interface 172 is in communication with memory circuit region 130 through circuit board circuitry 182, outer lead 177 and interconnect region 110. Interface 172 is in communication with memory circuit region 130 through circuit board circuitry 182, outer lead 177 and interconnect region 110. Interface 172 is in communication with memory circuit region 130 through circuit board circuitry 182, outer lead 177 and conductive bonding contact region 133. Interface 172 is in communication with memory circuit region 130 through circuit board circuitry 182, outer lead 177 and bonding interface 134.

In this embodiment, information storage system 170b includes bonded semiconductor structure memory controller chip 193. Bonded semiconductor structure memory controller chip 193 includes a chip package 187 which carries vertically oriented memory device control circuitry 138. Chip package 187 can be of many different types of chip packages, such as those mentioned above with the discussion of chip package 176. More information regarding vertically oriented memory device control circuitry 138 is provided above with the discussion of information storage system circuitry 137.

In this embodiment, vertically oriented memory device control circuitry 138 includes a bonding pad 186 which is connected to a bonding pad 184 of chip package 187 through a bonding wire 185. Bonding pad 185 is connected to an outer lead 178 (FIG. 18b) of chip package 187, and outer lead 178 is connected to a lead connector 183 of circuit board 171. Lead connector 183 is connected to circuit board circuitry 182 through a conductive line 166 of circuit board 171. In this way, vertically oriented memory device control circuitry 138 is in communication with circuit board circuitry 182. As discussed in more detail above with FIG. 18e, circuit board circuitry 182 is in communication with bonded semiconductor structure 100c.

Hence, vertically oriented memory device control circuitry 138 is in communication with bonded semiconductor structure 100c through circuit board circuitry 182. In particular, vertically oriented memory device control circuitry 138 is in communication with memory circuit region 130 through circuit board circuitry 182 and conductive bonding contact region 133. Vertically oriented memory device control circuitry 138 is in communication with memory circuit region 130 through circuit board circuitry 182 and bonding interface 134.

Further, vertically oriented memory device control circuitry 138 is in communication with memory circuit region 130 through outer leads 177 and 178 and conductive bonding contact region 133. Vertically oriented memory device control circuitry 138 is in communication with memory circuit region 130 through outer leads 177 and 178 and bonding interface 134.

FIG. 19 is a side view of bonded semiconductor structure 100g. Bonded semiconductor structure 100g is similar to the bonded semiconductor structures discussed above. However, in this embodiment, bonded semiconductor structure 100g includes via 120 connected between bonding pad 160 and each bit line 112 of each vertically oriented semiconductor device 140 of memory control device region 131. Via 120 is in communication with bonding wire 161 through bonding pad 160.

Bonded semiconductor structure memory chip 174 includes chip package 176 which carries bonded semiconductor structure 100g. Chip package 176 is discussed in more detail above. In this embodiment, chip package 176 includes outer lead 177 which is connected to bonding pad 162. Bonding pad 162 is connected to bonding pad 160 through bonding wire 161, and bonding pad 160 is connected to bit line 112 (FIG. 5a). Bit line 112 is in communication with memory circuit region 130 through interconnect region 110.

Hence, outer lead 177 is in communication with memory circuit region 130 through interconnect region 110. Outer lead 177 is in communication with memory circuit region 130 through conductive bonding contact region 133. Outer lead 177 is in communication with memory circuit region 130 through bonding interface 134. In this way, outer lead 177 is in communication with bonded semiconductor structure 100g.

FIG. 20 is a side view of bonded semiconductor structure 100h. Bonded semiconductor structure 100h is similar to the bonded semiconductor structures discussed above. However, in this embodiment, bonded semiconductor structure 100h includes a plurality of capacitors, one of which is denoted as capacitor 196, which are connected to a corresponding vertically oriented memory control device 140. In this embodiment, capacitor 196 includes capacitor electrodes 197 and 198 and a capacitor dielectric 199 positioned therebetween. In this embodiment, capacitor electrode 198 is connected to current return 115, and capacitor electrode 197 is connected to the corresponding vertically oriented memory control device 140 through via 118. It should be noted that capacitor 196 and the corresponding vertically oriented memory control device 140 operate as a dynamic random access memory device.

The embodiments of the invention described herein are exemplary and numerous modifications, variations and rearrangements can be readily envisioned to achieve substantially equivalent results, all of which are intended to be embraced within the spirit and scope of the invention.

The invention claimed is:

1. A bonded semiconductor structure, comprising:
a vertically oriented semiconductor device carried by a conductive bonding contact region which establishes a bonding interface, the vertically oriented semiconductor device including a mesa structure, and a control dielectric which extends around a sidewall of the mesa structure, the vertically oriented semiconductor device being in communication with an interconnect region through the bonding interface; and
a memory device region in communication with the vertically oriented semiconductor device;
wherein the memory device region is responsive to a signal which flows through the bonding interface.

2. The structure of claim 1, wherein the signal flows through the vertically oriented semiconductor device.

3. The structure of claim 1, wherein the vertically oriented semiconductor device includes a stack of semiconductor regions.

4. The structure of claim 3, wherein the stack extends between the bonding interface and memory device region.

5. The structure of claim 3, wherein the stack includes a planarized surface which faces the bonding interface.

6. The structure of claim 5, wherein the stack includes an opposed planarized surface which faces away from the bonding interface.

7. The structure of claim 1, wherein the memory device region includes a ferroelectric memory device.

8. The structure of claim 1, wherein the memory device region includes phase change memory device.

9. The structure of claim 1, wherein the memory device region includes a magnetoresistive memory device.

10. The structure of claim 1, wherein the signal is adjustable in response to adjusting a signal which flows through the Internet.

11. The structure of claim 1, wherein the signal is adjustable in response to adjusting a signal which flows through a cellular network.

12. A bonded semiconductor structure, comprising:
a vertically oriented semiconductor device in communication with an interconnect region through a bonding interface, wherein the vertically oriented semiconductor device includes a mesa structure;
a memory device region in communication with the vertically oriented semiconductor device;
a conductive bonding contact region which carries the mesa structure; and
a control dielectric which extends around a sidewall of the mesa structure.

13. The structure of claim 12, wherein the mesa structure includes a planarized surface which faces the bonding interface.

14. The structure of claim 12, wherein the memory device region is responsive to a signal which flows through the bonding interface and conductive bonding contact region.

15. The structure of claim 12, further including a control terminal operatively coupled with the mesa structure through the control dielectric.

16. The structure of claim 12, wherein the mesa structure extends between the conductive bonding contact region and memory device region.

17. The structure of claim 12, wherein the memory device region is responsive to a first signal which flows through the bonding interface, the first signal being adjustable in response to adjusting a second signal which flows through the Internet.

18. The structure of claim 12, wherein the memory device region is responsive to a first signal which flows through the bonding interface, the first signal being adjustable in response to adjusting a second signal which flows through a cellular network.

* * * * *